(12) United States Patent
Kim

(10) Patent No.: US 10,367,097 B2
(45) Date of Patent: Jul. 30, 2019

(54) LIQUID CRYSTAL DISPLAY DEVICE AND METHOD FOR FABRICATING THE SAME

(71) Applicant: SAMSUNG DISPLAY CO., LTD., Yongin-si, Gyeonggi-do (KR)

(72) Inventor: Keunwoo Kim, Seongnam-si (KR)

(73) Assignee: SAMSUNG DISPLAY CO., LTD., Yongin-si, Gyeonggi-do (KR)

(*) Notice: Subject to any disclaimer, the term of this patent is extended or adjusted under 35 U.S.C. 154(b) by 245 days.

(21) Appl. No.: 15/221,785

(22) Filed: Jul. 28, 2016

(65) Prior Publication Data

US 2017/0160616 A1 Jun. 8, 2017

(30) Foreign Application Priority Data

Dec. 7, 2015 (KR) ........................ 10-2015-0173034

(51) Int. Cl.
| | |
|---|---|
| *G02F 1/136* | (2006.01) |
| *H01L 29/786* | (2006.01) |
| *H01L 21/027* | (2006.01) |
| *G02F 1/1333* | (2006.01) |
| *G02F 1/1343* | (2006.01) |
| *G02F 1/1362* | (2006.01) |

(Continued)

(52) U.S. Cl.
CPC .... *H01L 29/78696* (2013.01); *G02F 1/13439* (2013.01); *G02F 1/13624* (2013.01); *G02F 1/133345* (2013.01); *G02F 1/134309* (2013.01); *H01L 21/0273* (2013.01); *H01L 21/30604* (2013.01); *H01L 27/1251* (2013.01); *H01L 27/1288* (2013.01); *H01L 29/41733* (2013.01); *G02F 1/1368* (2013.01); *G02F 2001/134345* (2013.01); *G02F 2201/40* (2013.01)

(58) Field of Classification Search
None
See application file for complete search history.

(56) References Cited

U.S. PATENT DOCUMENTS

| | | |
|---|---|---|
| 5,517,150 A | 5/1996 | Okumura |
| 8,803,855 B2 | 8/2014 | Goh et al. |

(Continued)

FOREIGN PATENT DOCUMENTS

| | | |
|---|---|---|
| KR | 10-2011-0117998 A | 10/2011 |
| KR | 10-2013-0104521 A | 9/2013 |

(Continued)

OTHER PUBLICATIONS

Semiconductor Devices, Physics and Technology, The MOSFET: Basic Characteristics; Dec. 31, 1985.

(Continued)

*Primary Examiner* — Richard H Kim
(74) *Attorney, Agent, or Firm* — Lee & Morse, P.C.

(57) ABSTRACT

A liquid crystal display device and a method of manufacturing a liquid crystal display device, the liquid crystal display device including a first substrate and a second substrate spaced apart from each other; a liquid crystal layer between the first substrate and the second substrate; a gate line, a data line, a first sub-pixel electrode, and a second sub-pixel electrode on the first substrate; a first switching element connected to the gate line, the data line, and the first sub-pixel electrode; and a second switching element connected to the gate line, the first sub-pixel electrode, and the second sub-pixel electrode.

30 Claims, 58 Drawing Sheets

(51) Int. Cl.
    *H01L 21/306*     (2006.01)
    *H01L 27/12*     (2006.01)
    *H01L 29/417*     (2006.01)
    *G02F 1/1368*     (2006.01)

(56) References Cited

U.S. PATENT DOCUMENTS

| | | | |
|---|---|---|---|
| 9,122,106 B2 | 9/2015 | Jung et al. | |
| 9,274,377 B2 | 3/2016 | Chang et al. | |
| 2002/0008799 A1* | 1/2002 | Ota | G02F 1/134363 |
| | | | 349/43 |
| 2006/0103800 A1 | 5/2006 | Li et al. | |
| 2007/0164284 A1* | 7/2007 | Park | G02F 1/134363 |
| | | | 257/59 |
| 2008/0297676 A1 | 12/2008 | Kimura | |
| 2015/0248864 A1 | 9/2015 | Chen et al. | |

FOREIGN PATENT DOCUMENTS

| | | |
|---|---|---|
| KR | 10-2014-0048785 A | 4/2014 |
| KR | 10-2014-0049375 A | 4/2014 |

OTHER PUBLICATIONS

Semiconductor Devices, Physics and Technology, The MOSFET: Threshold Voltage and Device Scaling; Dec. 31, 1985.
Extended European Search Report dated Apr. 20, 2017 for corresponding EP 16196779.9.

* cited by examiner

LIQUID CRYSTAL DISPLAY DEVICE AND METHOD FOR FABRICATING THE SAME

CROSS-REFERENCE TO RELATED APPLICATION

Korean Patent Application No. 10-2015-0173034, filed on Dec. 7, 2015, in the Korean Intellectual Property Office, and entitled: "Liquid Crystal Display Device and Method for Fabricating the Same," is incorporated by reference herein in its entirety.

BACKGROUND

1. Field

Embodiments relate to a liquid crystal display ("LCD") device and a method for fabricating the same.

2. Description of the Related Art

An LCD device is a type of a flat panel display (FPD), which has found wide ranging applications. The LCD device includes two substrates respectively including two electrodes formed thereon and a liquid crystal layer interposed therebetween. Upon applying voltage to the two electrodes, liquid crystal molecules of the liquid crystal layer may be rearranged, such that an amount of transmitted light may be adjusted.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments are directed to a liquid crystal display ("LCD") device and a method for fabricating the same.

Aspects of embodiments are directed to a liquid crystal display (LCD) device improved in terms of visibility and an aperture ratio of a pixel and significantly reduced in terms of variation of a storage voltage.

In accordance with one or more embodiments, a liquid crystal display device includes a first substrate and a second substrate spaced apart from each other; a liquid crystal layer between the first substrate and the second substrate; a gate line, a data line, a first sub-pixel electrode, and a second sub-pixel electrode over the first substrate; a first switching element connected to the gate line, the data line, and the first sub-pixel electrode; and a second switching element connected to the gate line, the first sub-pixel electrode, and the second sub-pixel electrode.

The first switching element may have a threshold voltage lower than a threshold voltage of the second switching element.

The first switching element may have a threshold voltage that is $1/x$ times a threshold voltage of the second switching element, x being a rational number greater than or equal to 2.

A semiconductor layer of the first switching element may include impurity ions at a higher concentration than an impurity ion concentration of a semiconductor layer of the second switching element.

The semiconductor layer of the first switching element may include impurity ions at a concentration that is five times the impurity ion concentration of the semiconductor layer of the second switching element.

An amount of impurity ions injected to the second switching element may be 0.

The first switching element may include a semiconductor layer having a thickness less than a thickness of a semiconductor layer of the second switching element.

A thickness of a portion of the semiconductor layer in the first switching element disposed corresponding to a channel area thereof may be less than a thickness of a portion of the semiconductor layer in the second switching element disposed corresponding to a channel area thereof.

The semiconductor layer of the first switching element may have the thickness that is $1/y$ times the thickness of the semiconductor layer of the second switching element, y being a rational number greater than or equal to 3.

The liquid crystal display device may further include an etching-inhibiting layer over the semiconductor layer of the second switching element, the etching-inhibiting layer disposed corresponding to the channel area of the second switching element.

The first switching element may have a W/L ratio greater than a W/L ratio of the second switching element.

The W/L ratio of the first switching element may be at least two times the W/L ratio of the second switching element.

An insulating layer disposed corresponding to a channel area of the first switching element may have a thickness less than a thickness of an insulating layer disposed corresponding to a channel area of the second switching element.

The thickness of the insulating layer disposed corresponding to the channel area of the first switching element may be $1/z$ times the thickness of the insulating layer disposed corresponding to the channel area of the second switching element, z being a rational number greater than or equal to 2.

The insulating layer may include a first insulating layer overlapping the channel area of the first switching element and the channel area of the second switching element; and a second insulating layer between the channel area of the second switching element and the first insulating layer.

The second insulating layer may have a hole defined corresponding to the channel area of the first switching element.

The first switching element may include a sub-gate electrode.

The sub-gate electrode may have a work function less than a work function of a semiconductor layer of the first switching element.

A bias voltage may be externally applied to or is not applied to the sub-gate electrode.

The first switching element may induce a gate electrode connected to the gate line; a drain electrode connected to one of the data line and the first sub-pixel electrode; and a source electrode connected to another of the data line and the first sub-pixel electrode.

The second switching element may include a gate electrode connected to the gate line; a drain electrode connected to one of the first sub-pixel electrode and the second sub-pixel electrode; and a source electrode connected to another of the first sub-pixel electrode and the second sub-pixel electrode.

One of a drain electrode and a source electrode of the first switching element may be unitary with one of a drain electrode and a source electrode of the second switching element.

One of a drain electrode and a source electrode of the first switching element may have a U-shape.

A protruding portion of the drain electrode or the source electrode having a U-shape included in the first switching element may face toward the second sub-pixel electrode.

Another of the drain electrode and the source electrode of the first switching element may have an I-shape.

One of a drain electrode and a source electrode of the second switching element may have a U-shape.

A protruding portion of the drain electrode or the source electrode having a U-shape included in the second switching element may face toward the second sub-pixel electrode.

Another of the drain electrode and the source electrode of the second switching element may have an I-shape.

A drain electrode and a source electrode of the second switching element may have an I-shape.

A connecting portion between the first switching element and the first sub-pixel electrode may be between the gate line and the first sub-pixel electrode.

A connecting portion between the second switching element and the second sub-pixel electrode may be between the gate line and the second sub-pixel electrode.

A connecting portion between the first switching element and the first sub-pixel electrode and a connecting portion between the second switching element and the second sub-pixel electrode may be between the gate line and the first sub-pixel electrode.

The second switching element may include a gate electrode connected to the gate line; a drain electrode connected to one of the first sub-pixel electrode and the second sub-pixel electrode; a source electrode connected to another of the first sub-pixel electrode and the second sub-pixel electrode; and at least one floating electrode between the source electrode and the drain electrode.

In accordance with one or more embodiments, a method of manufacturing a liquid crystal display device include forming a first gate electrode and a second gate electrode over a first substrate; forming an insulating layer over the first gate electrode and the second gate electrode; forming a first semiconductor layer and a second semiconductor layer over the insulating layer, the first semiconductor layer overlapping the first gate electrode and the second semiconductor layer overlapping the second gate electrode; forming a first drain electrode and a first source electrode over the first semiconductor layer to thereby form a first switching element and forming a second source electrode and a second drain electrode over the second semiconductor layer to thereby form a second switching element, the second drain electrode connected to the first source electrode; forming a passivation layer over the first drain electrode, the first source electrode, the second drain electrode, and the second source electrode; defining a first contact hole and a second contact hole in the insulating layer and the passivation layer; forming a first sub-pixel electrode connected to the first source electrode through the first contact hole, and forming a second sub-pixel electrode connected to the second source electrode through the second contact hole; and forming a liquid crystal layer between the first substrate and the second substrate.

The method may further include injecting impurity ions to the first semiconductor layer and the second semiconductor layer.

Impurity ions may be injected to the first semiconductor layer at a higher concentration than an impurity ion concentration of the second semiconductor layer.

The injecting of impurity ions may include disposing a mask having an aperture and a slit over the first semiconductor layer and the second semiconductor layer; and injecting impurity ions to the first semiconductor layer through the aperture of the mask and injecting impurity ions to the second semiconductor layer through the slit of the mask.

The first semiconductor layer may have a thickness less than a thickness of the second semiconductor layer.

A thickness of a portion of the first semiconductor layer in the first switching element disposed corresponding to a channel area thereof may be less than a thickness of a portion of the second semiconductor layer in the second switching element disposed corresponding to a channel area thereof.

The method may further include forming an etching-inhibiting layer over the second semiconductor layer disposed corresponding to the channel area of the second switching element.

The forming of the first semiconductor layer and the second semiconductor layer may include forming a semiconductor material and an etching-inhibiting material over the insulating layer; patterning the etching-inhibiting material to thereby form the etching-inhibiting layer; patterning the semiconductor material to thereby form the first semiconductor layer and the second semiconductor layer; forming the first drain electrode, the first source electrode, the second drain electrode, and the second source electrode over the first semiconductor layer and the second semiconductor layer; and removing a portion of the first semiconductor layer disposed corresponding to the channel area of the first switching element, using the first drain electrode, the first source electrode, the second drain electrode, the second source electrode, and the etching-inhibiting layer as a mask.

The forming of the first semiconductor layer and the second semiconductor layer may include forming a semiconductor material and a source metal layer over the insulating layer; forming first, second, and third photoresist patterns over the source metal layer, the first, second, and third photoresist patterns having different thicknesses from one another; patterning the source metal layer and the semiconductor material, using the first, second, and third photoresist patterns as a mask, to thereby form the first semiconductor layer, the second semiconductor layer, a first source-drain pattern over the first semiconductor layer, and a second source-drain pattern over the second semiconductor layer; removing the first photoresist pattern having a smallest thickness and removing a portion of the second photoresist pattern and a portion of the third photoresist pattern to thereby form a first residual pattern and a second residual pattern; patterning the first source-drain pattern, using the first residual pattern and the second residual pattern as a mask, to thereby form the first drain electrode and the first source electrode; removing a portion of the first semiconductor layer disposed corresponding to the channel area of the first switching element, using the first residual pattern and the second residual pattern as a mask; removing the first residual pattern having the smallest thickness and removing a portion of the second residual pattern to thereby form a third residual pattern; patterning the second source-drain pattern, using the third residual pattern as a mask, to thereby form the second drain electrode and the second source electrode; and removing a portion of the first semiconductor layer disposed corresponding to the channel area of the first switching element and a portion of the second semiconductor layer disposed corresponding to the channel area of the second switching element, using the third residual pattern as a mask.

The first semiconductor layer may have a W/L ratio greater than a W/L ratio of the second semiconductor layer.

The insulating layer disposed corresponding to a channel area of the first switching element may have a thickness less than a thickness of the insulating layer disposed corresponding to a channel area of the second switching element.

The forming of the insulating layer may include forming a first insulating layer over the first and second gate electrodes for the first insulating layer to correspond to the channel area of the first switching element and the channel area of the second switching element; and forming a second insulating layer over the first insulating layer for the second insulating layer to correspond to the channel area of the second switching element.

The forming of the insulating layer may include forming a first insulating layer over the first and second gate electrodes for the first insulating layer to correspond to the channel area of the first switching element and the channel area of the second switching element; forming a second insulating layer over the first insulating layer; and defining a hole in the second insulating layer for the hole to correspond to the channel area of the first switching element.

The method may further include forming a sub-gate electrode over the first semiconductor layer.

The sub-gate electrode may be disposed over the first semiconductor layer for the sub-gate electrode to correspond to a channel area of the first switching element.

The sub-gate electrode may have a work function less than a work function of the first semiconductor layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
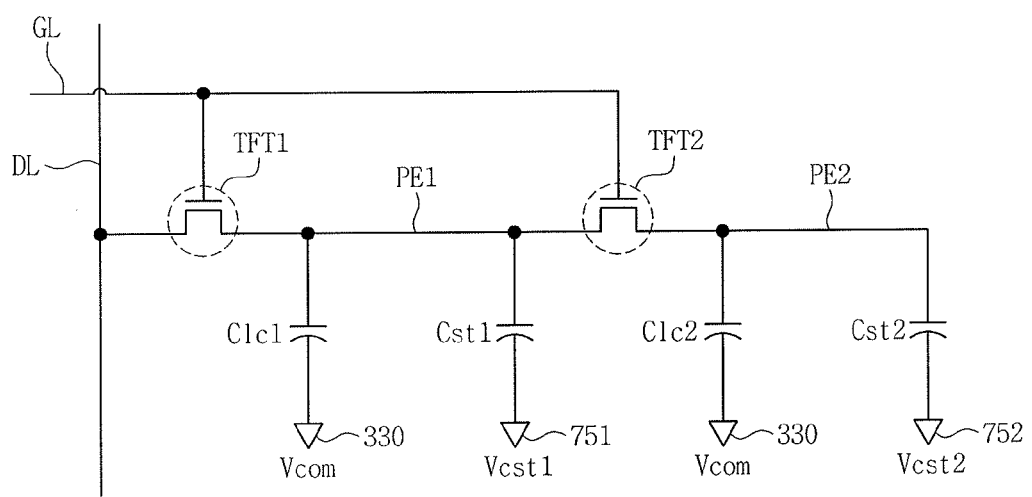
FIG. 1 illustrates an equivalent circuit diagram of a pixel provided in an exemplary embodiment of a liquid crystal display ("LCD") device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawing figures, the dimensions of layers and regions may be exaggerated for clarity of illustration. It will also be understood that when an element (e.g., a layer) is referred to as being "on" another element or substrate, it can be directly over the other element or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending over the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

Hereinafter, exemplary embodiments of a liquid crystal display ("LCD") device will be described in detail with reference to FIGS. 1 to 64.

FIG. 1 illustrates an equivalent circuit diagram of a pixel provided in an exemplary embodiment of an LCD device.

The pixel, as illustrated in FIG. 1, includes a first switching element TFT1, a second switching element TFT2, a first sub-pixel electrode PE1, a second sub-pixel electrode PE2, a first liquid crystal capacitor Clc1, a second liquid crystal capacitor Clc2, a first storage capacitor Cst1, and a second storage capacitor Cst2.

The first switching element TFT1 is connected to a gate line GL, a data line DL, and the first sub-pixel electrode PE1. The first switching element TFT1 is controlled based on a gate signal applied from the gate line GL, and is connected between the data line DL and the first sub-pixel electrode PE1. The first switching element TFT1 is turned on by a gate high voltage of the gate signal, and applies, when turned on, a data voltage applied from the data line DL to the first sub-pixel electrode PE1. The first switching element TFT1 is turned off by a gate low voltage of the gate signal. Herein, the data voltage is an image data voltage.

The first liquid crystal capacitor Clc1 is formed between the first sub-pixel electrode PE1 and a common electrode 330. The first liquid crystal capacitor Clc1 includes a first electrode connected to the first sub-pixel electrode PE1, a second electrode connected to the common electrode 330, and a liquid crystal layer between the first electrode and the second electrode. The first electrode of the first liquid crystal capacitor Clc1 may be a portion of the first sub-pixel electrode PE1, and the second electrode of the first liquid crystal capacitor Clc1 may be a portion of the common electrode 330.

A common voltage Vcom is applied to the common electrode 330.

The first storage capacitor Cst1 is formed between the first sub-pixel electrode PE1 and the first storage electrode 751. The first storage capacitor Cst1 includes a first electrode connected to the first sub-pixel electrode PE1, a second electrode connected to the first storage electrode 751, and a dielectric material between the first electrode of the first storage capacitor Cst1 and the second electrode of the first storage capacitor Cst1. The dielectric material includes at least one insulating layer. The first electrode of the first storage capacitor Cst1 may be a portion of the first sub-pixel electrode PE1, and the second electrode of the first storage capacitor Cst1 may be a portion of the first storage electrode 751.

A first storage voltage Vcst1 is applied to the first storage electrode 751. The first storage voltage Vcst1 may have a voltage level equal to that of the common voltage Vcom.

The second switching element TFT2 is connected to the gate line GL, the first sub-pixel electrode PE1, and the second sub-pixel electrode PE2. The second switching element TFT2 is controlled by the gate signal applied from the gate line GL, and is connected between the first sub-pixel electrode PE1 and the second sub-pixel electrode PE2. The second switching element TFT2 is turned on by the gate high voltage of the gate signal, and applies, when turned on, a data voltage applied from the first sub-pixel electrode PE1 to the second sub-pixel electrode PE2. The second switching element TFT2 is turned off by the gate low voltage of the gate signal.

The second liquid crystal capacitor Clc2 is formed between the second sub-pixel electrode PE2 and the common electrode 330. The second liquid crystal capacitor Clc2 includes a first electrode connected to the second sub-pixel electrode PE2, a second electrode connected to the common electrode 330, and a liquid crystal layer between the first electrode of the second liquid crystal capacitor Clc2 and the second electrode of the second liquid crystal capacitor Clc2. The first electrode of the second liquid crystal capacitor Clc2 may be a portion of the second sub-pixel electrode PE2, and the second electrode of the second liquid crystal capacitor Clc2 may be a portion of the common electrode 330.

The second storage capacitor Cst2 is formed between the second sub-pixel electrode PE2 and the second storage electrode 752. The second storage capacitor Cst2 includes a first electrode connected to the second sub-pixel electrode PE2, a second electrode connected to the second storage electrode 752, and a dielectric material between the first electrode of the second storage capacitor Cst2 and the second electrode of the second storage capacitor Cst2. The dielectric material includes at least one insulating layer. The first electrode of the second storage capacitor Cst2 may be a portion of the second sub-pixel electrode PE2, and the second electrode of the second storage capacitor Cst2 may be a portion of the second storage electrode 752.

A second storage voltage Vcst2 is applied to the second storage capacitor Cst2. The second storage voltage Vcst2 may have a voltage level equal to that of the common voltage Vcom.

The aforementioned gate high voltage is a high logic voltage of the gate signal that is set to be a voltage greater than or equal to a higher one of threshold voltages of the first switching element TFT1 and the second switching element TFT2, and the aforementioned gate low voltage is a low logic voltage of the gate signal that is set to be an off-voltage of the first switching element TFT1 and the second switching element TFT2.

Hereinafter, operation of a pixel having the configuration described hereinabove will be descried.

In a case where the gate high voltage is applied to the gate line GL, the first switching element TFT1 and the second switching element TFT2 are turned on.

The data voltage applied from the data line DL through the turned-on first switching element TFT1 is applied to the first sub-pixel electrode PE1. In such an exemplary embodiment, due to a voltage drop of an inner resistance of the first switching element TFT1, the data voltage of the first sub-pixel electrode PE1 (hereinafter, "first sub-pixel voltage") has a voltage level lower than that of the data voltage of the data line DL.

A first sub-pixel voltage applied from the first sub-pixel electrode PE1 through the turned-on second switching element TFT2 is applied to the second sub-pixel electrode PE2. In such an exemplary embodiment, due to a voltage drop of an inner resistance of the second switching element TFT2, the data voltage of the second sub-pixel electrode PE2 (hereinafter, "second sub-pixel voltage") has a voltage level lower than that of the first sub-pixel voltage.

The turned-on first switching element TFT1 and the turned-on second switching element TFT2 both operate in a linear region. Based on the inner resistances of the first switching element TFT1 and the second switching element TFT2, a ratio between the first sub-pixel voltage and the second sub-pixel voltage may be calculated.

The first switching element TFT1 may have a higher current driving capability than that of the second switching element TFT2. In such an exemplary embodiment, as the current driving capability of the first switching element TFT1 further increases compared to the current driving capability of the second switching element TFT2, a voltage level of the first sub-pixel voltage becomes much closer to a voltage level of the data voltage (that is, the data voltage of the data line DL), and a difference between the first sub-pixel voltage and the second sub-pixel voltage increases.

As such, the data voltage applied from the data line DL is divided by the first switching element TFT1 and the second switching element TFT2 that are connected to each other in series, such that the first sub-pixel voltage of the first sub-pixel electrode PE1 and the second sub-pixel voltage of the second sub-pixel electrode PE2 may have different voltage levels from each other. Accordingly, visibility of the pixel may be improved.

In addition, only two switching elements, for example, the first switching element TFT1 and the second switching element TFT2, may be used to generate two sub-pixel voltages having different voltage levels from each other, and thus an aperture ratio of the pixel may increase.

In addition, the data line DL and the storage electrodes 751 and 752 are not directly connected to one another, and thus variation of the first storage voltage Vcst1 and the second storage voltage Vcst2 may be significantly reduced.

In such an exemplary embodiment, a level of a leakage current varies based on the second switching element TFT2 having a relatively higher threshold voltage, and thus the leakage current is significantly reduced when the first switching element TFT1 and the second switching element TFT2 are turned off. Accordingly, so-called "discoloration phenomenon" may be significantly reduced, such that image quality may be improved.

Such a pixel circuit may be achieved through a pixel configuration to be described hereinbelow. Descriptions pertaining to a pixel configuration corresponding to the pixel circuit illustrated in FIG. 1 will be provided hereinbelow.

Figure 2:
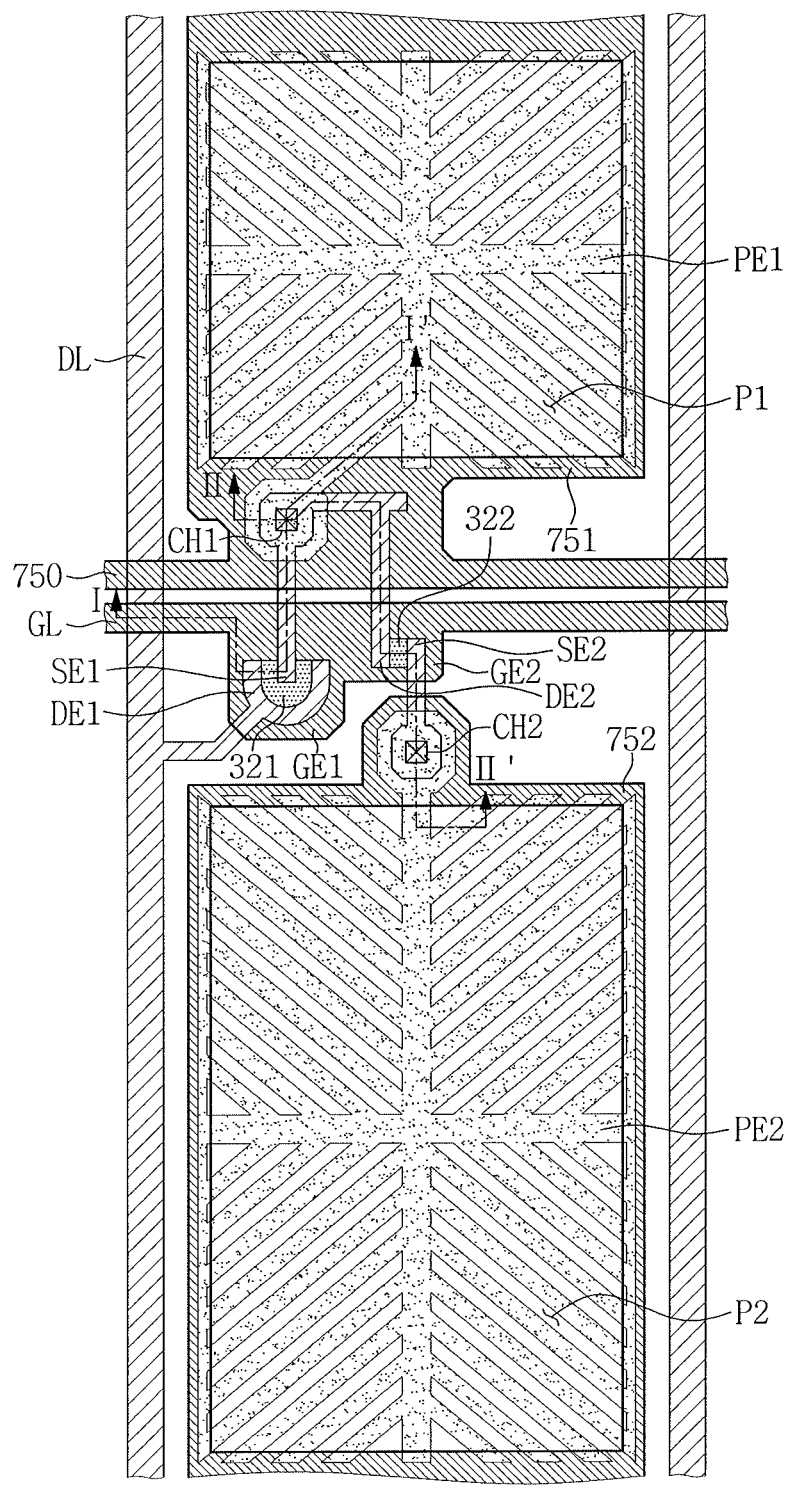
FIG. 2 illustrates a plan view of an exemplary embodiment of an LCD device including a pixel configuration corresponding to the pixel circuit of FIG. 1.
Figure 3:
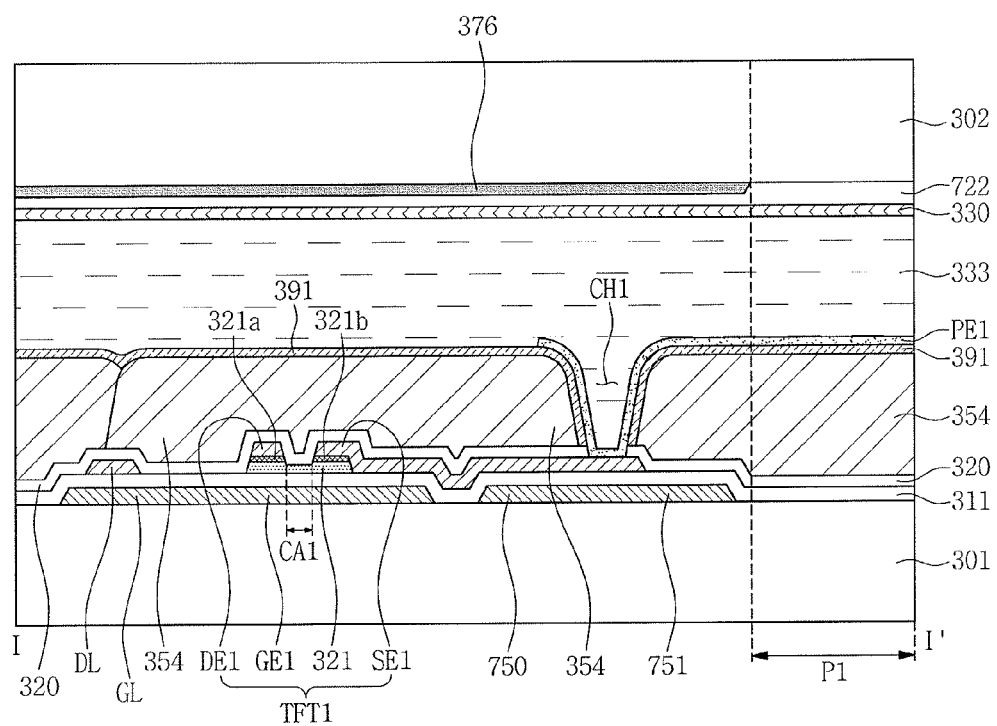
FIG. 3 illustrates a cross-sectional view of an exemplary embodiment taken along line I-I' of FIG. 2.
Figure 4:
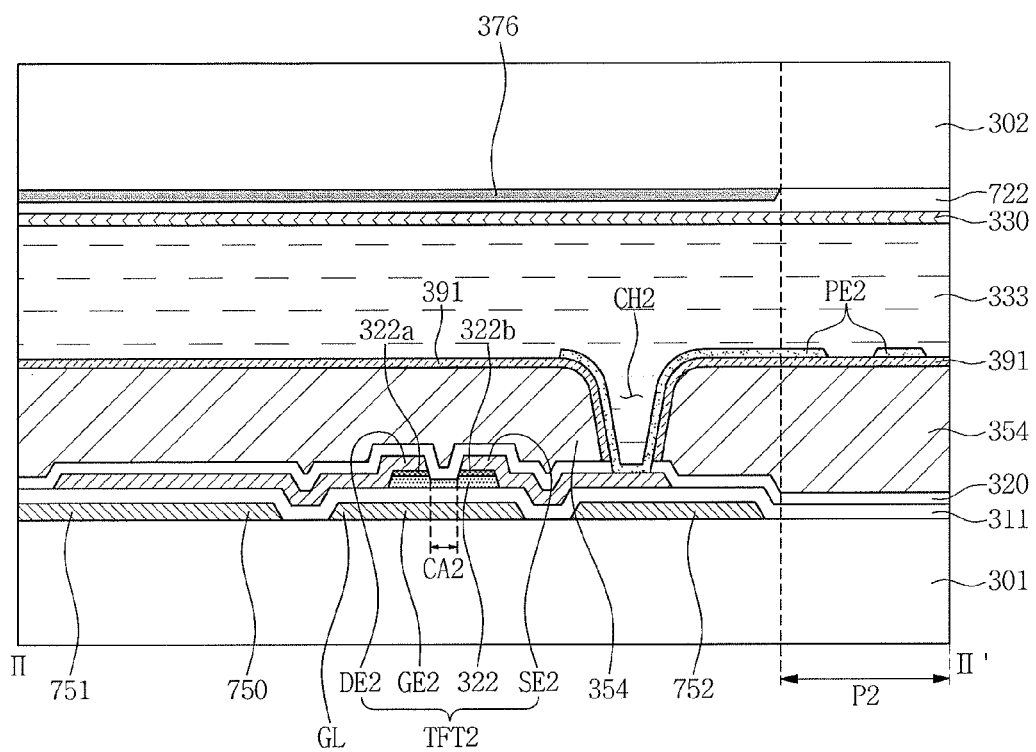
FIG. 4 illustrates a cross-sectional view of an exemplary embodiment taken along line II-II' of FIG. 2.

FIG. 2 illustrates a plan view of an exemplary embodiment of an LCD device including a pixel configuration corresponding to the pixel circuit of FIG. 1, FIG. 3 illustrates a cross-sectional view of an exemplary embodiment taken along line I-I' of FIG. 2, and FIG. 4 illustrates a cross-sectional view of an exemplary embodiment taken along line II-II' of FIG. 2.

The LCD device, as illustrated in FIGS. 2, 3, and 4, may include a first substrate 301, a gate line GL, a first gate electrode GE1, a second gate electrode GE2, a first storage electrode 751, a storage line 750, a second storage electrode 752, a gate insulating layer 311, a first semiconductor layer 321, a second semiconductor layer 322, a first ohmic contact layer 321a, a second ohmic contact layer 321b, a third ohmic contact layer 322a, a fourth ohmic contact layer 322b, a data line DL, a first drain electrode DE1, a first source electrode SE1, a second drain electrode DE2, a second source electrode SE2, a passivation layer 320, a capping layer 391, a color filter 354, a first sub-pixel electrode PE1, a second sub-pixel electrode PE2, a second substrate 302, a light blocking layer 376, an overcoat layer 722, a common electrode 330, and a liquid crystal layer 333. In an implementation, the first ohmic contact layer 321a, the second ohmic contact layer 321b, the third ohmic contact layer 322a, and the fourth ohmic contact layer 322b may be omitted from an exemplary embodiment of an LCD device.

The first switching element TFT1, as illustrated in FIGS. 2 and 3, may include the first gate electrode GE1, the first semiconductor layer 321, the first drain electrode DE1, and the first source electrode SE1.

The second switching element TFT2, as illustrated in FIGS. 2 and 4, includes the second gate electrode GE2, the second semiconductor layer 322, the second drain electrode DE2, and the second source electrode SE2.

As illustrated in FIGS. 2 and 3, the gate line GL may be on the first substrate 301. For example, the gate line GL may be between a first sub-pixel area P1 and a second sub-pixel area P2 of the first substrate 301.

The gate line GL, as illustrated in FIGS. 2 and 3, may be connected to the first gate electrode GE1 and the second gate electrode GE2. The gate line GL, the first gate electrode GE1, and the second gate electrode GE2 may be unitary, e.g., may have a one-piece, monolithic structure. In an implementation, a contacting portion (e.g., an end portion) of the gate line GL may have a greater area than an area of another portion thereof, so as to properly contact another layer or an external driving circuit.

The gate line GL may include or be formed of, e.g., aluminum (Al) or alloys thereof, silver (Ag) or alloys thereof, copper (Cu) or alloys thereof, and/or molybdenum (Mo) or alloys thereof. In an implementation, the gate line GL may include or be formed of, e.g., one of chromium (Cr), tantalum (Ta), and titanium (Ti). In an implementation, the gate line GL may have a multilayer structure including at least two conductive layers having different physical properties from one another.

The first gate electrode GE1, as illustrated in FIG. 2, may have a shape protruding from the gate line GL. The first gate electrode GE1 may be a portion of the gate line GL. The first gate electrode GE1 may include a same material and may have the same structure (multilayer structure) as those of the gate line GL. In an implementation, the first gate electrode GE1 and the gate line GL may be simultaneously formed in the same process.

The second gate electrode GE2, as illustrated in FIG. 2, may have a shape protruding from the gate line GL. The second gate electrode GE2 may be a portion of the gate line GL. The second gate electrode GE2 may include a same material and may have the same structure (multilayer structure) as those of the gate line GL. In an implementation, the second gate electrode GE2 and the gate line GL may be simultaneously formed in the same process.

The first storage electrode 751, as illustrated in FIG. 2, may enclose the first sub-pixel electrode PE1. In such an exemplary embodiment, the first storage electrode 751 may overlap an edge portion of the first sub-pixel electrode PE1. A first storage voltage Vcst1 may be applied to the first storage electrode 751. The first storage voltage Vcst1 may have a voltage level the same as that of the common voltage Vcom. The first storage electrode 751 may include the same material and have the same structure (multilayer structure) as those of the gate line GL. In an implementation, the first storage electrode 751 and the gate line GL may be simultaneously formed in the same process.

The first storage electrode 751 may be connected to the storage line 750. The storage line 750, as illustrated in FIG. 3, may be between the first sub-pixel area P1 and the second sub-pixel area P2. The storage line 750 may be parallel to the gate line GL. The first storage voltage Vcst1 may be applied to the storage line 750. In such an exemplary embodiment, the first storage electrode 751 and the storage line 750 may be unitary. The storage line 750 may include the same material and have the same structure (multilayer structure) as those of the gate line GL. In an implementation, the storage line 750 and the gate line GL may be simultaneously formed in the same process.

The second storage electrode 752, as illustrated in FIG. 2, may enclose the second sub-pixel electrode PE2. In such an exemplary embodiment, the second storage electrode 752 may overlap an edge portion of the second sub-pixel electrode PE2. The second storage electrode 752 may include the same material and have the same structure (multilayer structure) as those of the gate line GL. In an implementation, the second storage electrode 752 and the gate line GL may be simultaneously formed in the same process. A second storage voltage Vcst2 may be applied to the second storage electrode 752. The second storage voltage Vcst2 may have a voltage level that is the same as that of the common voltage Vcom. In an implementation, the second storage electrode 752 and the first storage electrode 751 may be unitary. The second storage electrode 752 may include the same material and have the same structure (multilayer structure) as those of the gate line GL. In an implementation, the second storage electrode 752 and the gate line GL may be simultaneously formed in the same process.

The gate insulating layer 311, as illustrated in FIGS. 3 and 4, may be the gate line GL, the first gate electrode GE1, the second gate electrode GE2, the first storage electrode 751, the second storage electrode 752, and the storage line 750. In such an exemplary embodiment, the gate insulating layer 311 may be disposed over an entire surface of the first substrate 301 including the gate line GL, the first gate electrode GE1, the second gate electrode GE2, the first storage electrode 751, the second storage electrode 752, and the storage line 750. The gate insulating layer 311 may include or be formed of, e.g., silicon nitride ($SiN_x$) or silicon oxide ($SiO_x$), for example. The gate insulating layer 311 may have a multilayer structure including at least two insulating layers having different physical properties from one another.

The data line DL, as illustrated in FIG. 3, may be on the gate insulating layer 311. In an implementation, a contacting portion (e.g., an end portion) of the data line DL may have a greater area than an area of another portion thereof, so as to properly contact another layer or an external driving circuit.

The data line DL may intersect the gate line GL and the storage line 750. In an implementation, a portion of the data line DL intersecting the gate line GL may have a smaller line width than a line width of another portion of the data line DL. Likewise, a portion of the data line DL intersecting the storage line 750 may have a smaller line width than a line width of another portion of the data line DL. Accordingly, a parasitic capacitance between the data line DL and the gate line GL and a capacitance between the data line DL and the storage line 750 may be reduced.

The data line DL may include or be formed of, e.g., refractory metal, such as molybdenum, chromium, tantalum and titanium, or an alloy thereof. The data line DL may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an implementation, the data line DL may include or be formed of suitable metals or conductors rather than the aforementioned materials.

The first semiconductor layer 321, as illustrated in FIG. 3, may be on the gate insulating layer 311. The first semiconductor layer 321, as illustrated in FIGS. 2 and 3, may overlap at least a portion of the first gate electrode GE1. The first semiconductor layer 321 may include or be formed of, e.g., amorphous silicon, polycrystalline silicon, or the like.

As illustrated in FIG. 3, the first ohmic contact layer 321a and the second ohmic contact layer 321b may be the first semiconductor layer 321. The first ohmic contact layer 321a and the second ohmic contact layer 321b may face or be laterally aligned with each other, having a channel area CA1 (hereinafter, "first channel area") of the first switching element TFT1 therebetween. At least one of the first ohmic contact layer 321a and the second ohmic contact layer 321b may include or be formed of silicide or n+ hydrogenated amorphous silicon doped with n-type impurities, such as phosphorus or hydrogen phosphide (PH$_3$), at high concentration.

The second semiconductor layer 322, as illustrated in FIG. 4, may be the gate insulating layer 311. The second semiconductor layer 322, as illustrated in FIGS. 2 and 4, may overlap at least a portion of the second gate electrode GE2. The second semiconductor layer 322 may include or be formed of, e.g., amorphous silicon, polycrystalline silicon, or the like.

As illustrated in FIG. 4, the third ohmic contact layer 322a and the fourth ohmic contact layer 322b may be the second semiconductor layer 322. The third ohmic contact layer 322a and the fourth ohmic contact layer 322b may face each or be laterally aligned with other, having a channel area CA2 (hereinafter, "second channel area") of the second switching element TFT2 therebetween. At least one of the third ohmic contact layer 322a and the fourth ohmic contact layer 322b may include or be formed of silicide or n+ hydrogenated amorphous silicon doped with n-type impurities, such as phosphorus or hydrogen phosphide (PH$_3$), at high concentration.

The third ohmic contact layer 322a and the second ohmic contact layer 321b may be connected to each other. In an implementation, the third ohmic contact layer 322a and the aforementioned second ohmic contact layer 321b may be unitary.

The first drain electrode DE1, as illustrated in FIG. 3, may be the first ohmic contact layer 321a. In an implementation, the first drain electrode DE1 may also be on the gate insulating layer 311. The first drain electrode DE1, as illustrated in FIG. 2 or 3, may have a shape protruding from the data line DL. In an implementation, the first drain electrode DE1 may be a portion of or extending from the data line DL. At least a portion of the first drain electrode DE1 may overlap the first semiconductor layer 321 and the first gate electrode GE1. In an implementation, the first drain electrode DE1 may have a shape selected from an I-shape, a C-shape, and a U-shape. The first drain electrode DE1 having a U-shape is illustrated in FIG. 3, and a protruding portion of the first drain electrode DE1 may face toward the second sub-pixel electrode PE2. For example, a closed end of the U-shaped first drain electrode DE1 may face the second sub-pixel electrode PE2. The first drain electrode DE1 may include the same material and may have the same structure (multilayer structure) as those of the data line DL. In an implementation, the first drain electrode DE1 and the data line DL may be simultaneously formed in the same process.

The first source electrode SE1, as illustrated in FIG. 3, may be the second ohmic contact layer 321b and the gate insulating layer 311. At least a portion of the first source electrode SE1 may overlap the first semiconductor layer 321 and the first gate electrode GE1. The first source electrode SE1 may be connected to the first sub-pixel electrode PE1. The first source electrode SE1 may include the same material and may have the same structure (multilayer structure) as those of the data line DL. In an implementation, the first source electrode SE1 and the data line DL may be simultaneously formed in the same process.

The channel area CA1 of the first switching element TFT1 may be a portion of the first semiconductor layer 321 that is between the first drain electrode DE1 and the first source electrode SE1. A portion of the first semiconductor layer 321 corresponding to or at the channel area CA1 may have a smaller thickness than a thickness of another (e.g., non-channel) portion of the first semiconductor layer 321.

The second drain electrode DE2, as illustrated in FIG. 4, may be over the third ohmic contact layer 322a and the gate insulating layer 311. The second drain electrode DE2 and the first source electrode SE1 may be unitary. At least a portion of the second drain electrode DE2 may overlap the second semiconductor layer 322 and the second gate electrode GE2. In an implementation, the second drain electrode DE2 may have a shape selected from an I-shape, a C-shape, and a U-shape. The second drain electrode DE2 may include the same material and may have the same structure (multilayer structure) as those of the data line DL. In an implementation, the second drain electrode DE2 and the data line DL may be simultaneously formed in the same process.

The second source electrode SE2, as illustrated in FIG. 4, may be on the fourth ohmic contact layer 322b and the gate insulating layer 311. At least a portion of the second source electrode SE2 may overlap the second semiconductor layer 322 and the second gate electrode GE2. The second source electrode SE2 may be connected to the second sub-pixel electrode PE2. The second source electrode SE2 may include the same material and may have the same structure (multilayer structure) as those of the data line DL. In an implementation, the second source electrode SE2 and the data line DL may be simultaneously formed in the same process.

The channel area CA2 of the second switching element TFT2 may be a portion of the second semiconductor layer 322 between the second drain electrode DE2 and the second source electrode SE2. A portion of the second semiconductor layer 322 corresponding to or at the channel area CA2 may have a smaller thickness than a thickness of another (e.g., non-channel) portion of the second semiconductor layer 322.

The first semiconductor layer 321 of the first switching element TFT1 may include a greater amount of impurity ions than an amount of impurity ions of the second semiconductor layer 322 of the second switching element TFT2. In an implementation, a concentration of impurity ions injected to a portion of the first semiconductor layer 321 at the channel area CA1 (hereinafter, "first channel area") of the first switching element TFT1 may be greater than a concentration of impurity ions injected to a portion of the second semiconductor layer 322 at the channel area CA2 (hereinafter, "second channel area") of the second switching element TFT2. In an implementation, the first semiconductor layer 321 and the second semiconductor layer 322 may include or be formed of, e.g., a material such as n− hydrogenated amorphous silicon doped with n-type impurities, such as phosphorus or hydrogen phosphide (PH$_3$), at low concentration. In such an exemplary embodiment, an amount of impurity ions that the first channel area CA1 of the first semiconductor layer 321 is doped with may be far greater than an amount of impurity ions that the second channel area CA2 of the second semiconductor layer 322 is doped with. Herein, an amount of impurity ions included in the first channel area CA1 of the first semiconductor layer 321 may be greater than or equal to 5 times an amount of impurity ions included in the second channel area CA2 of the second semiconductor layer 322. Due to the difference between amounts of impurity ions, the first switching element TFT1 may have a threshold voltage that is lower than that of the second switching element TFT2. Accordingly, the first switching element TFT1 may have a higher current driving capability than that of the second switching element TFT2.

In an implementation, impurity ions may be selectively injected to the first channel area CA1 of the first semiconductor layer 321 and the second channel area CA2 of the second semiconductor layer 322. In an implementation, impurity ions may be injected to an entire portion of the first semiconductor layer 321 including the first channel area CA1 and an entire portion of the second semiconductor layer 322 including the second channel area CA2. In an implementation, a concentration of impurity ions injected to the first semiconductor layer 321 may differ from a concentration of impurity ions injected to the second semiconductor layer 322.

Each of impurity ion concentrations of the first semiconductor layer 321 and the second semiconductor layer 322 may be less than a concentration of impurity ions of the aforementioned ohmic contact layer, e.g., one of the first ohmic contact layer 321a, the second ohmic contact layer 321b, the third ohmic contact layer 322a, and the fourth ohmic contact layer 322b.

The passivation layer 320, as illustrated in FIGS. 3 and 4, may be the data line DL, the first drain electrode DE1, the second drain electrode DE2, the first source electrode SE1, and the second source electrode SE2. In such an exemplary embodiment, the passivation layer 320 may be on the entire surface of the first substrate 301 including the data line DL, the first drain electrode DE1, the second drain electrode DE2, the first source electrode SE1, and the second source electrode SE2. The passivation layer 320 may include a first lower contact hole and a second lower contact hole defined through portions thereof. The first source electrode SE1 may be exposed externally through the first lower contact hole, and the second source electrode SE2 may be exposed externally through the second lower contact hole.

The passivation layer 320 may include or be formed of, e.g., an inorganic insulating material such as silicon nitride ($SiN_x$) or silicon oxide ($SiO_x$). In an implementation, an inorganic insulating material having photosensitivity and having a dielectric constant of about 4.0 may be used. In an implementation, the passivation layer 320 may have a double-layer structure including a lower inorganic layer and an upper organic layer, which has been found to impart desirable insulating properties and also to help reduce and/or prevent damage to exposed portions of the first semiconductor layer 321 and the second semiconductor layer 322. In an implementation, the passivation layer 320 may have a thickness greater than or equal to about 5,000 Å, e.g., about 6,000 Å to about 8,000 Å.

The color filter 354, as illustrated in FIGS. 3 and 4, may be on the passivation layer 320. The color filter may be in the first sub-pixel area P1 and the second sub-pixel area P2, and in such an exemplary embodiment, an edge portion of the color filter 354 may be on the gate line GL, the first switching element TFT1, the second switching element TFT2, and the data line DL. In an implementation, the color filter 354 may be absent from a first contact hole CH1 and a second contact hole CH2. In an implementation, an edge portion of one of the color filters 354 may overlap an edge portion of another of the color filters 354 adjacent thereto. Color filters 354 having the same color may be disposed in the first sub-pixel area P1 and the second sub-pixel area P2 included in the same pixel. The color filter 354 may include or be formed of a photosensitive organic material.

The capping layer 391, as illustrated in FIGS. 3 and 4, may be the color filter 354. The capping layer 391 may help reduce and/or prevent infiltration of undesirable materials, generated in the color filter 354, into the liquid crystal layer 333. The capping layer 391 may have a first upper contact hole and a second upper contact hole extending therethrough, and the first upper contact hole may be on or aligned with the first lower contact hole exposing the first source electrode SE1. The first upper contact hole may be connected to the first lower contact hole, thereby forming the first contact hole CH1. The second upper contact hole may be on or aligned with the second lower contact hole exposing the second source electrode SE2. The second upper contact hole may be connected to the second lower contact hole, thereby forming the second contact hole CH2. The capping layer 391 may include or be formed of, e.g., silicon nitride or silicon oxide.

The first sub-pixel electrode PE1, as illustrated in FIG. 2, may be in the first sub-pixel area P1. In such an exemplary embodiment, the first sub-pixel electrode PE1 may be on the capping layer 391. The first sub-pixel electrode PE1 may be connected to the first source electrode SE1 through the first contact hole CH1.

The first sub-pixel electrode PE1 may include or be formed of, e.g., a transparent conductive material, such as indium tin oxide ("ITO") or indium zinc oxide ("IZO"). Herein, ITO may be a polycrystalline or monocrystalline material, and IZO may be a polycrystalline or monocrystalline material, as well. In an implementation, IZO may be an amorphous material.

Hereinafter, the first sub-pixel electrode PE1 will be described in detail with reference to FIG. 5.

Figure 5:
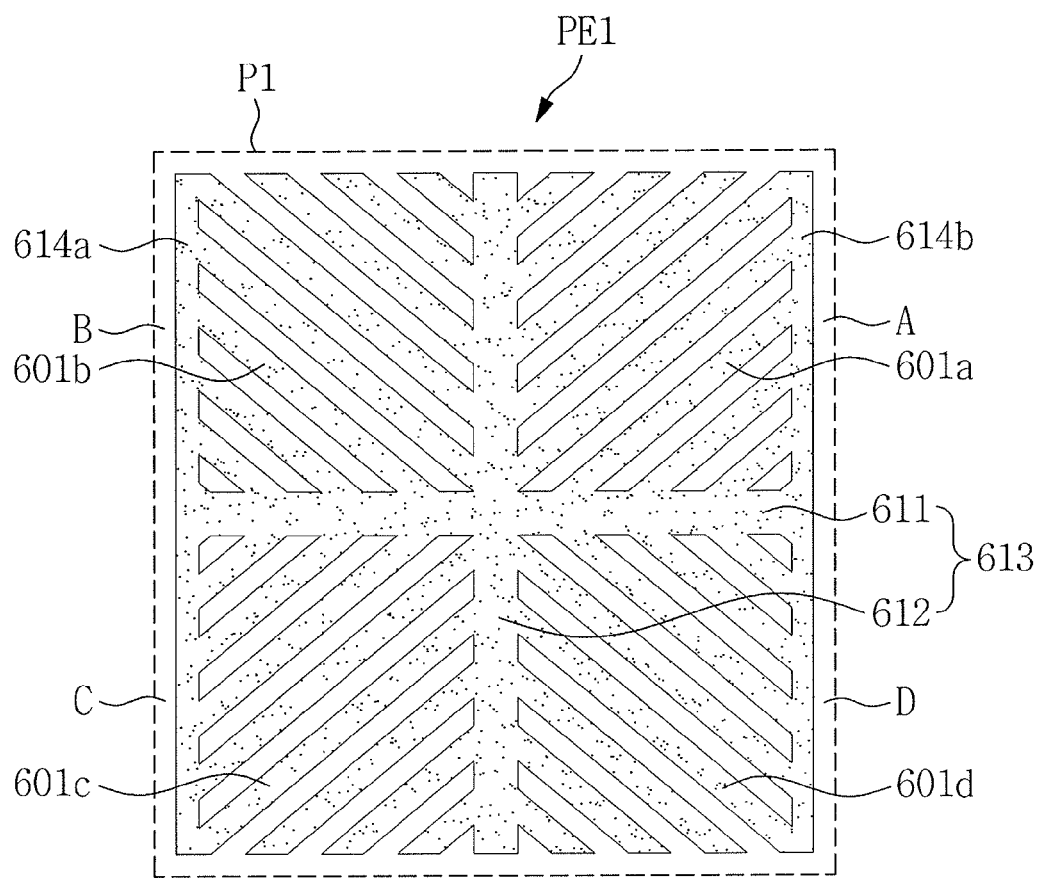
FIG. 5 separately illustrates a first sub-pixel electrode of FIG. 2.

FIG. 5 separately illustrates the first sub-pixel electrode PE1 of FIG. 2.

The first sub-pixel electrode PE1, as illustrated in FIG. 5, may include a stem electrode 613 and a plurality of branch electrodes 601a, 601b, 601c, and 601d. The stem electrode 613 and the branch electrodes 601a, 601b, 601c, and 601d may be unitary as a single unit.

The stem electrode 613 partitions the first sub-pixel area P1 into a plurality of domains. In an exemplary embodiment, the stem electrode 613 includes a horizontal portion 611 and a vertical portion 612 intersecting each other. The horizontal portion 611 partitions the first sub-pixel area P1 into two domains, and the vertical portion 612 partitions each of the partitioned two domains into another two smaller domains. A pixel area P may be divided into four domains A, B, C, and D by the stem electrode 613 including the horizontal portion 611 and the vertical portion 612.

The branch electrodes 601a, 601b, 601c, and 601d include first, second, third, and fourth branch electrodes 601a, 601b, 601c, and 601d, each extending from the stem electrode 613 into directions different from one another. In other words, the first, second, third, and fourth branch electrodes 601a, 601b, 601c, and 601d extend from the stem electrode 613 into corresponding ones of the domains A, B, C, and D, respectively. For example, the first branch electrode 601a is disposed in the first domain A, the second branch electrode 601b is disposed in the second domain B, the third branch electrode 601c is disposed in the third domain C, and the fourth branch electrode 601d is disposed in the fourth domain D.

The first branch electrode 601a and the second branch electrode 601b may form a symmetrical shape with respect to the vertical portion 612, and the third branch electrode 601c and the fourth branch electrode 601d may form a symmetrical shape with respect to the vertical portion 612. In addition, the first branch electrode 601a and the fourth branch electrode 601d may form a symmetrical shape with respect to the horizontal portion 611, and the second branch electrode 601b and the third branch electrode 601c may form a symmetrical shape with respect to the horizontal portion 611.

The first branch electrodes 601a may be provided in plural in the first domain A, and in such an exemplary embodiment, the plurality of first branch electrodes 601a are aligned parallel to one another. In this regard, a part of the first branch electrodes 601a extend from a side of the horizontal portion 611 contacting the first domain A in a diagonal direction with respect to the side thereof. Further, the rest of the first branch electrodes 601a extend from a side of the vertical portion 612 contacting the first domain A in a diagonal direction with respect to the side thereof.

The second branch electrodes 601b may be provided in plural in the second domain B, and in such an exemplary embodiment, the plurality of second branch electrodes 601b are aligned parallel to one another. In this regard, a part of the second branch electrodes 601b extend from a side of the horizontal portion 611 contacting the second domain B in a diagonal direction with respect to the side thereof. Further, the rest of the second branch electrodes 601b extend from a side of the vertical portion 612 contacting the second domain B in a diagonal direction with respect to the side thereof.

The third branch electrodes 601c may be provided in plural in the third domain C, and in such an exemplary embodiment, the plurality of third branch electrodes 601c are aligned parallel to one another. In this regard, a part of the third branch electrodes 601c extend from a side of the horizontal portion 611 contacting the third domain C in a diagonal direction with respect to the side thereof. Further, the rest of the third branch electrodes 601c extend from a side of the vertical portion 612 contacting the third domain C in a diagonal direction with respect to the side thereof.

The fourth branch electrodes 601d may be provided in plural in the fourth domain D, and in such an exemplary embodiment, the plurality of fourth branch electrodes 601d are aligned parallel to one another. In this regard, a part of the fourth branch electrodes 601d extend from a side of the horizontal portion 611 contacting the fourth domain D in a diagonal direction with respect to the side thereof. Further, the rest of the fourth branch electrodes 601d extend from a side of the vertical portion 612 contacting the fourth domain D in a diagonal direction with respect to the side thereof.

The aforementioned stem electrode 613 may further include a first connecting portion 614a and a second connecting portion 614b. The first connecting portion 614a is connected to an end portion of a side of the horizontal portion 611, and the second connecting portion 614b is connected to an end portion of another side of the horizontal portion 611. The first connecting portion 614a and the second connecting portion 614b may be aligned parallel to the vertical portion 612. The first connecting portion 614a and the second connecting portion 614b may be unitary with the stem electrode 613.

End portions of at least two of the first branch electrodes 601a in the first domain A and end portions of at least two of the fourth branch electrodes 601d in the fourth domain D may be connected to one another by the second connecting portion 614b. Likewise, end portions of at least two of the second branch electrodes 601b in the second domain B and end portions of at least two of the third branch electrodes 601c in the third domain C may be connected to one another by the first connecting portion 614a.

In an implementation, end portions of at least two of the first branch electrodes 601a in the first domain A and end portions of at least two of the second branch electrodes 601b in the second domain B may be connected to one another by another connecting portion. Further, end portions of at least two of the third branch electrodes 601c in the third domain C and end portions of at least two of the fourth branch electrodes 601d in the fourth domain D may be connected to one another by still another connecting portion.

The first sub-pixel electrode PE1 and the first storage electrode 751 may overlap each other. In an implementation, an edge portion of the first sub-pixel electrode PE1 may be on the first storage electrode 751.

A connecting portion between the first switching element TFT1 and the first sub-pixel electrode PE1 may be between the gate line GL and the first sub-pixel electrode PE1. For example, the first contact hole CH1 may be defined between the gate line GL and the first sub-pixel electrode PE1.

The second sub-pixel electrode PE2, as illustrated in FIG. 4, may be in the second sub-pixel area P2. In such an exemplary embodiment, the second sub-pixel electrode PE2 may be on the capping layer 391. The second sub-pixel electrode PE2 may be connected to the second source electrode SE2 through the second contact hole CH2. The second sub-pixel electrode PE2 may include or be formed of the same material as that included in the first sub-pixel electrode PE1. For example, the second sub-pixel electrode PE2 and the first sub-pixel electrode PE1 may be simultaneously provided in the same process.

The second sub-pixel electrode PE2 may have substantially the same configuration as that of the first sub-pixel electrode PE1. In an implementation, the second sub-pixel electrode PE2 may include a stem electrode that partitions the second sub-pixel area P2 into a plurality of domains and a branch electrode extending from the stem electrode into each corresponding one of the domains. In addition, the second sub-pixel electrode PE2 may further include a first connecting portion and a second connecting portion. Since the stem electrode, the branch electrode, the first connecting portion, and the second connecting portion included in the second sub-pixel electrode PE2 are the same as those included in the first sub-pixel electrode PE1, descriptions pertaining thereto will make reference to FIG. 5 and the related descriptions.

The second sub-pixel electrode PE2 may have an area greater than or equal area relative to that of the first sub-pixel electrode PE1. In an implementation, the area of the second sub-pixel electrode PE2 may be one time to two times the area of the first sub-pixel electrode PE1.

The second sub-pixel electrode PE2 and the second storage electrode 752 may overlap each other. In an implementation, an edge portion of the second sub-pixel electrode PE2 may be on the second storage electrode 752.

A connecting portion between the second switching element TFT2 and the second sub-pixel electrode PE2 may be between the gate line GL and the second sub-pixel electrode PE2. For example, the second contact hole CH2 may be defined between the gate line GL and the second sub-pixel electrode PE2.

The light blocking layer 376, as illustrated in FIGS. 3 and 4, may be on the second substrate 302. The light blocking layer 376 may be absent from the first sub-pixel area P1 and the second sub-pixel area P2. In an implementation, the light blocking layer 376 may be on the first substrate 301.

The overcoat layer 722 may be on the light blocking layer 376. In such an exemplary embodiment, the overcoat layer 722 may be on an entire surface of the second substrate 302 including the light blocking layer 376. The overcoat layer 722 may help significantly reduce (e.g., minimize) a height difference among elements between the overcoat layer 722 and the second substrate 302, e.g., among elements of the second substrate 302, such as the aforementioned light blocking layer 376. In an implementation, the overcoat layer 722 may be omitted.

The common electrode 330 may be on the overcoat layer 722. In such an exemplary embodiment, the common electrode 330 may be on the entire surface of the second substrate 302 including the overcoat layer 722. In an implementation, the common electrode 330 may be disposed on portions of the overcoat layer 722 corresponding to the first sub-pixel area P1 and the second sub-pixel area P2. The common voltage Vcom may be applied to the common electrode 330.

In an implementation, an exemplary embodiment of an LCD device may further include a first polarizer and a second polarizer. In a case where a surface of the first substrate 301 and a surface of the second substrate 302 that face each other are defined as upper surfaces of the corresponding substrates, respectively, and surfaces opposite to the upper surfaces are defined as lower surfaces of the corresponding substrates, respectively, the aforementioned first polarizer is disposed over the lower surface of the first substrate 301, and the second polarizer is disposed over the lower surface of the second substrate 302.

A transmission axis of the first polarizer is perpendicular to a transmission axis of the second polarizer, and one of the transmission axes thereof is oriented parallel to the gate line GL. In an alternative exemplary embodiment, the LCD device may only include one of the first polarizer and the second polarizer.

In an implementation, the LCD device may further include a shielding electrode. The shielding electrode may be disposed over the capping layer 391 to overlap the data line DL. In an exemplary embodiment, the shielding electrode may have a shape the same as that of the data line DL, and may be disposed along the data line DL. The shielding electrode may include or be formed of a material the same as that included in the first sub-pixel electrode PE1. The common voltage Vcom may be applied to the shielding electrode. The shielding electrode may help prevent formation of an electric field between the data line DL and the sub-pixel electrode, for example, the first and second sub-pixel electrodes. In such an exemplary embodiment, the shielding electrode and the common electrode 330 have an equivalent electric potential, such that light transmitted through the liquid crystal layer between the shielding electrode and the common electrode 330 is shielded by the second polarizer. Accordingly, light leakage may be significantly reduced or prevented at a portion corresponding to the data line DL.

The first substrate 301 and the second substrate 302 may be insulating substrates that include or are formed of glass or plastic.

The liquid crystal layer between the first substrate 301 and the second substrate 302 include liquid crystal molecules. The liquid crystal molecules may have negative dielectric constants and may be homeotropic liquid crystal molecules.

FIGS. 6A 6B, 7A, 7B, 8A, 8B, 9A, 9B, 10A, 10B, 11A, 11B, 12A, 12B, 13A, 13B, 14A, 14B, 15A, and 15B illustrate cross-sectional views of stages in an exemplary embodiment of a process of manufacturing the LCD device of FIGS. 3 and 4. Herein, FIGS. 6A, 7A, 8A, 9A, 10A, 11A, 12A, 13A, 14A, and 15A are cross-sectional views with respect to FIG. 3, and FIGS. 6B, 7B, 8B, 9B, 10B, 11B, 12B, 13B, 14B, and 15B are cross-sectional views with respect to FIG. 4.

First, a gate metal layer may be deposited over the entire surface of the first substrate 301. The gate metal layer may be deposited in a physical vapor deposition ("PVD") method such as sputtering.

Figure 6A:
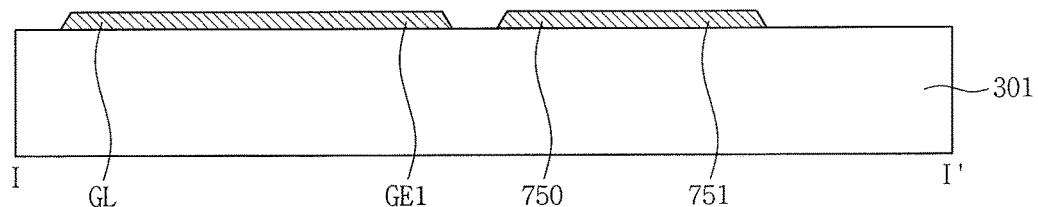
FIGS. 6A, 6B, 7A, 7B, 8A, 8B, 9A, 9B, 10A, 10B, 11A, 11B, 12A, 12B, 13A, 13B, 14A, 14B, 15A, and 15B illustrate cross-sectional views of stages in an exemplary embodiment of a process of manufacturing the LCD device of FIGS. 3 and 4.
Figure 6B:
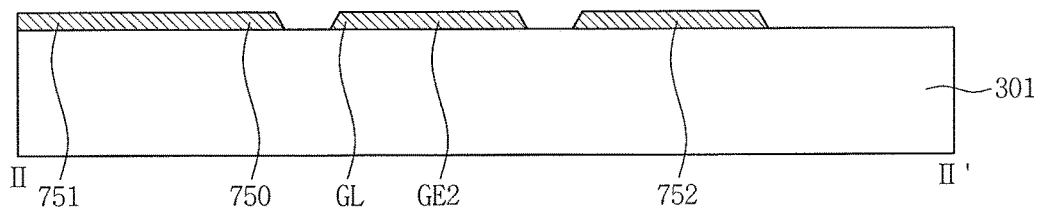

Subsequently, the aforementioned gate metal layer may be patterned through a photolithography process and an etching process, such that the gate line GL, the first gate electrode GE1, the storage line 750, the first storage electrode 751, the second gate electrode GE2, and the second storage electrode 752 are formed on the first substrate 301, as illustrated in FIGS. 6A and 6B.

The gate metal layer may be removed in a wet-etching method using an etching solution.

The gate metal layer may include or be formed of a material included in the aforementioned gate line GL.

Figure 7A:
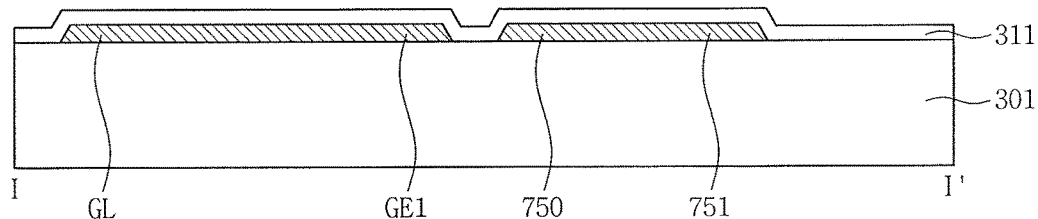
Figure 7B:
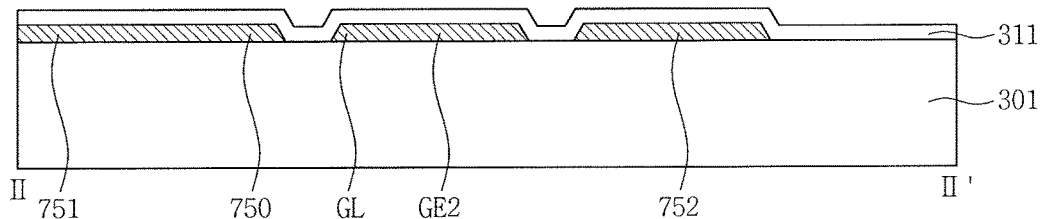

Subsequently, as illustrated in FIGS. 7A and 7B, the gate insulating layer 311 may be deposited over the entire surface of the first substrate 301 including the gate line GL, the first gate electrode GE1, the storage line 750, the first storage electrode 751, the second gate electrode GE2, and the second storage electrode 752. The gate insulating layer 311 may be deposited in a chemical vapor deposition ("CVD") method.

The gate insulating layer 311 may include or be formed of a material included in the aforementioned gate insulating layer 311.

Subsequently, a semiconductor material and an impurity semiconductor material may be sequentially deposited over the entire surface of the first substrate 301 including the gate insulating layer 311. The semiconductor material and the impurity semiconductor material may be deposited in a chemical vapor deposition ("CVD") method.

The semiconductor material may include or be formed of a material included in the first semiconductor layer 321 or the second semiconductor layer 322.

The impurity semiconductor material may include or be formed of a material included in the aforementioned first, second, third, and fourth ohmic contact layers 321a, 321b, 322a, and 322b.

Figure 8A:
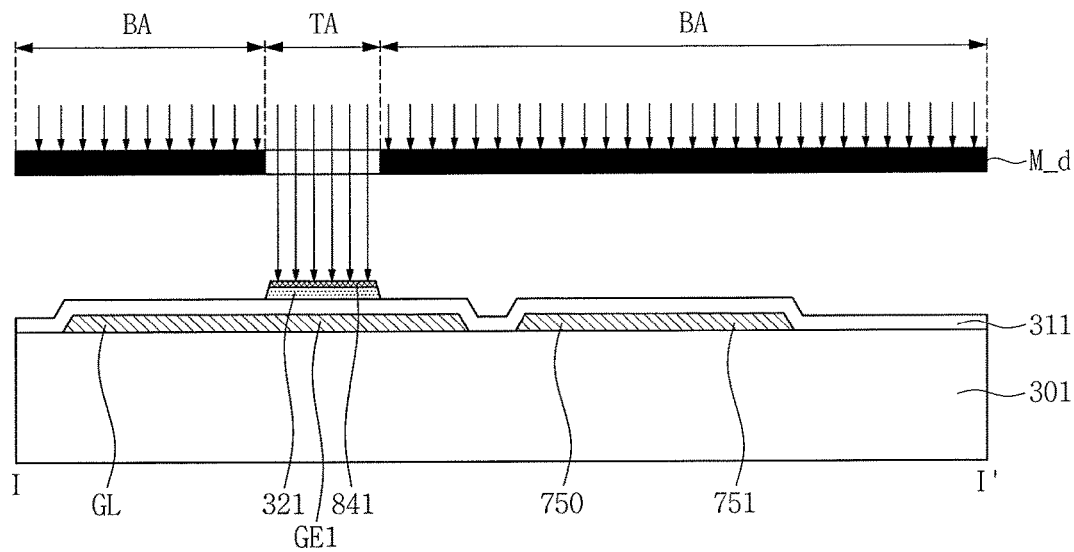
Figure 8B:
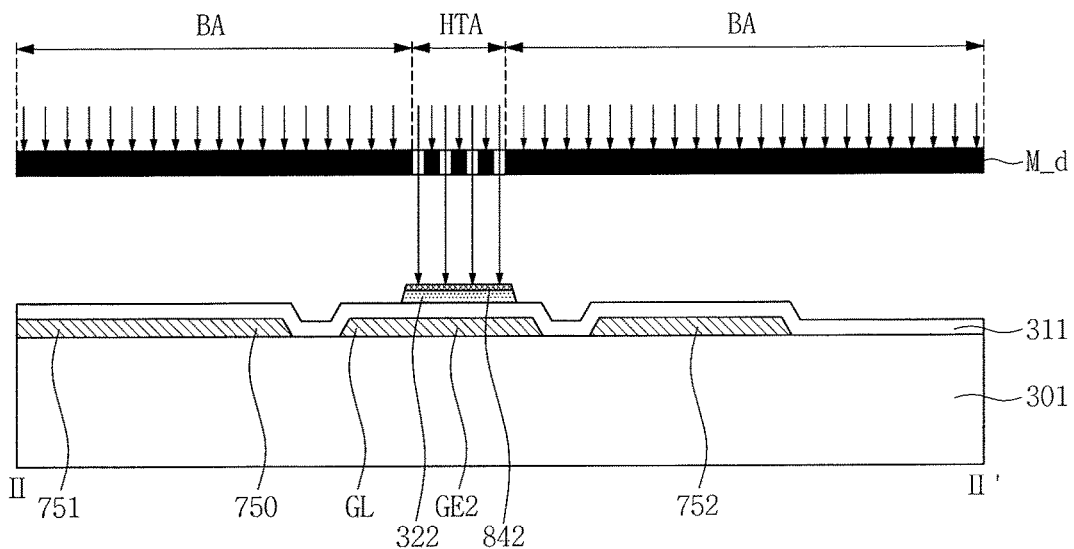

Subsequently, the semiconductor material and the impurity semiconductor material may be patterned through a photolithography process and an etching process, such that the first semiconductor layer 321 (overlapping the first gate electrode GE1) and the second semiconductor layer 322 (overlapping the second gate electrode GE2) may be formed over the gate insulating layer 311, a first impurity semiconductor pattern 841 may be formed over the first semiconductor layer 321, and a second impurity semiconductor pattern 842 may be formed over the second semiconductor layer 322, as illustrated in FIGS. 8A and 8B.

The semiconductor material and the impurity semiconductor material may be removed through a dry-etching method using an etching gas.

Subsequently, as illustrated in FIGS. 8A and 8B, a doping mask M_d may be disposed over the first substrate 301. The doping mask M_d may have a transmissive area TA through which impurity ions are transmitted and a half-transmissive area HTA through which impurity ions are partially transmitted. As illustrated in FIG. 8A, the transmissive area TA may correspond to or be aligned with the first semiconductor layer 321, and as illustrated in FIG. 8B, the half-transmissive area HTA may correspond to or be aligned with the second semiconductor layer 322.

Subsequently, n-type impurity ions, such as phosphorus or hydrogen phosphide ($PH_3$), may be selectively injected to the first semiconductor layer 321 and the second semiconductor layer 322 through the doping mask M_d at low concentration. Impurity ions provided to the transmissive area TA may be transmitted through the first impurity semiconductor pattern 841 to reach the first semiconductor layer 321, and impurity ions provided to the half-transmissive area HTA are transmitted through the second impurity semiconductor pattern 842 to reach the second semiconductor layer 322. In such an exemplary embodiment, a greater amount of impurity ions may be transmitted through the transmissive area TA than an amount of impurity ions transmitted through the half-transmissive area HTA, and thus a greater amount of impurity ions may be injected to the first semiconductor layer 321 in the transmissive area TA than an amount of impurity ions transmitted through the second semiconductor layer 322 in the half-transmissive area HTA. Accordingly, the first semiconductor layer 321 may have a higher impurity ion concentration than a concentration of impurity ions of the second semiconductor layer 322.

Subsequently, a source metal layer may be deposited over the entire surface of the first substrate 301 including the first semiconductor layer 321, the second semiconductor layer 322, the first impurity semiconductor pattern 841, the second impurity semiconductor pattern 842, and the gate insulating layer 311.

The source metal layer may include or be formed of a material included in the aforementioned data line DL.

Figure 9A:
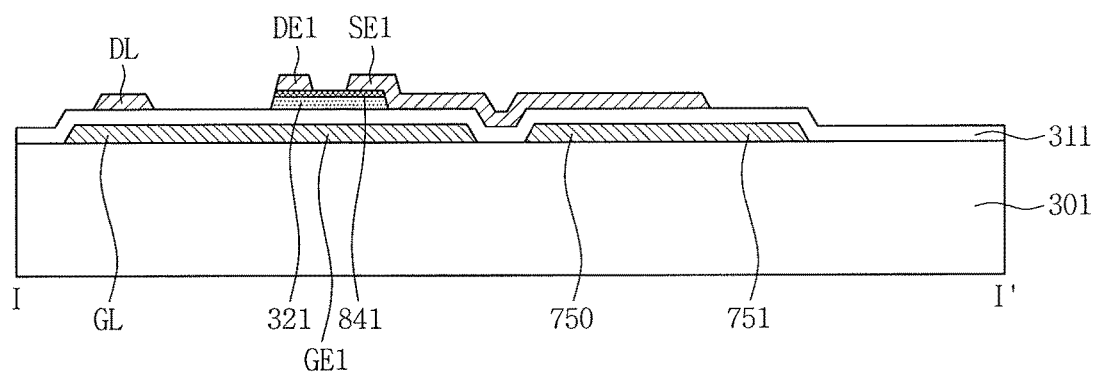
Figure 9B:
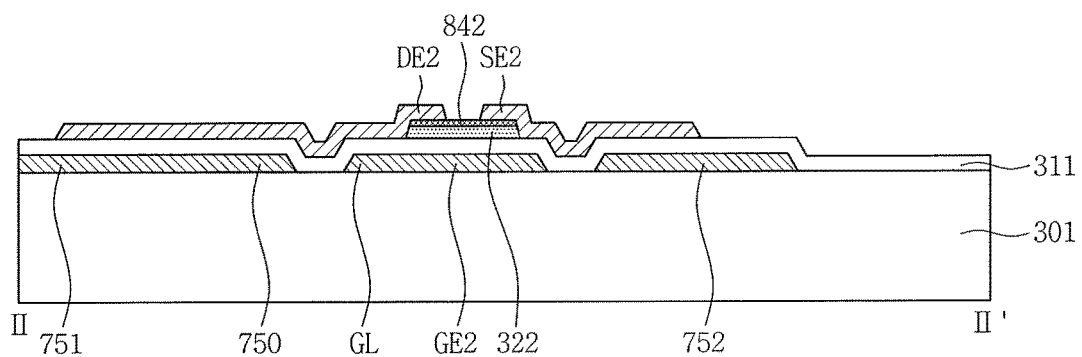

Subsequently, the source metal layer may be patterned through a photolithography process and an etching process, such that the data line DL intersecting the gate line GL is formed over the gate insulating layer 311, the first drain electrode DE1 and the first source electrode SE1 overlapping opposite end portions of the first semiconductor layer 321, respectively, are formed over the first impurity semiconductor pattern 841, and the second drain electrode DE2 and the second source electrode SE2 overlapping opposite end portions of the second impurity semiconductor layer 322, respectively, are formed over the second semiconductor pattern 842, as illustrated in FIGS. 9A and 9B.

Figure 10A:
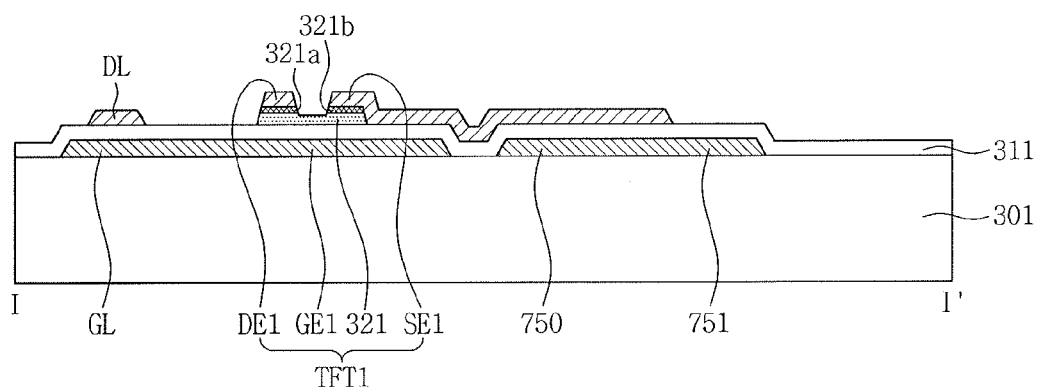
Figure 10B:
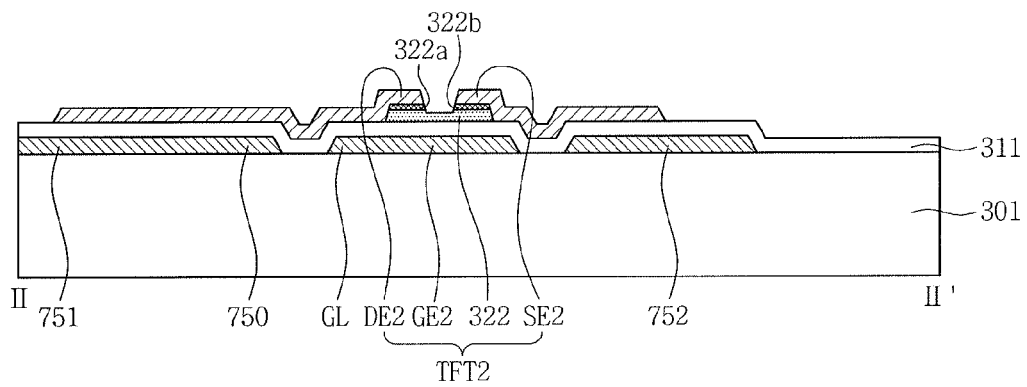

Subsequently, in a state where the first drain electrode DE1, the first source electrode SE1, the second drain electrode DE2, and the second source electrode SE2 are used as a mask, the first impurity semiconductor pattern 841 and the second impurity semiconductor pattern 842 are patterned through an etching process, such that the first, second, third, and fourth ohmic contact layers 321a, 321b, 322a, and 322b are formed as illustrated in FIGS. 10A and 10B. The first ohmic contact layer 321a may be formed between the first drain electrode DE1 and the first semiconductor layer 321, the second ohmic contact layer 321b may be formed between the first source electrode SE1 and the first semiconductor layer 321, the third ohmic contact layer 322a may be formed between the second drain electrode DE2 and the second semiconductor layer 322, and the fourth ohmic contact layer 322b may be formed between the second source electrode SE2 and the second semiconductor layer 322.

In an implementation, in the etching process performed on the first impurity semiconductor pattern 841 and the second impurity semiconductor pattern 842, a portion of the first semiconductor layer 321 below the first impurity semiconductor pattern 841 may be removed, and a portion of the second semiconductor layer 322 below the second impurity semiconductor pattern 842 may be removed.

Figure 11A:
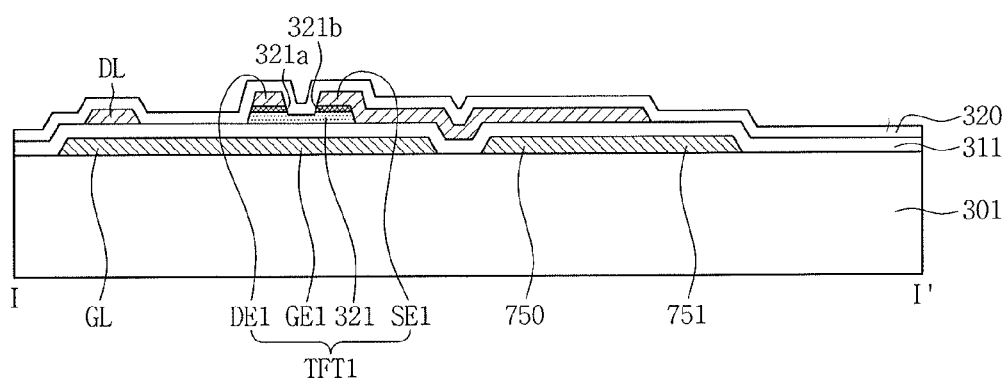
Figure 11B:
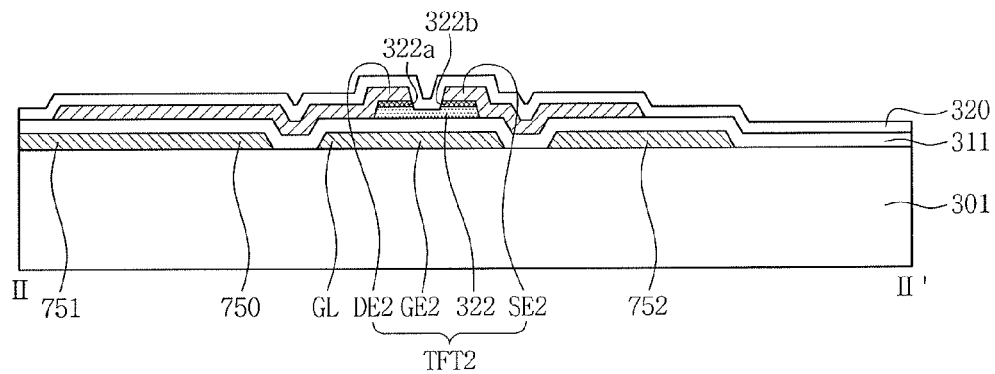

Subsequently, as illustrated in FIGS. 11A and 11B, the passivation layer 320 may be deposited over the entire surface of the first substrate 301 including the first drain electrode DE1, the first source electrode SE1, the second drain electrode DE2, and the second source electrode SE2.

The passivation layer 320 may include or be formed of a material included in the aforementioned passivation layer 320.

Subsequently, a photosensitive organic material may be formed over the entire surface of the first substrate 301 including the passivation layer 320.

Figure 12A:
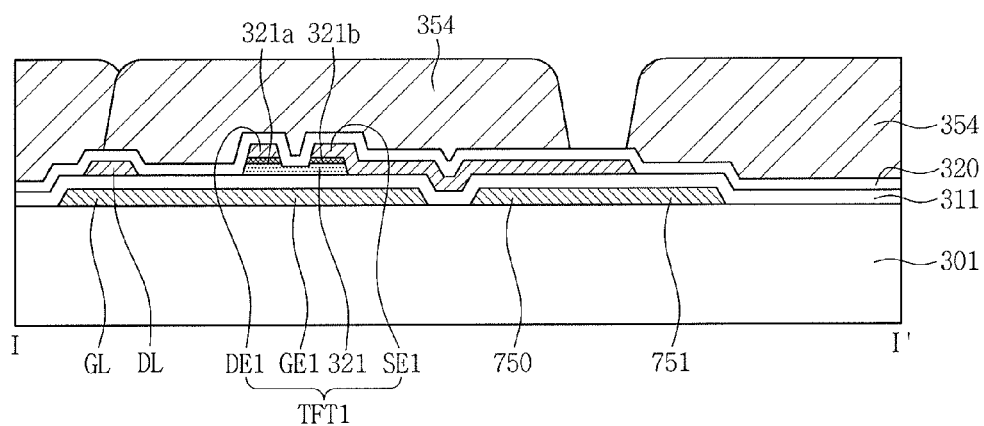
Figure 12B:
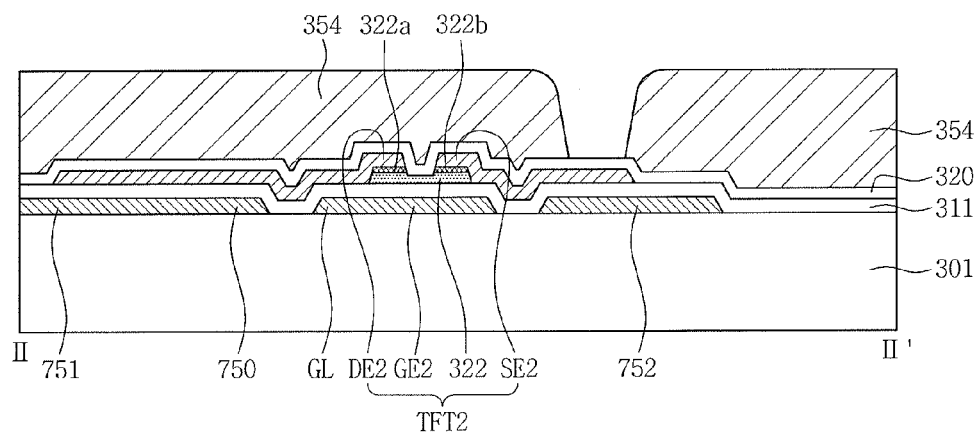

Subsequently, the photosensitive organic material may be patterned through a photolithography process, such that the color filter 354 is formed in the first sub-pixel area P1 and the second sub-pixel area P2 as illustrated in FIGS. 12A and 12B.

Figure 13A:
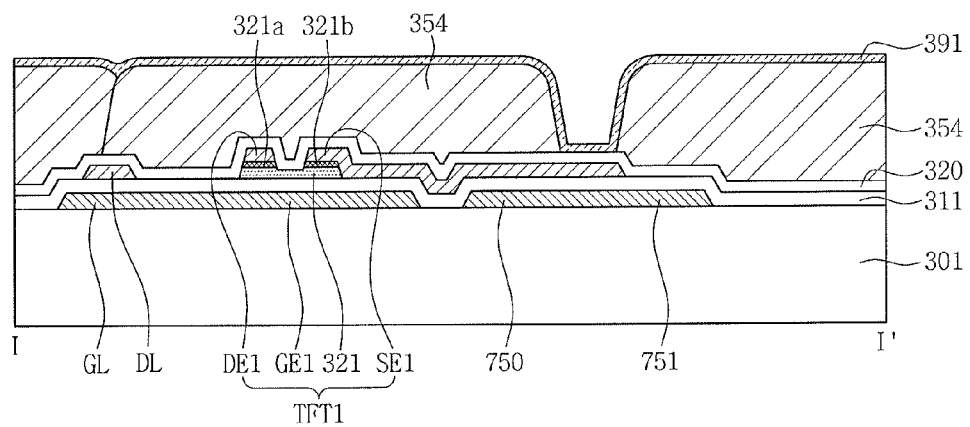
Figure 13B:
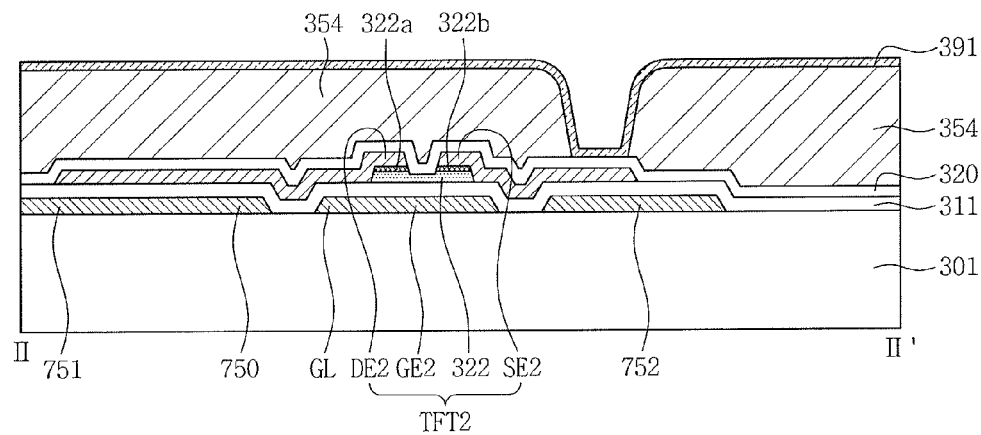

Subsequently, as illustrated in FIGS. 13A and 13B, the capping layer 391 may be deposited over the entire surface of the first substrate 301 including the color filter 354.

The capping layer 391 may include or be formed of a material included in the aforementioned capping layer 391.

Figure 14A:
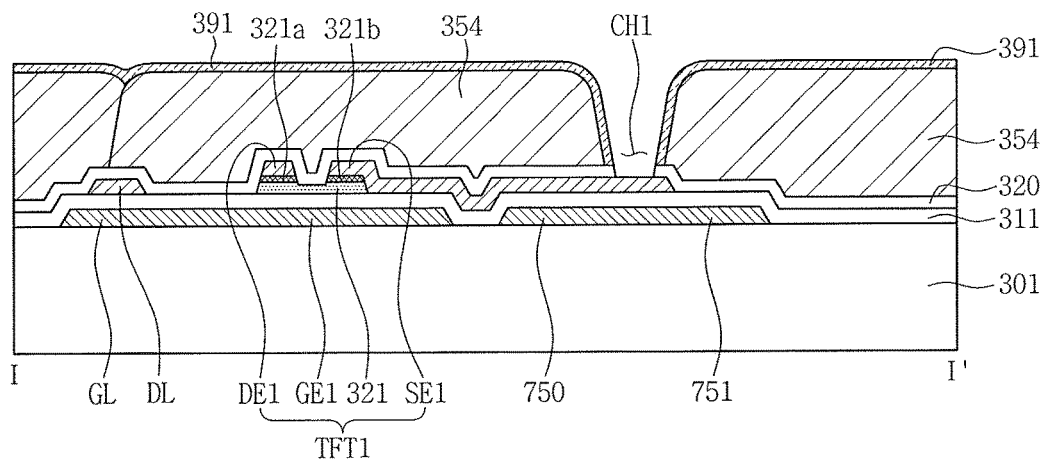
Figure 14B:
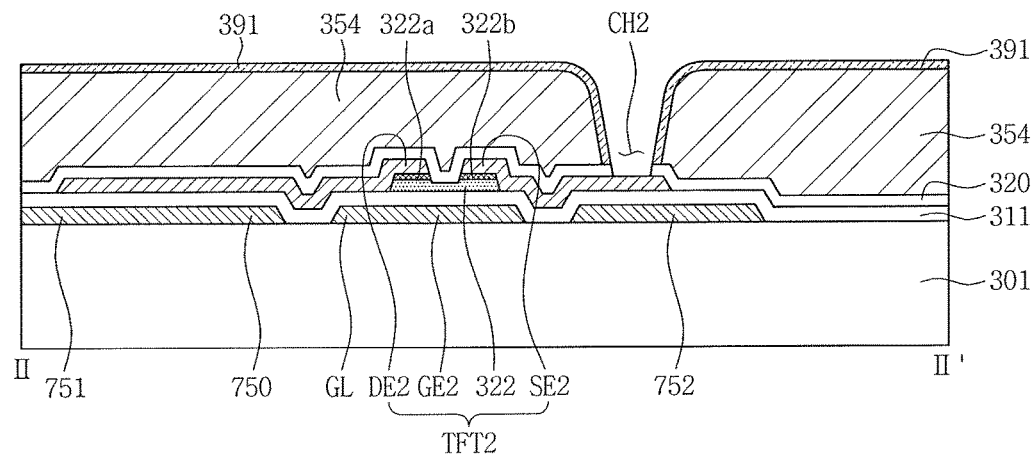

Subsequently, portions of the capping layer 391 and the passivation layer 320 may be selectively removed through the photolithography process and the etching process, such that the first contact hole CH1 exposing the first source electrode SE1 and the second contact hole CH2 exposing the second source electrode SE2 may be formed, as illustrated in FIGS. 14A and 14B.

Subsequently, a transparent metal layer may be deposited over the entire surface of the first substrate 301 including the capping layer 391, the first source electrode SE1, and the second source electrode SE2.

The transparent metal layer may include or be formed of a material included in the aforementioned first sub-pixel electrode PE1.

Figure 15A:
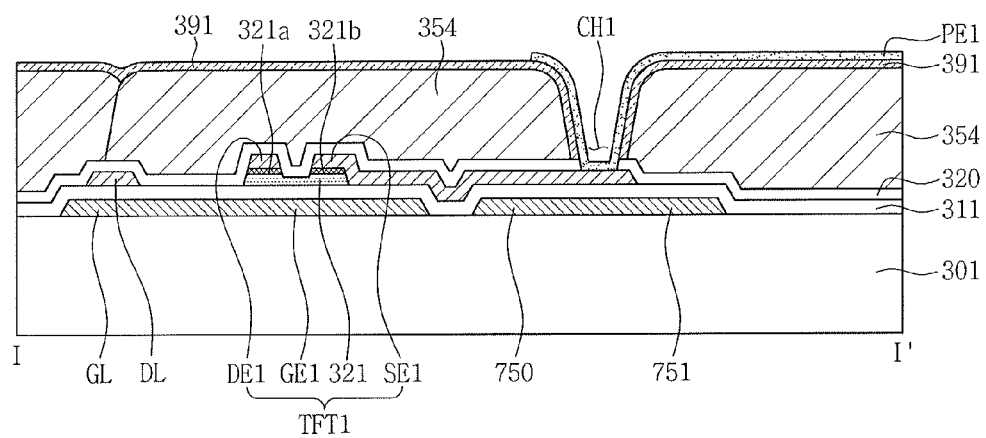
Figure 15B:
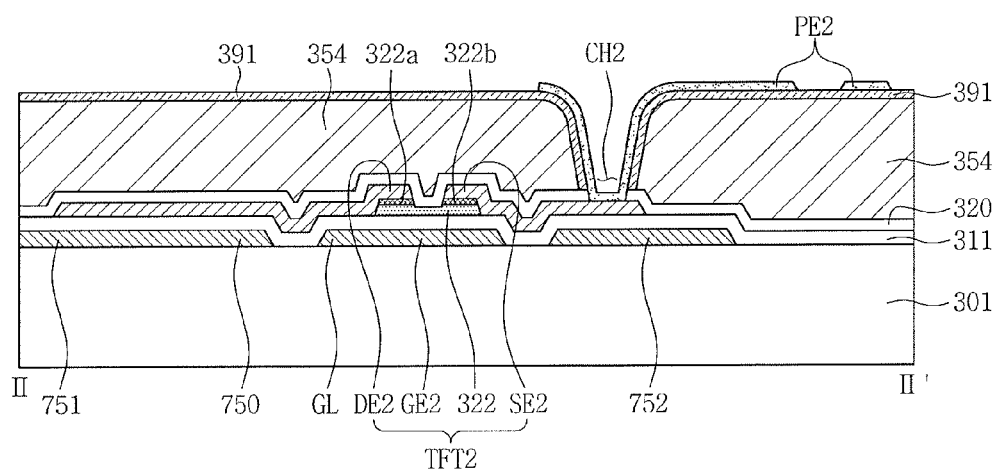

Subsequently, the transparent metal layer may be patterned through the photolithography process and the etching process, such that the first sub-pixel electrode PE1, connected to the first source electrode SE1 through the first contact hole CH1, may be formed in the first sub-pixel area P1, and the second sub-pixel electrode PE2, connected to the second source electrode SE2 through the second contact hole CH2, may be formed in the second sub-pixel area P2, as illustrated in FIGS. 15A and 15B.

Figure 16A:
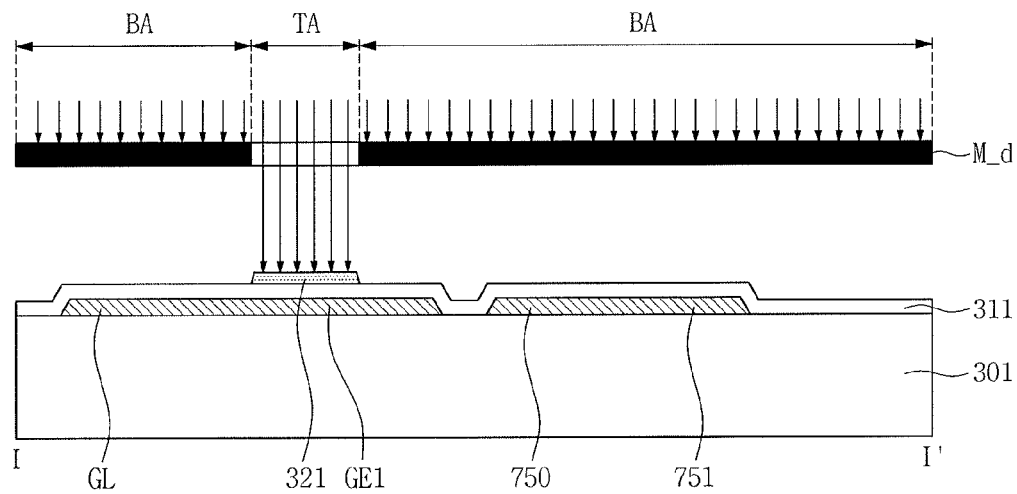
FIGS. 16A, 16B, 17A, and 17B illustrate cross-sectional views of stages in an alternative exemplary embodiment of a process of manufacturing the LCD device of FIGS. 3 and 4.
Figure 16B:
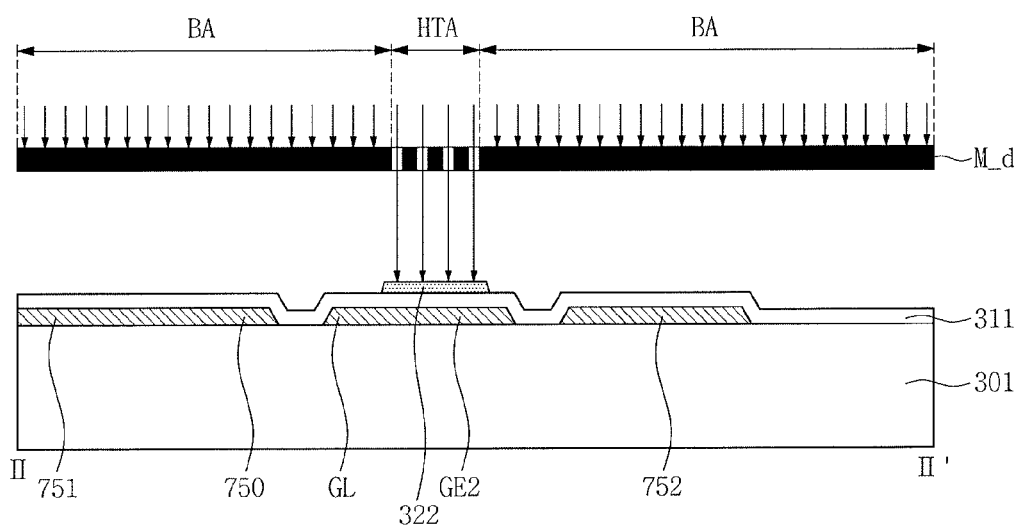
Figure 17A:
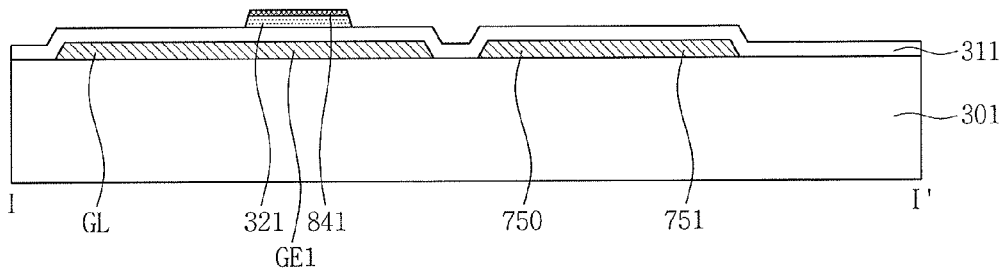
Figure 17B:
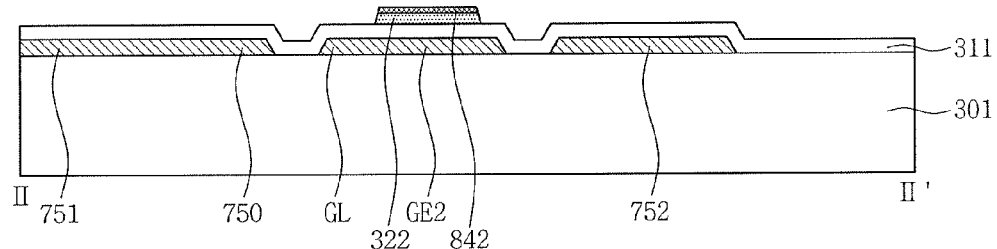

FIGS. 16A, 16B, 17A, and 17B illustrate cross-sectional views of stages in an alternative exemplary embodiment of a process of manufacturing the LCD device of FIGS. 3 and 4. Herein, FIGS. 16A and 17A are cross-sectional views with respect to FIG. 3, and FIGS. 16B and 17B are cross-sectional views with respect to FIG. 4.

First, as was illustrated in FIGS. 6A, 6B, 7A, and 7B, a gate line GL, a first gate electrode GE1, a storage line 750, a first storage electrode 751, a second gate electrode GE2, a second storage electrode 752, and a gate insulating layer 311 may be formed over a first substrate 301.

Subsequently, a semiconductor material may be deposited over an entire surface of the first substrate 301 including the gate insulating layer 311.

Subsequently, the semiconductor material may be patterned through a photolithography process and an etching process, such that a first semiconductor layer 321 (overlapping the first gate electrode GE1) and a second semiconductor layer 322 (overlapping the second gate electrode GE2) may be formed over the gate insulating layer 311, as illustrated in FIGS. 16A and 16B.

Subsequently, as illustrated in FIGS. 16A and 16B, a doping mask M_d may be disposed over the first substrate 301. The doping mask M_d may be the same as the doping mask M_d described hereinabove with respect to FIGS. 8A and 8B, and thus descriptions pertaining thereto will make reference to the doping mask M_d described hereinabove with respect to FIGS. 8A and 8B.

As illustrated in FIG. 16A, a transmissive area TA corresponds to the first semiconductor layer 321, and as illustrated in FIG. 16B, a half-transmissive area HTA corresponds to the second semiconductor layer 322.

Subsequently, n-type impurity ions, such as phosphorus or hydrogen phosphide ($PH_3$), may be selectively injected to the first semiconductor layer 321 and the second semiconductor layer 322 through the doping mask M_d at low concentration. In such an exemplary embodiment, a greater amount of impurity ions may be transmitted through the transmissive area TA than an amount of impurity ions transmitted through the half-transmissive area HTA, and thus a greater amount of impurity ions may be injected to the first semiconductor layer 321 in the transmissive area TA than an amount of impurity ions transmitted through the second semiconductor layer 322 in the half-transmissive area HTA. Accordingly, the first semiconductor layer 321 may have a higher impurity ion concentration than a concentration of impurity ions of the second semiconductor layer 322.

In an implementation, the transmissive area TA of the doping mask M_d may have an area corresponding to a channel area CA1 (hereinafter, "first channel area") of a first switching element TFT1, and the half-transmissive area HTA may have an area corresponding to a channel area CA2 (hereinafter, "second channel area") of a second switching element TFT2. In such an exemplary embodiment, impurity ions may only be selectively injected to a portion of the first semiconductor layer 321 corresponding to the first channel area CA1 and a portion of the second semiconductor layer 322 corresponding to the second channel area CA2.

Subsequently, an impurity semiconductor material may be deposited over the entire surface of the first substrate 301 including the first semiconductor layer 321, the second semiconductor layer 322, and the gate insulating layer 311.

Subsequently, the impurity semiconductor material may be patterned through a photolithography process and an etching process, such that the first impurity semiconductor pattern 841 is formed over the first semiconductor layer 321, and the second impurity semiconductor pattern 842 is formed over the second semiconductor layer 322, as illustrated in FIGS. 17A and 17B.

As such, the processes described hereinabove with reference to FIGS. 8A and 8B may be replaced by the processes described hereinabove with reference to FIGS. 16A, 16B, 17A, and 17B.

Subsequently, as was illustrated in FIGS. 9A, 9B, 10A, 10B, 11A, 11B, 12A, 12B, 13A, 13B, 14A, 14B, 15A, and 15B, a first drain electrode DE1, a first source electrode SE1, a second drain electrode DE1, a second source electrode SE2, a first ohmic contact layer 321a, a second ohmic contact layer 321b, a third ohmic contact layer 322a, a fourth ohmic contact layer 322b, a passivation layer 320, a color filter 354, a capping layer 391, a first contact hole CH1, a second contact hole CH2, a first sub-pixel electrode PE1 and a second sub-pixel electrode PE2 may be formed.

In an implementation, in the process of injecting impurity ions as illustrated in FIGS. 8A, 8B, 16A, and 16B, impurity ions may not be injected to the second semiconductor layer 322. To this end, the half-transmissive area HTA of the doping mask M_d may be substituted with a blocking area BA. In such an exemplary embodiment, the impurity ions may only be injected to the first semiconductor layer 321, and thus the first semiconductor layer 321 may have a higher impurity ion concentration than a concentration of impurity ions of the second semiconductor layer 322.

Figure 18:
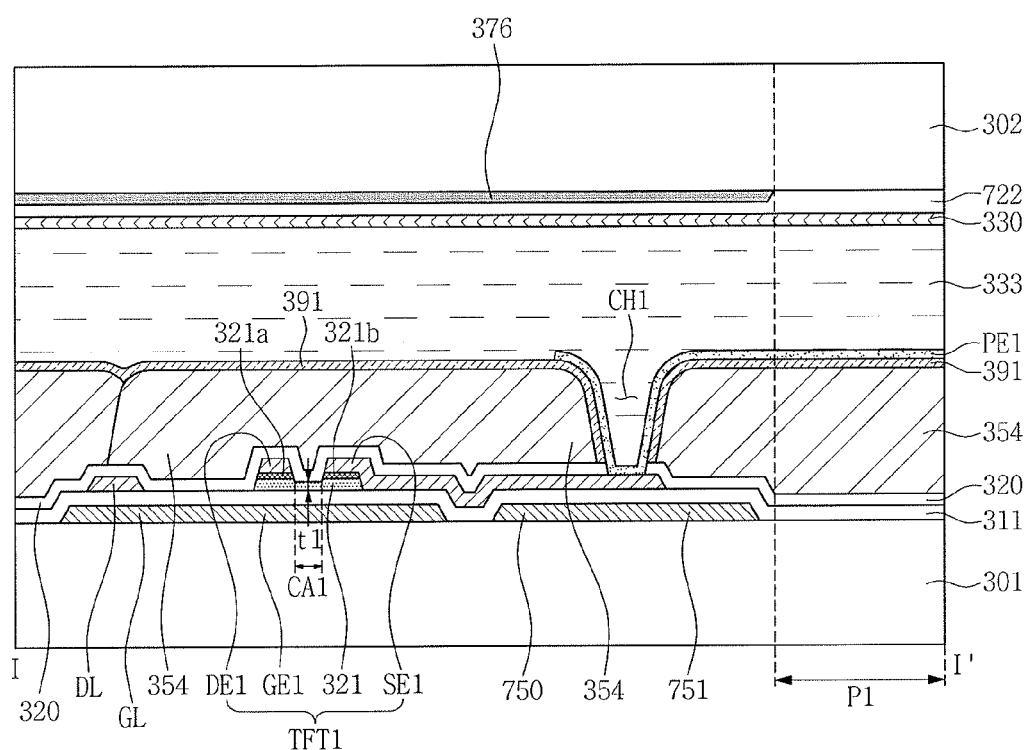
FIG. 18 illustrates a cross-sectional view of an alternative exemplary embodiment taken along line I-I' of FIG. 2.
Figure 19:
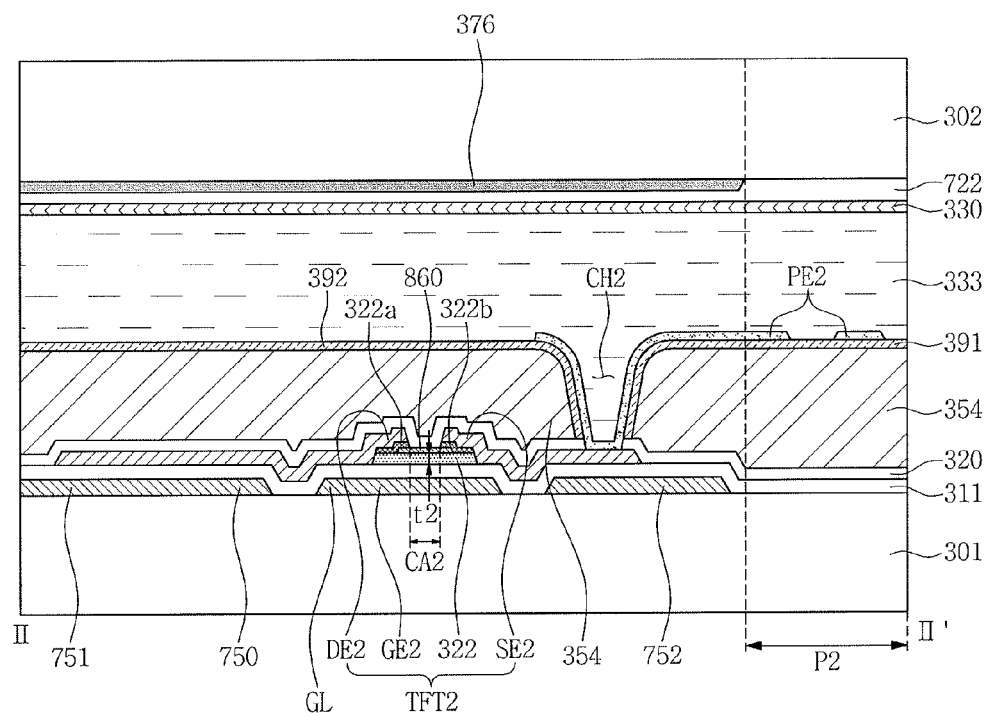
FIG. 19 illustrates a cross-sectional view of an alternative exemplary embodiment taken along line II-II' of FIG. 2.

FIG. 18 is a cross-sectional view taken along line I-I' of FIG. 2, and FIG. 19 is a cross-sectional view taken along line II-II' of FIG. 2.

As illustrated in FIGS. 2, 18, and 19, the LCD device may include the first substrate 301, a gate line GL, a first gate electrode GE1, a second gate electrode GE2, a first storage electrode 751, a storage line 750, a second storage electrode 752, a gate insulating layer 311, a first semiconductor layer 321, a second semiconductor layer 322, a first ohmic contact layer 321a, a second ohmic contact layer 321b, a third ohmic contact layer 322a, a fourth ohmic contact layer 322b, a data line DL, a first drain electrode DE1, a first source electrode SE1, a second drain electrode DE2, a second source electrode SE2, an etching-inhibiting layer 860, a passivation layer 320, a capping layer 391, a color filter 354, a first sub-pixel electrode PE1, a second sub-pixel electrode PE2, a second substrate 302, a light blocking layer 376, an overcoat layer 722, a common electrode 330, and a liquid crystal layer 333.

The first substrate 301, the gate line GL, the first gate electrode GE1, the second gate electrode GE2, the first storage electrode 751, the storage line 750, the second storage electrode 752, the gate insulating layer 311, the first semiconductor layer 321, the second semiconductor layer 322, the first ohmic contact layer 321a, the second ohmic contact layer 321b, the third ohmic contact layer 322a, the fourth ohmic contact layer 322b, the data line DL, the first drain electrode DE1, the first source electrode SE1, the second drain electrode DE2, the second source electrode SE2, the passivation layer 320, the capping layer 391, the color filter 354, the first sub-pixel electrode PE1, the second sub-pixel electrode PE2, the second substrate 302, the light blocking layer 376, the overcoat layer 722, the common electrode 330, and the liquid crystal layer 333 illustrated in FIGS. 18 and 19 are the same as corresponding elements illustrated hereinabove with reference to FIGS. 3 and 4, and thus descriptions pertaining thereto will make reference to descriptions provided with reference to FIGS. 2 and 3.

The first semiconductor layer 321 of a first switching element TFT1 illustrated in FIG. 18 may have a thickness that is less than a thickness of the second semiconductor layer 322 of a second switching element TFT2. In an implementation, a thickness t1 of a channel area CA1 (hereinafter, "first channel area") of the first semiconductor layer 321 of the first switching element TFT1 may be less than a thickness t2 of a channel area CA2 (hereinafter, "second channel area") of the second semiconductor layer 322 of the second switching element TFT2. For example, the thickness t1 of the first channel area CA1 may be 1/y times the thickness t2 of the second channel area CA2. Herein, "y" is a rational number greater than or equal to 3. For example, the thickness t1 of the first channel area CA1 may be ⅓ or less of the thickness t2 of the second channel area CA2. Due to a thickness difference between the first and second semiconductor layers 321 and 322, the first switching element TFT1 may have a threshold voltage that is less than that of the second switching element TFT2. Accordingly, the first switching element TFT1 may have a higher current driving capability than that of the second switching element TFT2.

The second semiconductor layer 322 may have a thickness that is different from that of the first semiconductor layer 321 due to the etching-inhibiting layer 860 of FIG. 19.

The etching-inhibiting layer 860, as illustrated in FIG. 19, may be disposed over the second semiconductor layer 322. For example, the etching-inhibiting layer 860 may be disposed over a portion of the second semiconductor layer 322 corresponding to the channel area CA2 of the second switching element TFT2.

The third ohmic contact layer 322a and the fourth ohmic contact layer 322b of FIG. 19 may be disposed over the second semiconductor layer 322 and the etching-inhibiting layer 860.

FIGS. 20A, 20B, 21A, 21B, 22A, 22B, 23A, 23B, 24A, 24B, and 25 illustrate cross-sectional views of stages in an exemplary embodiment of a process of manufacturing the LCD device of FIGS. 18 and 19. Herein, FIGS. 20A, 21A, 22A, 23A, 24A, and 25 are cross-sectional views with respect to FIG. 18, and FIGS. 20B, 21B, 22B, 23B, and 24B are cross-sectional views with respect to FIG. 19.

First, as was illustrated in FIGS. 6A and 7B, the gate line GL, the first gate electrode GE1, the storage line 750, the first storage electrode 751, the second gate electrode GE2, the second storage electrode 752, and the gate insulating layer 311 may be formed over the first substrate 301.

Figure 20A:
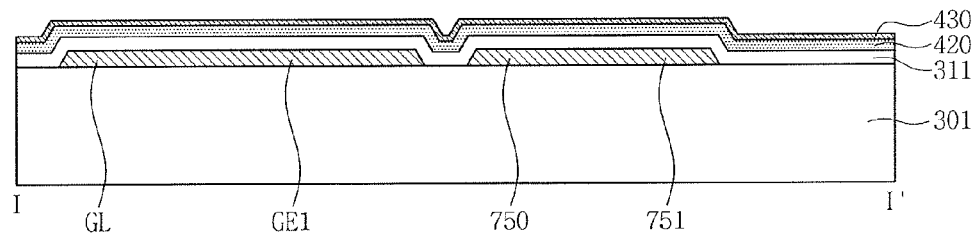
FIGS. 20A, 20B, 21A, 21B, 22A, 22B, 23A, 23B, 24A, 24B, and 25 illustrate cross-sectional views of stages in an exemplary embodiment of a process of manufacturing the LCD device of FIGS. 18 and 19.
Figure 20B:
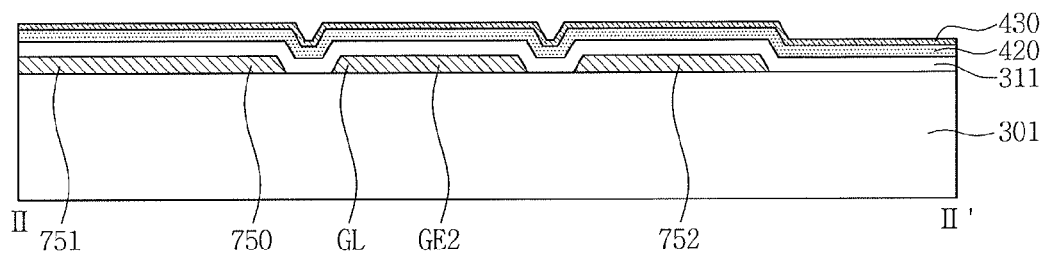

Subsequently, as illustrated in FIGS. 20A and 20B, a semiconductor material 420 and an etching-inhibiting material 430 may be sequentially deposited over an entire surface of the first substrate 301 including the gate insulating layer 311.

The etching-inhibiting material 430 may include or be formed of, e.g., silicon nitride ($SiN_x$) or silicon oxide ($SiO_x$).

Figure 21A:
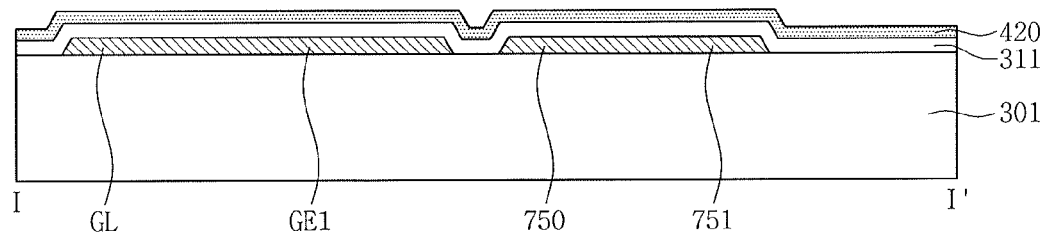
Figure 21B:
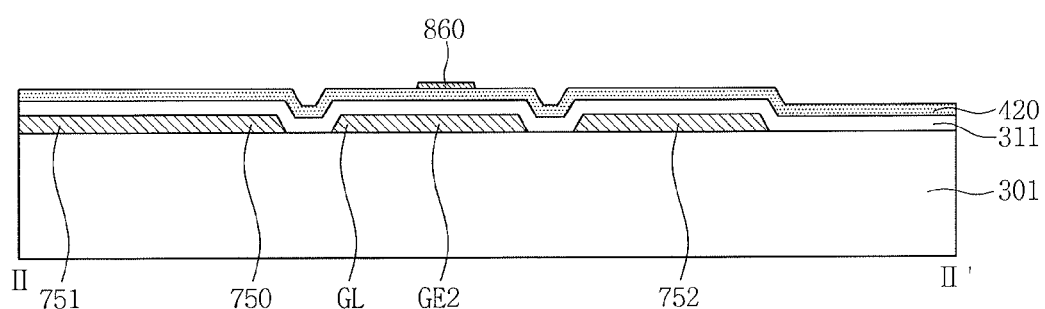

Subsequently, the etching-inhibiting material 430 may be patterned through a photolithography process and an etching process, such that the etching-inhibiting layer 860 is formed over the semiconductor material 420, as illustrated in FIGS. 21A and 21B.

Figure 22A:
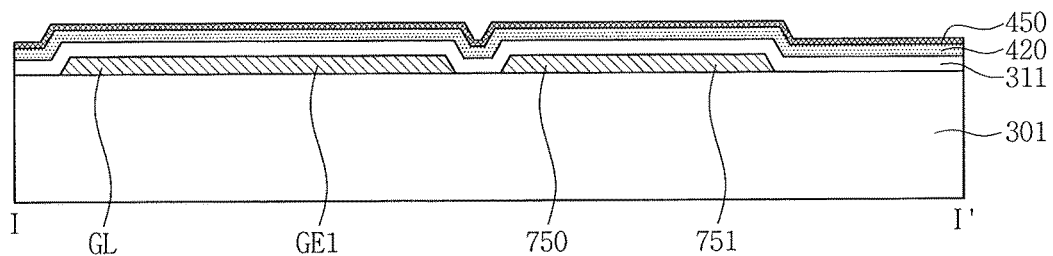
Figure 22B:
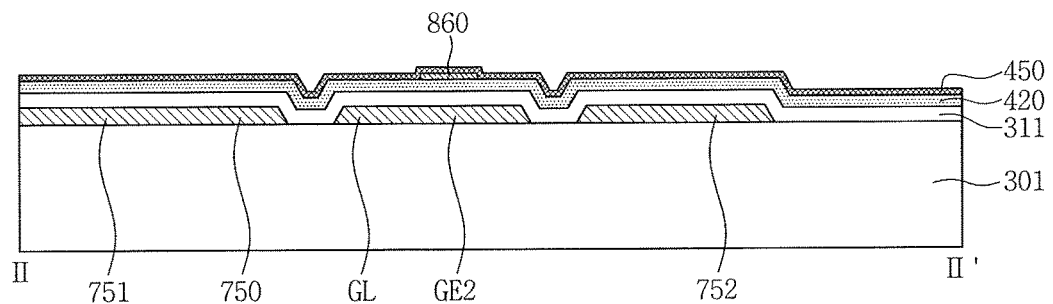

Subsequently, as illustrated in FIGS. 22A and 22B, an impurity semiconductor material 450 is deposited over the entire surface of the first substrate 301 including the etching-inhibiting layer 860 and the semiconductor material 420.

Figure 23A:
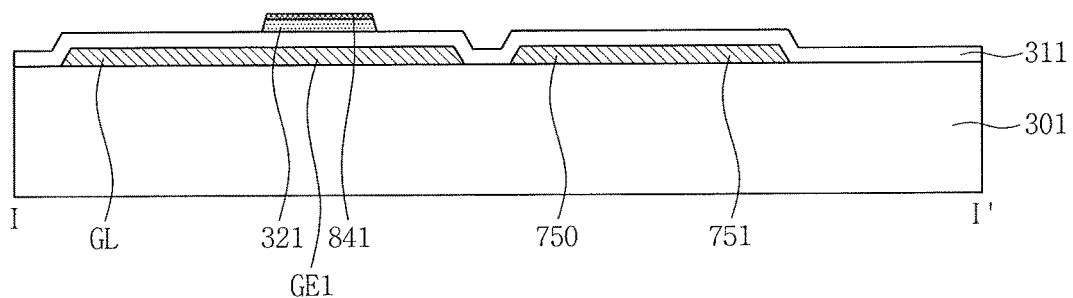
Figure 23B:
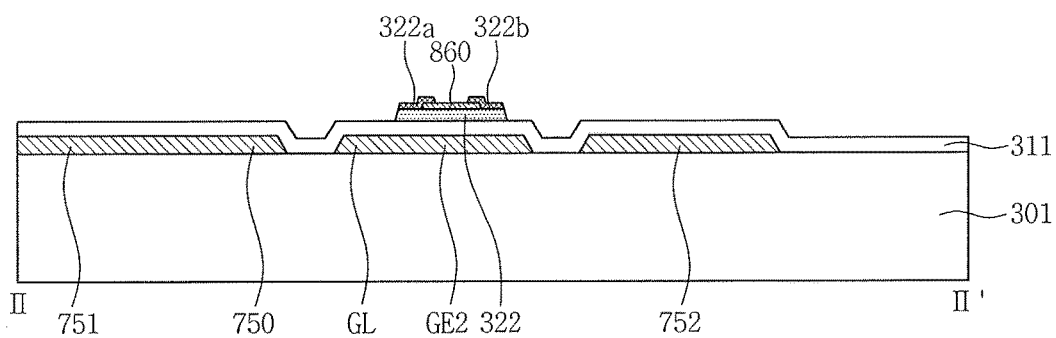

Subsequently, the impurity semiconductor material 450 and the semiconductor material 420 may be patterned through a photolithography process and an etching process, such that the first semiconductor layer 321 overlapping the first gate electrode GE1 and the second semiconductor layer 322 overlapping the second gate electrode GE2 are formed over the gate insulating layer 311, the first impurity semiconductor pattern 841 is formed over the first semiconductor layer 321, the third ohmic contact layer 322a and the fourth ohmic contact layer 322b are formed over the second semiconductor layer 322, as illustrated in FIGS. 23A and 23B. In such an exemplary embodiment, edge portions of the third ohmic contact layer 322a and the fourth ohmic contact layer 322b are disposed over an edge portion of the etching-inhibiting layer 860.

Subsequently, a source metal layer may be deposited over the entire surface of the first substrate 301 including the first semiconductor layer 321, the second semiconductor layer 322, the first impurity semiconductor pattern 841, the third ohmic contact layer 322a, the fourth ohmic contact layer 322b, the etching-inhibiting layer 860, and the gate insulating layer 311.

Figure 24A:
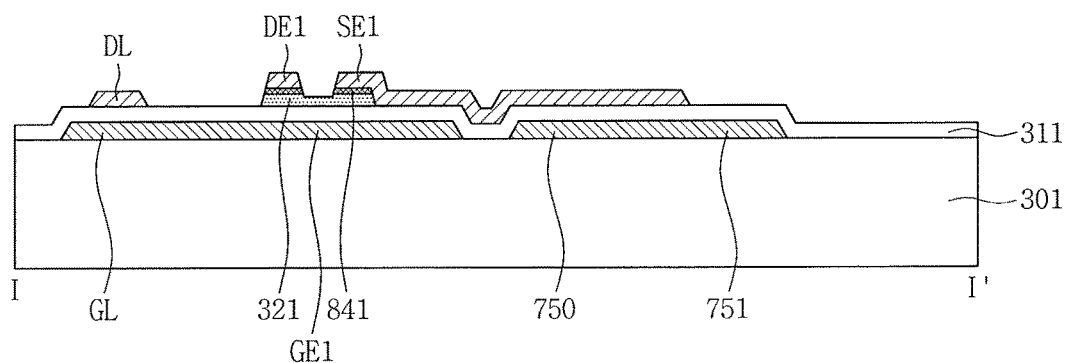
Figure 24B:
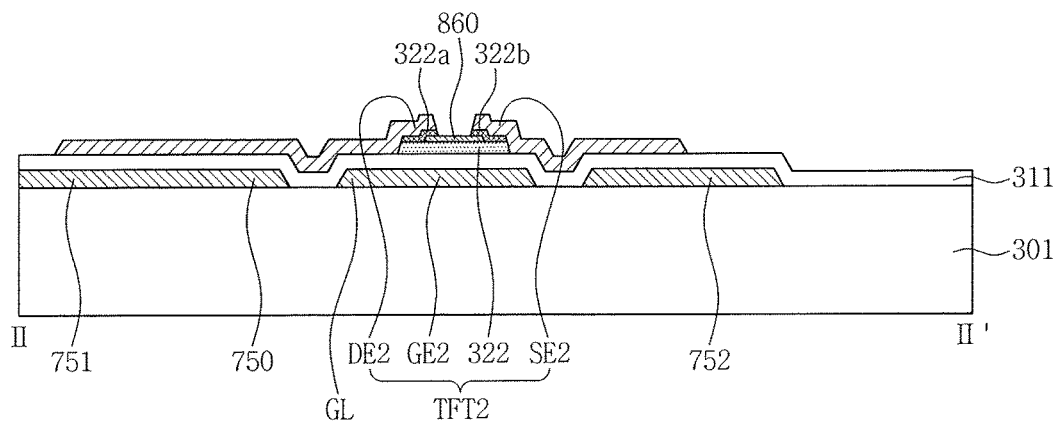

Subsequently, the source metal layer may be patterned through a photolithography process and an etching process, such that the data line DL intersecting the gate line GL is formed over the gate insulating layer 311, the first drain electrode DE1 and the first source electrode SE1 overlapping opposite ends of the first semiconductor layer 321 are formed over the first impurity semiconductor pattern 841, the second drain electrode DE2 overlapping the second semiconductor layer 322 is formed over the third ohmic contact layer 322a, and the second source electrode SE2 overlapping the second semiconductor layer 322 is formed over the fourth ohmic contact layer 322b, as illustrated in FIGS. 24A and 24B.

Figure 25:
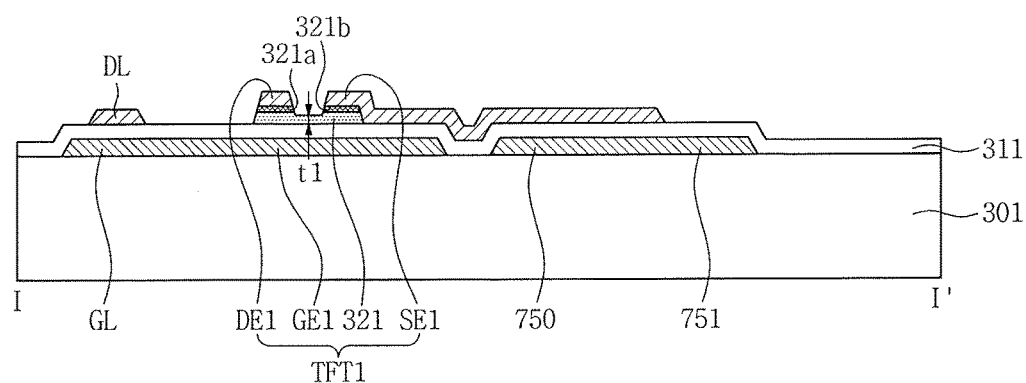

Subsequently, in a state where the first drain electrode DE1, the first source electrode SE1, the second drain electrode DE2, the second source electrode SE2, and the etching-inhibiting layer 860 are used as a mask, the first impurity semiconductor pattern 841 may be patterned through an etching process, such that the first ohmic contact layer 321a and the second ohmic contact layer 321b are formed, as illustrated in FIG. 25. The first ohmic contact layer 321a is formed between the first drain electrode DE1 and the first semiconductor layer 321, and the second ohmic contact layer 321b is formed between the first source electrode SE1 and the first semiconductor layer 321.

In an implementation, in the etching process performed on the aforementioned first impurity semiconductor pattern 841, a portion of the first semiconductor layer 321 below the first impurity semiconductor pattern 841 may be removed. On the other hand, the second semiconductor layer 322 is prevented from being etched by virtue of the etching-inhibiting layer 860, and thus the second semiconductor layer 322 is prevented from being damaged in the aforementioned etching process. Accordingly, the first semiconductor layer 321 corresponding to the channel area CA1 of the first switching element TFT1 has a thickness less than a thickness of the second semiconductor layer 322 corresponding to the channel area CA2 of the second switching element TFT2.

Subsequently, as illustrated in FIGS. 11A, 11B, 12A, 12B, 13A, 13B, 14A, 14B, 15A, and 15B, the passivation layer 320, the color filter 354, the capping layer 391, the first contact hole CH1, the second contact hole CH2, the first sub-pixel electrode PE1, and the second sub-pixel electrode PE2 are formed.

Figure 26:
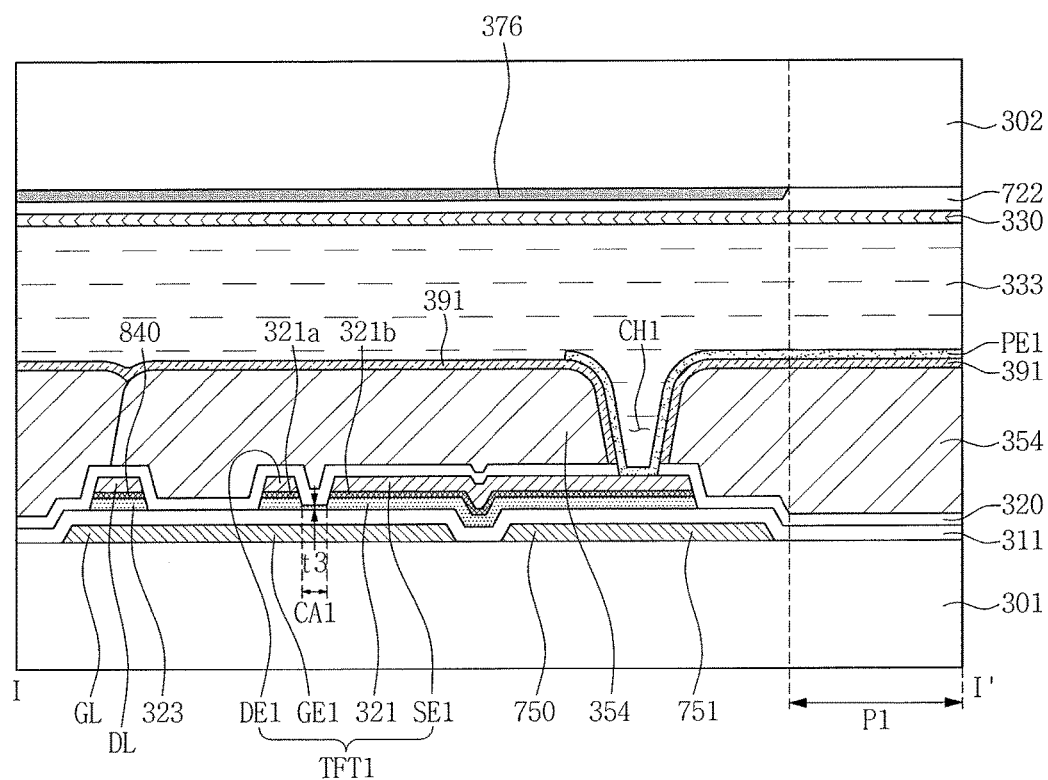
FIG. 26 illustrates a cross-sectional view of another alternative exemplary embodiment taken along line I-I' of FIG. 2.
Figure 27:
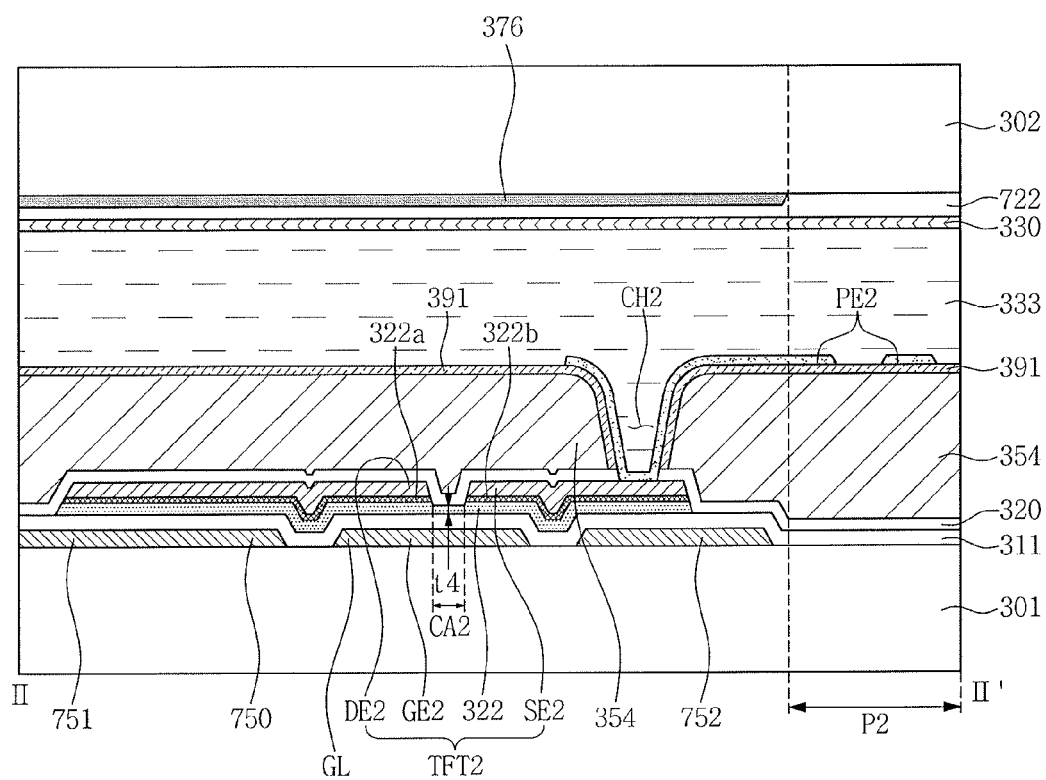
FIG. 27 illustrates a cross-sectional view of another alternative exemplary embodiment taken along line II-II' of FIG. 2.

FIG. 26 illustrates a cross-sectional view of another alternative exemplary embodiment taken along line I-I' of FIG. 2, and FIG. 27 illustrates a cross-sectional view of another alternative exemplary embodiment taken along line II-II' of FIG. 2.

As illustrated in FIGS. 2, 26, and 27, the LCD device includes a first substrate 301, a gate line GL, a first gate electrode GE1, a second gate electrode GE2, a first storage electrode 751, a storage line 750, a second storage electrode 752, a gate insulating layer 311, a first semiconductor layer 321, a second semiconductor layer 322, a third semiconductor layer 323, an ohmic contact layer 840, a first ohmic contact layer 321a, a second ohmic contact layer 321b, a third ohmic contact layer 322a, a fourth ohmic contact layer 322b, a data line DL, a first drain electrode DE1, a first source electrode SE1, a second drain electrode DE2, a second source electrode SE2, a passivation layer 320, a capping layer 391, a color filter 354, a first sub-pixel electrode PE1, a second sub-pixel electrode PE2, a second substrate 302, a light blocking layer 376, an overcoat layer 722, a common electrode 330, and a liquid crystal layer 333.

The first substrate 301, the gate line GL, the first gate electrode GE1, the second gate electrode GE2, the first storage electrode 751, the storage line 750, the second storage electrode 752, the gate insulating layer 311, the first semiconductor layer 321, the second semiconductor layer 322, the first ohmic contact layer 321a, the second ohmic contact layer 321b, the third ohmic contact layer 322a, the fourth ohmic contact layer 322b, the data line DL, the first drain electrode DE1, the first source electrode SE1, the second drain electrode DE2, the second source electrode SE2, the passivation layer 320, the capping layer 391, the color filter 354, the first sub-pixel electrode PE1, the second sub-pixel electrode PE2, the second substrate 302, the light blocking layer 376, the overcoat layer 722, the common electrode 330, and the liquid crystal layer 333 illustrated in FIGS. 26 and 27 are the same as elements described hereinabove with reference to FIGS. 3 and 4, and thus descriptions pertaining thereto will make reference to FIGS. 3 and 4 and the related descriptions. However, the first, second, and third semiconductor layers 321, 322, and 323 may or may not include impurity ions described hereinabove with reference to FIGS. 8A and 8B.

The first semiconductor layer 321 and the second semiconductor layer 322 illustrated in FIGS. 26 and 27 are connected to each other. In an implementation, the first semiconductor layer 321 and the second semiconductor layer 322 may be unitary.

The first semiconductor layer 321 and the third semiconductor layer 323 illustrated in FIG. 26 are connected to each other. Accordingly, the first, second, and third semiconductor layers 321, 322, and 323 are connected to each other. In such an exemplary embodiment, the first, second, and third semiconductor layers 321, 322, and 323 may be unitary.

The third semiconductor layer 323 illustrated in FIG. 26 may be disposed along the data line DL. The third semiconductor layer 323 and the data line DL may have substantially the same shape as each other.

The ohmic contact layer 840 and the first ohmic contact layer 321a of FIG. 26 are connected to each other. For example, the ohmic contact layer 840 and the first ohmic contact layer 321a are unitary.

The ohmic contact layer 840 of FIG. 26 is disposed between the third semiconductor layer 323 and the data line DL. The ohmic contact layer 840 and the data line DL may have substantially the same shape.

As illustrated in FIGS. 26 and 27, the first semiconductor layer 321 of the first switching element TFT1 has a thickness that is less than a thickness of the second semiconductor layer 322 of the second switching element TFT2. In an implementation, a thickness t3 of a channel area CA1 of the first switching element TFT1 may be less than a thickness t4 of a channel area CA2 of the second switching element TFT2. For example, the thickness t3 of the first channel area CA1 may be 1/y times the thickness t4 of the second channel area CA2. Herein, "y" is a rational number greater than or equal to 3. For example, the thickness t3 of the first channel area CA1 may be ⅓ or less of the thickness t4 of the second channel area CA2. Due to a thickness difference between the first semiconductor layer 321 and the second semiconductor layer 322, the first switching element TFT1 may have a threshold voltage less than that of the second switching element TFT2. Accordingly, the first switching element TFT1 may have a higher current driving capability than that of the second switching element TFT2.

FIGS. 28A, 28B, 29A, 29B, 30A, 30B, 31A, 31B, 32, 33, 34A, 34B, 35, 36A, 36B, 37A, and 37B illustrate cross-sectional views of an exemplary embodiment of a process of manufacturing the LCD device of FIGS. 26 and 27. Herein, FIGS. 28A, 29A, 30A, 31A, 32, 33, 34A, 36A, and 37A are cross-sectional views with respect to FIG. 26, and FIGS. 28B, 29B, 30B, 31B, 34B, 35, 36B, and 37B are cross-sectional views with respect to FIG. 27.

First, as was illustrated in FIGS. 6A, 6B, 7A, and 7B, the gate line GL, the first gate electrode GE1, the storage line 750, the first storage electrode 751, the second gate electrode GE2, the second storage electrode 752, and the gate insulating layer 311 are formed on the first substrate 301.

Figure 28A:
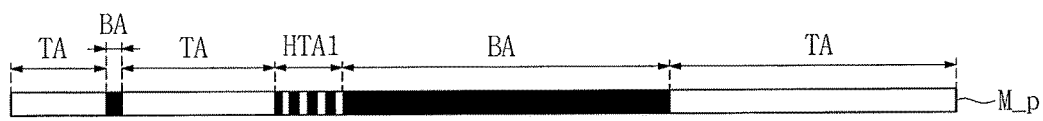
FIGS. 28A, 28B, 29A, 29B, 30A, 30B, 31A, 31B, 32, 33, 34A, 34B, 35, 36A, 36B, 37A, and 37B illustrate cross-sectional views of stages in an exemplary embodiment of a process of manufacturing the LCD device of FIGS. 26 and 27.
Figure 28A:
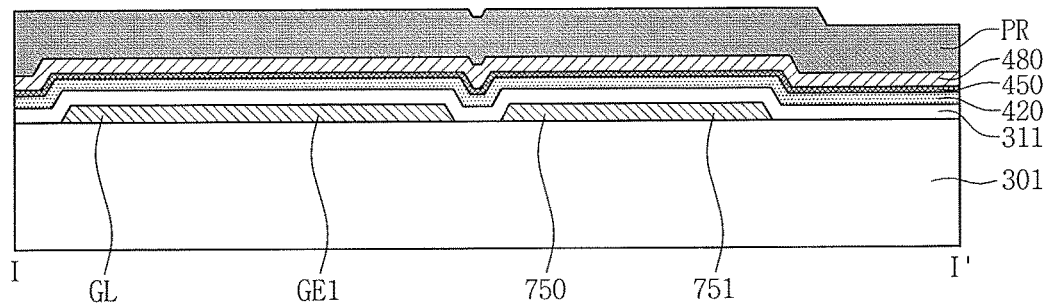
Figure 28B:
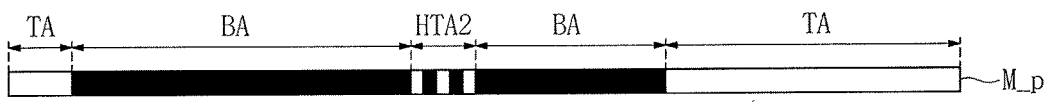
Figure 28B:
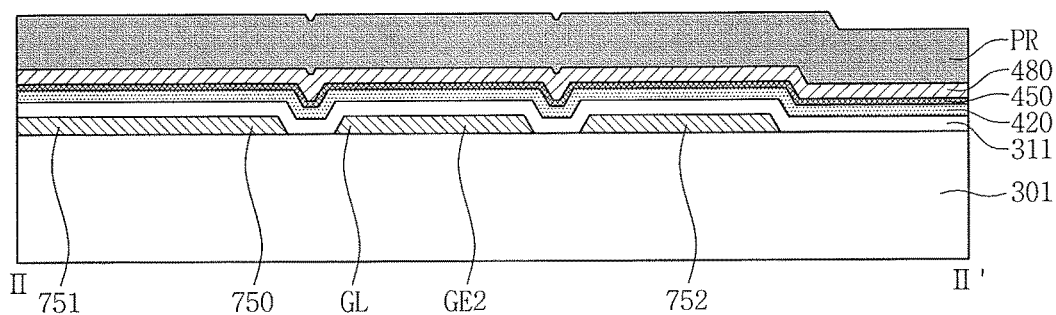

Subsequently, as illustrated in FIGS. 28A and 28B, a semiconductor material 420, an impurity semiconductor material 450, and a source metal layer 480 are sequentially deposited over an entire surface of the first substrate 301 including the gate insulating layer 311.

Subsequently, a photoresist PR is coated over the entire surface of the first substrate 301 including the semiconductor material 420, the impurity semiconductor material 450, and the source metal layer 480.

Subsequently, a pattern mask M_p is disposed over the photoresist PR. The pattern mask M_p has a transmissive area TA through which light is transmitted, a light blocking area BA through which light is prevented from being transmitted, and first and second half-transmissive areas HTA1 and HTA2 through which light is partially transmitted. The first and second half-transmissive areas HTA1 and HTA2 may include a plurality of slits or a plurality of semi-transparent layers. In such an exemplary embodiment, a transmittance of the first half-transmissive area HTA1 is higher than that of the second half-transmissive area HTA2. Accordingly, a greater amount of light may be transmitted through the first half-transmissive area HTA1 than an amount of light transmitted through the second half-transmissive area HTA2.

Figure 29A:
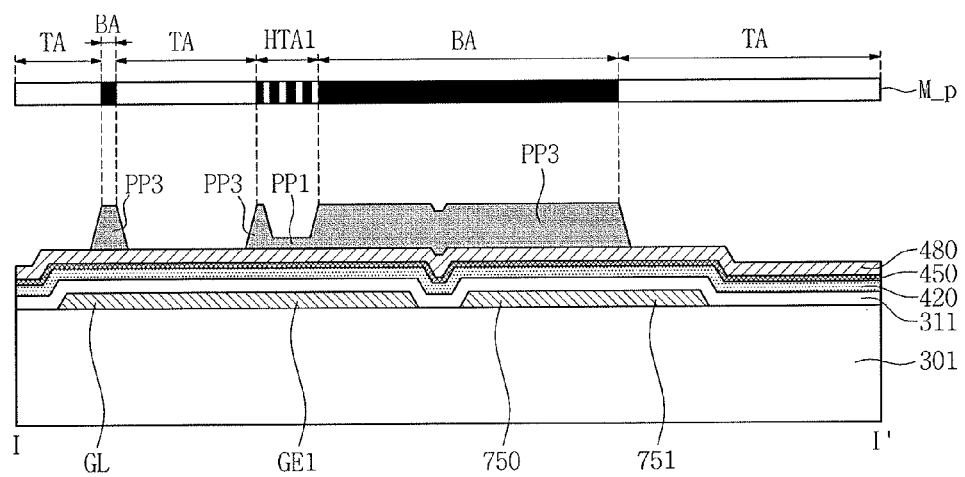
Figure 29B:
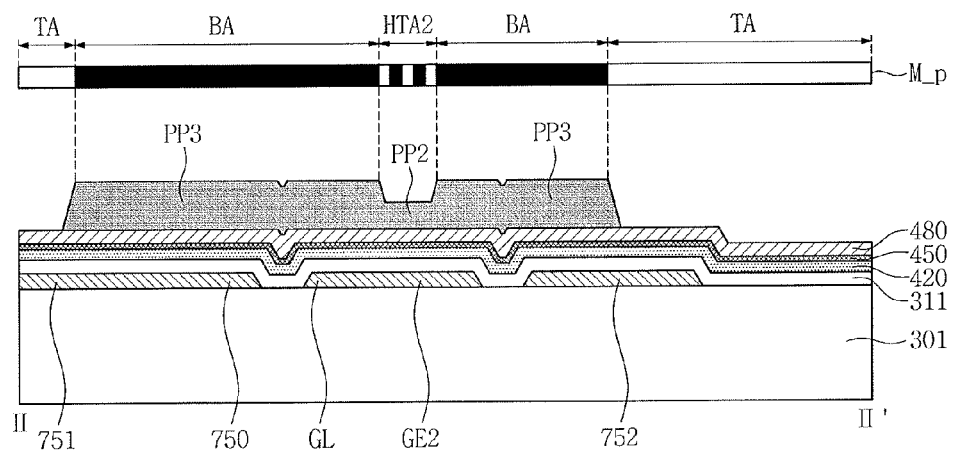

Subsequently, light, for example, ultraviolet (UV) light, is selectively irradiated onto the photoresist PR through the pattern mask M_p, such that the photoresist PR is exposed. In a case where the exposed photoresist PR is developed, a first photoresist pattern PP1, a second photoresist pattern PP2, and a third photoresist pattern PP3, each having different thicknesses from one another, are formed over the source metal layer 480, as illustrated in FIGS. 29A and 29B.

The first photoresist pattern PP1 is disposed over a portion of the source metal layer 480 corresponding to the first half-transmissive area HTA1 of the pattern mask M_p, the second photoresist pattern PP2 is disposed over a portion of the source metal layer 480 corresponding to the second half-transmissive area HTA2 of the pattern mask M_p, and the third photoresist pattern PP3 is disposed over a portion of the source metal layer 480 corresponding to the blocking area BA of the pattern mask M_p. In an exemplary embodiment, a portion of the photoresist PR corresponding to the transmissive area TA of the pattern mask M_p is removed.

The second photoresist pattern PP2 has a thickness less than that of the first photoresist pattern PP1, and the third photoresist pattern PP3 has a thickness greater than that of the second photoresist pattern PP2. That is, the first photoresist pattern PP1 has a smallest thickness, the third photoresist pattern PP3 has a greatest thickness, and the second photoresist pattern PP2 has a thickness greater than that of the first photoresist pattern PP1 and less than that of the third photoresist pattern PP3.

Figure 30A:
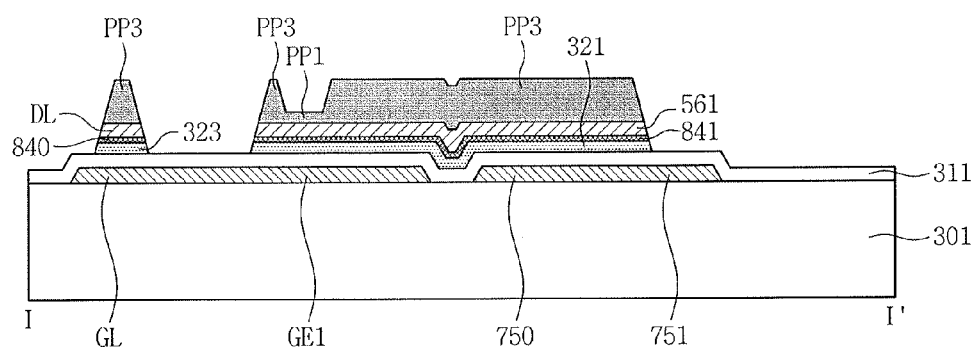
Figure 30B:
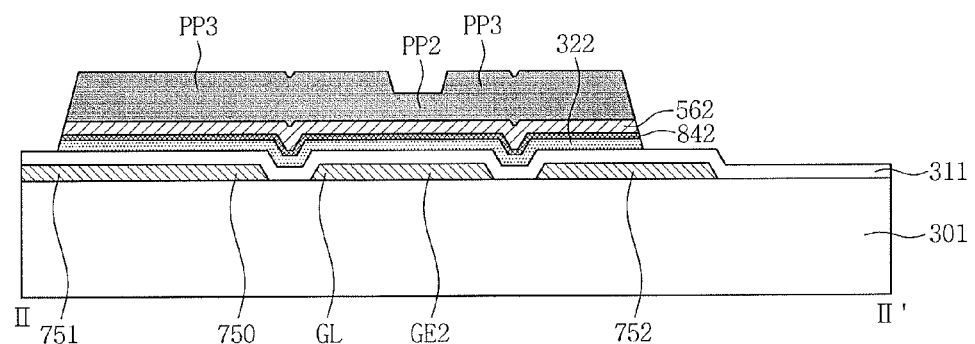

Subsequently, in a state where the first, second, and third photoresist patterns PP1, PP2, and PP3 are used as a mask, the source metal layer 480, the impurity semiconductor material 450, and the semiconductor material 420 are sequentially etched. In such an exemplary embodiment, as illustrated in FIGS. 30A and 30B, the first semiconductor layer 321 overlapping the first gate electrode GE1, the second semiconductor layer 322 overlapping the second gate electrode GE2, and the third semiconductor layer 323 intersecting the gate line GL are formed over the gate insulating layer 311, a first impurity semiconductor pattern 841 is formed over the first semiconductor layer 321, a second impurity semiconductor pattern 842 is formed over the second semiconductor layer 322, the ohmic contact layer 840 is formed over the third semiconductor layer 323, a first source-drain pattern 561 is formed over the first impurity semiconductor pattern 841, a second source-drain pattern 562 is formed over the second impurity semiconductor pattern 842, and the data line DL is formed over the ohmic contact layer 840.

Figure 31A:
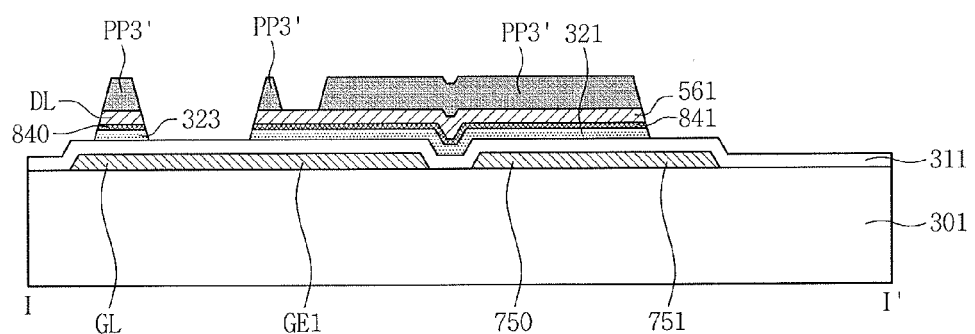
Figure 31B:
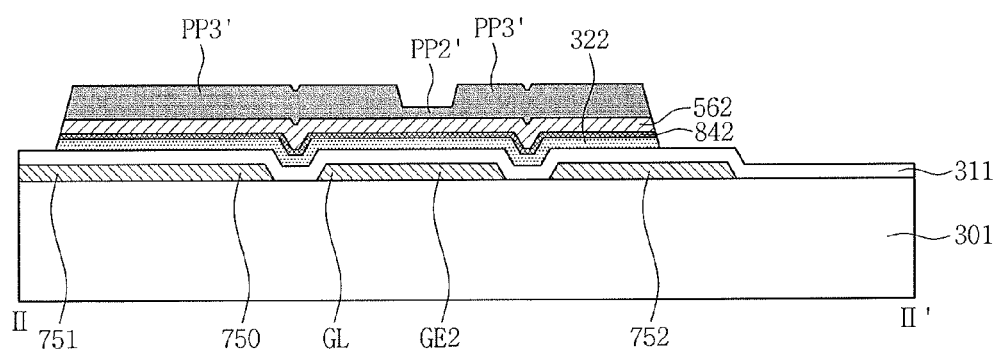

Subsequently, as illustrated in FIG. 31A, a first ashing process is performed. In the first ashing process, portions of the first, second, and third photoresist patterns PP1, PP2, and PP3 are removed by substantially the same extent. In such an exemplary embodiment, the first ashing process is performed until the first photoresist pattern PP1 having the smallest thickness is removed. That is, when the first photoresist pattern PP1 is removed, the first ashing process ends.

As the first photoresist pattern PP1 is removed, the first source-drain pattern 561 therebelow is exposed. In such an exemplary embodiment, a portion of the second photoresist pattern PP2 and a portion of the third photoresist pattern PP3 are removed through the first ashing process, and accordingly, the thickness of the second photoresist pattern PP2 and the thickness of the third photoresist pattern PP3 are reduced. Hereinafter, the ashed second photoresist pattern PP2 is defined as "first residual pattern PP2'," and the ashed third photoresist pattern PP3 is defined as "second residual pattern PP3'." The second residual pattern PP3' has a thickness greater than that of the first residual pattern PP2'.

Figure 32:
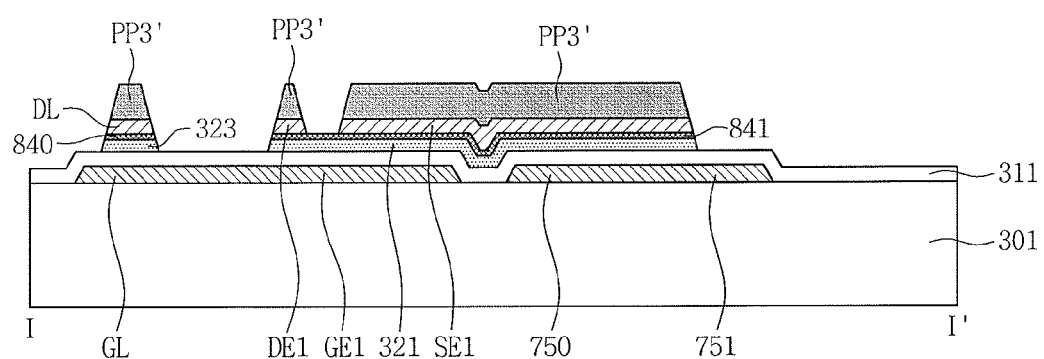

Subsequently, in a state where the first residual pattern PP2' and the second residual pattern PP3' are used as a mask, the first source-drain pattern 561 is pattern through an etching process, such that the first drain electrode DE1 and the first source electrode SE1 respectively overlapping opposite ends of the first semiconductor layer 321 are formed over the first impurity semiconductor pattern 841, as illustrated in FIG. 32.

Figure 33:
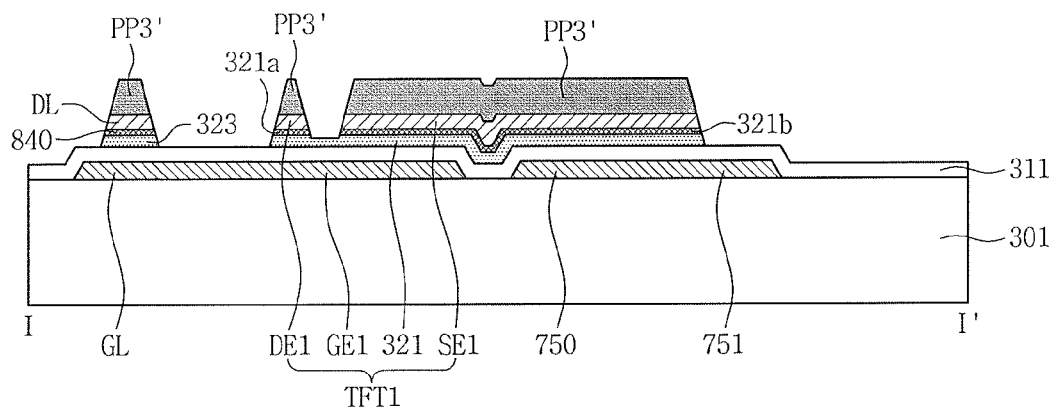

Subsequently, in a state where the first residual pattern PP2' and the second residual pattern PP3' are used as a mask, the first impurity semiconductor pattern 841 is patterned through an etching process, such that the first ohmic contact layer 321a and the second ohmic contact layer 321b are formed as illustrated in FIG. 33. The first ohmic contact layer 321a is disposed between the first drain electrode DE1 and the first semiconductor layer 321, and the second ohmic contact layer 321b is disposed between the first source electrode SE1 and the first semiconductor layer 321.

In an exemplary embodiment, in the etching process performed on the first impurity semiconductor pattern 841, a portion of the first semiconductor layer 321 below the first impurity semiconductor pattern 841 is removed. For example, a portion of the first semiconductor layer 321 corresponding to a channel area of the first switching element TFT1 is removed.

Figure 34A:
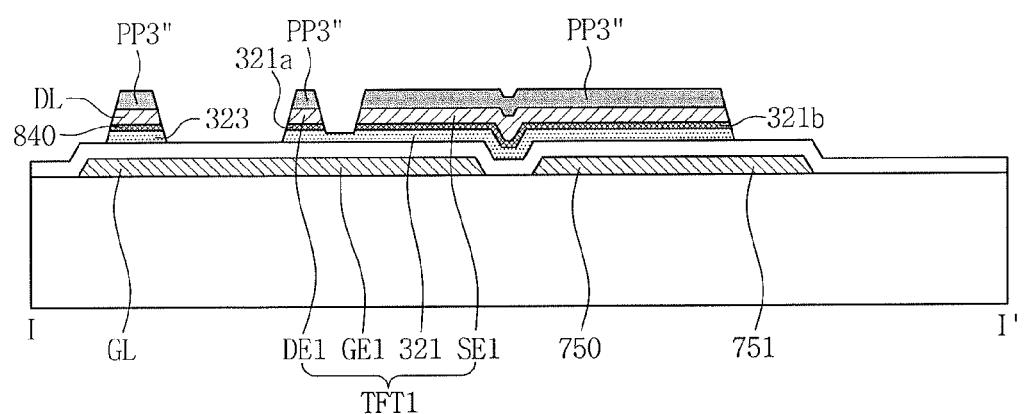
Figure 34B:
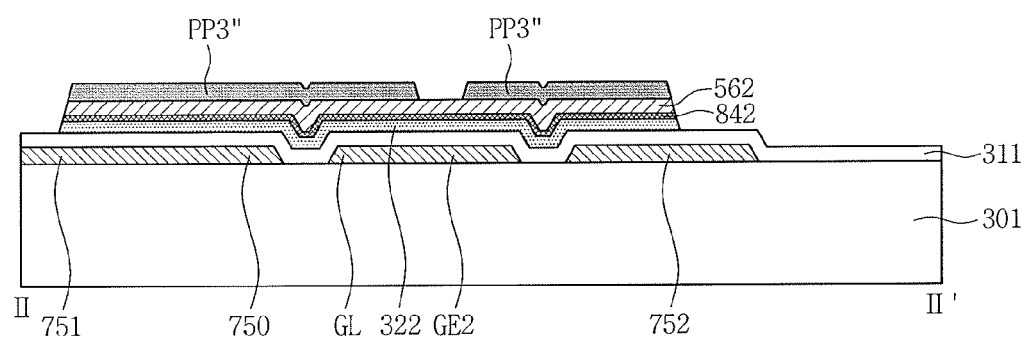

Subsequently, as illustrated in FIGS. 34A and 34B, a second ashing process is performed. In the second ashing process, the first and second residual patterns PP2' and PP3' are removed by substantially the same extent. In such an exemplary embodiment, the second ashing process is performed until the first residual pattern PP2' having the smallest thickness is removed. That is, when the first residual pattern PP2' is removed, the second ashing process ends.

As the first residual pattern PP2' is removed, the second source-drain pattern 562 therebelow is exposed. In an exemplary embodiment, a portion of the second residual pattern PP3' is removed through the second ashing process, and accordingly, a thickness of the second residual pattern PP3' is reduced. Hereinafter, the ashed second residual pattern PP3' is defined as "third residual pattern PP3"."

Figure 35:
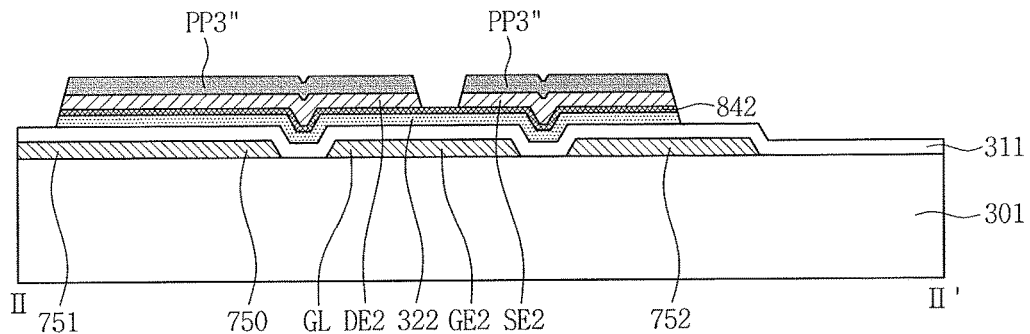

Subsequently, in a state where the third residual pattern PP3" is used as a mask, the second source-drain pattern 562 is patterned through an etching process, such that the second drain electrode DE2 and the second source electrode SE2 respectively overlapping opposite ends of the second semiconductor layer 322 are formed over the second impurity semiconductor pattern 842, as illustrated in FIG. 35.

Figure 36A:
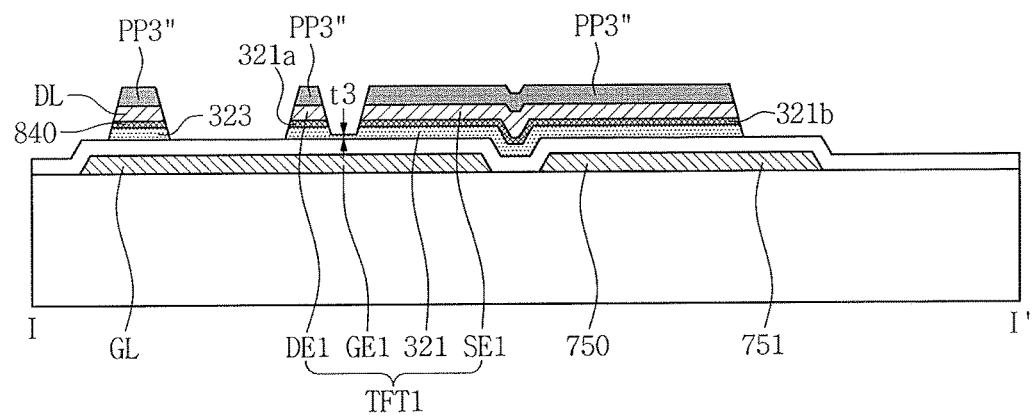
Figure 36B:
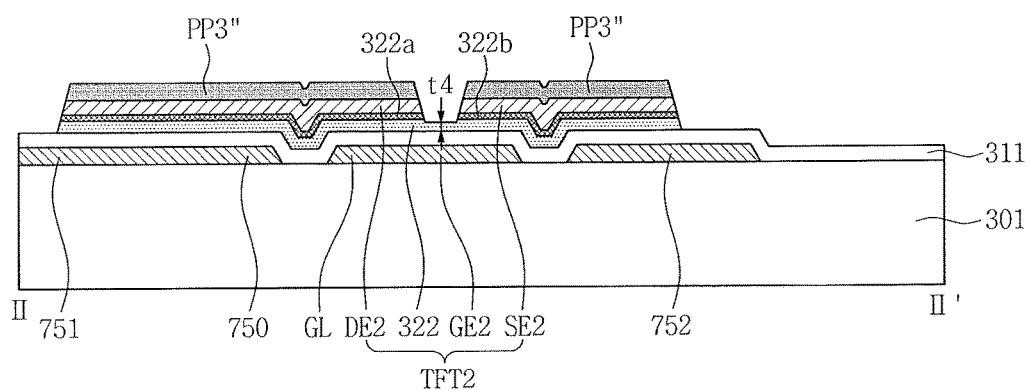

Subsequently, in a state where the third residual pattern PP3" is used as a mask, the second impurity semiconductor pattern 842 is patterned through an etching process, such that the third ohmic contact layer 322a and the fourth ohmic contact layer 322b are formed as illustrated in FIG. 36B. The third ohmic contact layer 322a is formed between the second drain electrode DE2 and the second semiconductor layer 322, and the fourth ohmic contact layer 322b is formed between the second source electrode SE2 and the second semiconductor layer 322.

In the aforementioned etching process performed on the second impurity semiconductor pattern 842, a portion of the second semiconductor layer 322 below the second impurity semiconductor pattern 842 is removed. In an exemplary embodiment, a portion of the second semiconductor layer 322 corresponding to the channel area of the second switching element TFT2 is removed. In such an exemplary embodiment, in the etching process performed on the second impurity semiconductor pattern 842, as illustrated in FIG. 36A, a portion of the first semiconductor layer 321 is further removed. For example, a portion of the first semiconductor layer 321 corresponding to the channel area of the first switching element TFT1 is further removed. Accordingly, the thickness t3 of the portion of the first semiconductor layer 321 corresponding to the channel area of the first switching element TFT1 is reduced to be less than the thickness t4 of the portion of the second semiconductor layer 322 corresponding to the channel area of the second switching element TFT2.

Figure 37A:
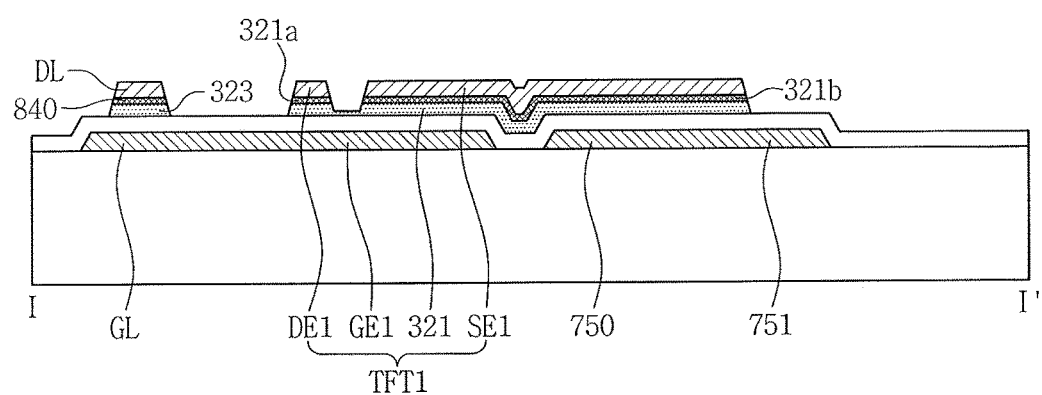
Figure 37B:
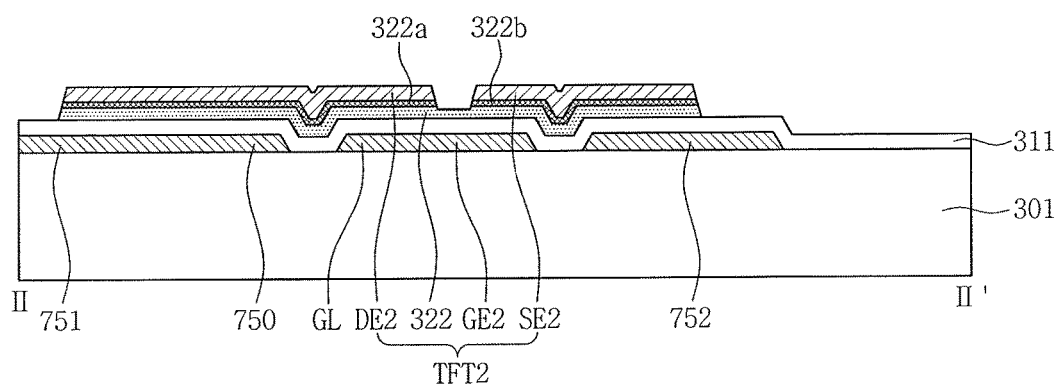

Subsequently, as illustrated in FIGS. 37A and 37B, the third residual pattern PP3" is removed. The third residual pattern PP3" may be removed by a strip solution. The strip solution may include ethylene carbonate.

Subsequently, as illustrated in FIGS. 11A, 11B, 12A, 12B, 13A, 13B, 14A, 14B, 15A, and 15B, the passivation layer 320, the color filter 354, the capping layer 391, the first contact hole CH1, the second contact hole CH2, the first sub-pixel electrode PE1, and the second sub-pixel electrode PE2 are formed.

Figure 38:
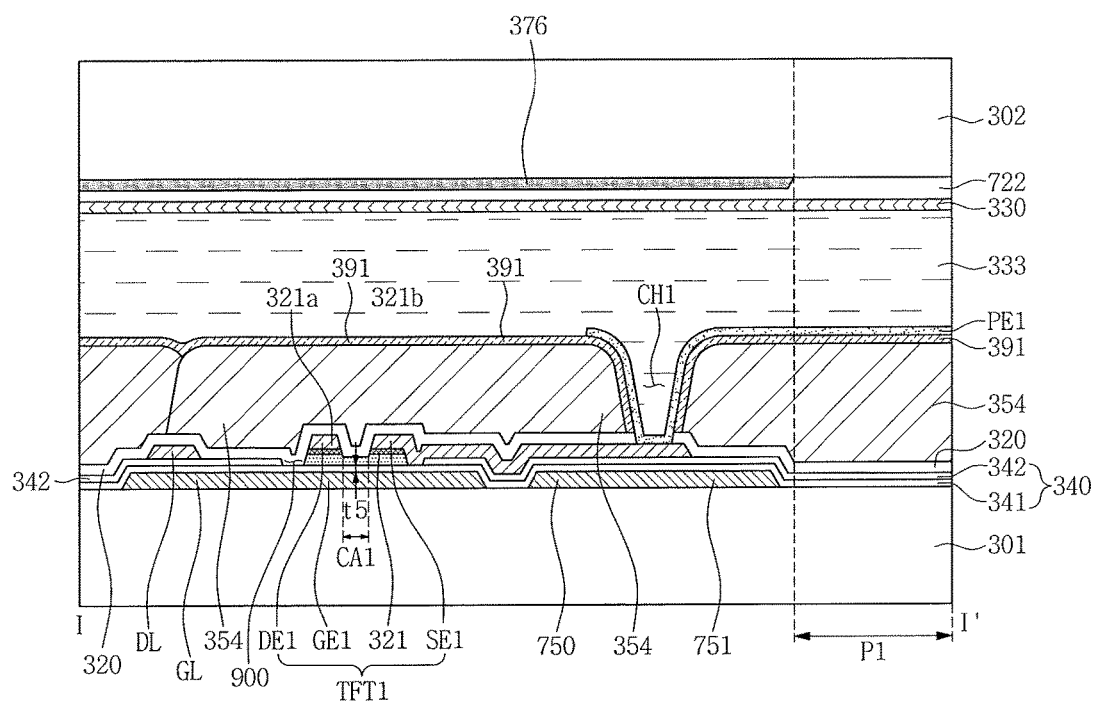
FIG. 38 illustrates a cross-sectional view of still another alternative exemplary embodiment taken along line I-I' of FIG. 2.
Figure 39:
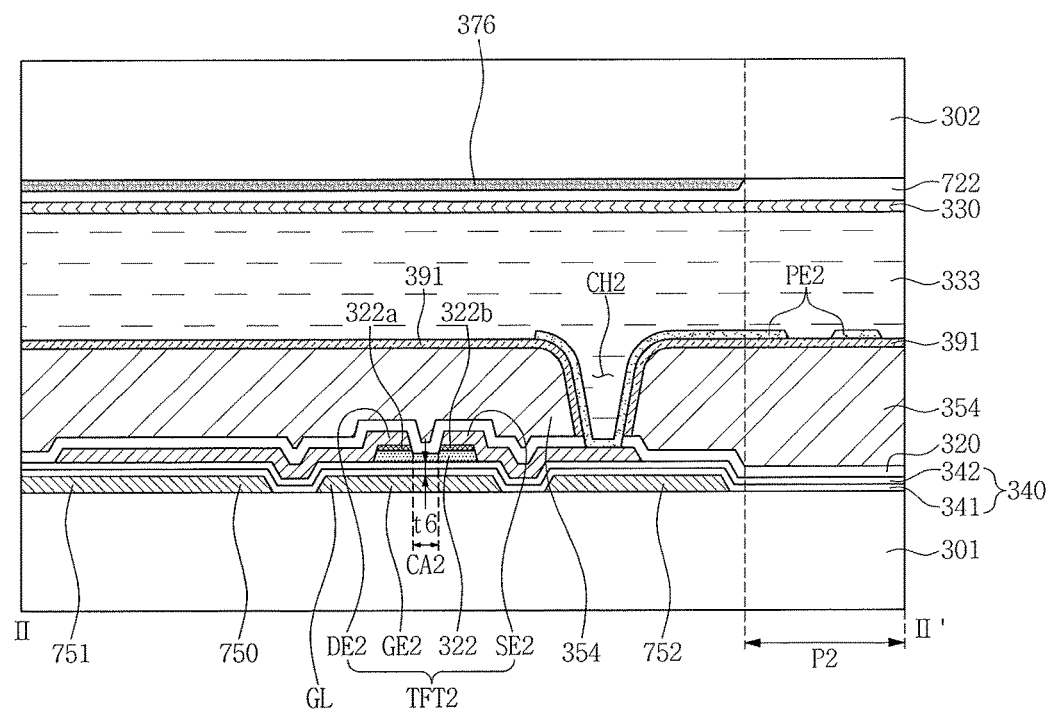
FIG. 39 illustrates a cross-sectional view of still another alternative exemplary embodiment taken along line II-II' of FIG. 2.

FIG. 38 illustrates a cross-sectional view of still another alternative exemplary embodiment taken along line I-I' of FIG. 2, and FIG. 39 illustrates a cross-sectional view of still another alternative exemplary embodiment taken along line II-II' of FIG. 2.

As illustrated in FIGS. 2, 38, and 39, the LCD device includes a first substrate 301, a gate line GL, a first gate electrode GE1, a second gate electrode GE2, a first storage electrode 751, a storage line 750, a second storage electrode 752, a gate insulating layer 340, a first semiconductor layer 321, a second semiconductor layer 322, a first ohmic contact layer 321a, a second ohmic contact layer 321b, a third ohmic contact layer 322a, a fourth ohmic contact layer 322b, a data line DL, a first drain electrode DE1, a first source electrode SE1, a second drain electrode DE2, a second source electrode SE2, a passivation layer 320, a capping layer 391, a color filter 354, a first sub-pixel electrode PE1, a second sub-pixel electrode PE2, a second substrate 302, a light blocking layer 376, an overcoat layer 722, a common electrode 330, and a liquid crystal layer 333.

The first substrate 301, the gate line GL, the first gate electrode GE1, the second gate electrode GE2, the first storage electrode 751, the storage line 750, the second storage electrode 752, the first semiconductor layer 321, the second semiconductor layer 322, the first ohmic contact layer 321a, the second ohmic contact layer 321b, the third ohmic contact layer 322a, the fourth ohmic contact layer 322b, the data line DL, the first drain electrode DE1, the first source electrode SE1, the second drain electrode DE2, the second source electrode SE2, the passivation layer 320, the capping layer 391, the color filter 354, the first sub-pixel electrode PE1, the second sub-pixel electrode PE2, the second substrate 302, the light blocking layer 376, the overcoat layer 722, the common electrode 330, and the liquid crystal layer 333 illustrated in FIGS. 38 and 39 are the same as the corresponding elements described hereinabove with reference to FIGS. 3 and 4, and thus descriptions pertaining thereto will make reference to FIGS. 3 and 4 and the related descriptions. However, the first and second semiconductor layers 321 and 322 illustrated in FIGS. 38 and 39 may or may not include impurity ions described hereinabove with reference to FIGS. 8A and 8B.

The gate insulating layer 340 overlapping the first semiconductor layer 321 of a first switching element TFT1 has a smaller thickness than a thickness of the gate insulating layer 340 overlapping the second semiconductor layer 322 of a second switching element TFT2. In an exemplary embodiment, a thickness t5 of a portion of the gate insulating layer 340 corresponding to a channel area of the first switching element TFT1 is less than a thickness t6 of a portion of the gate insluting layer 340 corresponding to a channel area of the second switching element TFT2 (t5<t6).

The gate insulating layer 340 may include a first insulating layer 341 and a second insulating layer 342.

The aforementioned thickness t5 may be defined as a thickness of the first insulating layer 341 between the first gate electrode GE1 and the first semiconductor layer 321 overlapping the first gate electrode GE1, and the aforementioned thickness t6 may be defined as an overall thickness of the two insulating layers, that is, the first insulating layer 341 and the second insulating layer 342, between the second gate electrode GE2 and the second semiconductor layer 322 overlapping the second gate electrode GE2. For example, the thickness t5 is 1/z times the thickness t6. As used herein, z is a rational number greater than or equal to 2.

The first insulating layer 341, as illustrated in FIGS. 38 and 39, is disposed over the gate line GL, the first gate electrode GE1, the second gate electrode GE2, the first storage electrode 751, the second storage electrode 752, and the storage line 750. In such an exemplary embodiment, the first insulating layer 341 is disposed over an entire surface of the first substrate 301 including the gate line GL, the first gate electrode GE1, the second gate electrode GE2, the first storage electrode 751, the second storage electrode 752, and the storage line 750. The first insulating layer 341 may include or be formed of silicon nitride ($SiN_x$) or silicon oxide ($SiO_x$). The first insulating layer 341 may have a multilayer structure including at least two insulating layers having different physical properties.

The second insulating layer 342 is disposed over the first insulating layer 341. The second insulating layer 342 has an aperture 900, and the aperture 900 corresponds to the channel area of the first switching element TFT1. The first semiconductor layer 321 corresponding to the channel area of the first switching element TFT1 contacts the first insulating layer 341 through the aperture 900. In such an exemplary embodiment, an entire portion of the first semiconductor layer 321 may be disposed within the aperture 900, and alternatively, a portion of the first semiconductor layer 321 corresponding to the channel area of the first switching element TFT1 may be disposed within the aperture 900.

The second insulating layer 342 includes or is formed of a material having an etching ratio different from an etching ratio of the first insulating layer 341. The second insulating layer 342 may include or be formed of the aforementioned or silicon nitride ($SiN_x$) or silicon oxide ($SiO_x$).

The second semiconductor layer 322 corresponding to the channel area of the second switching element TFT2 is disposed over the second insulating layer 342.

Due to the thickness difference of the gate insulating layer 340, the first switching element TFT1 may have a threshold voltage less than that of the second switching element TFT2. Accordingly, the first switching element TFT1 may have a higher current driving capability than that of the second switching element TFT2.

The first insulating layer 341 and the second insulating layer 342 may have different thicknesses from each other. In an exemplary embodiment, the first insulating layer 341 may have a thickness less than that of the second insulating layer 342. In an alternative exemplary embodiment, the second insulating layer 342 may have a thickness less than that of the first insulating layer 341.

Figure 40A:
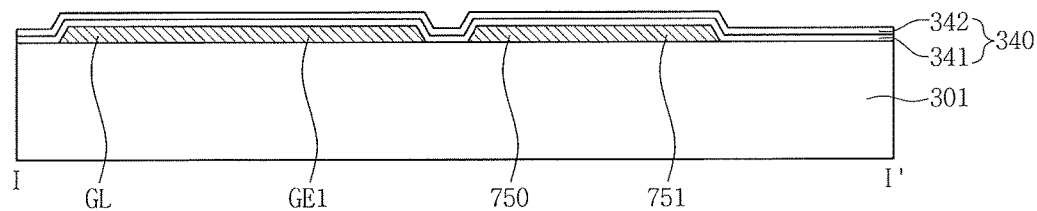
FIGS. 40A, 40B, 41A, 41B, 42A, and 42B illustrate cross-sectional views of stages in an exemplary embodiment of a process of manufacturing the LCD device of FIGS. 38 and 39.
Figure 40B:
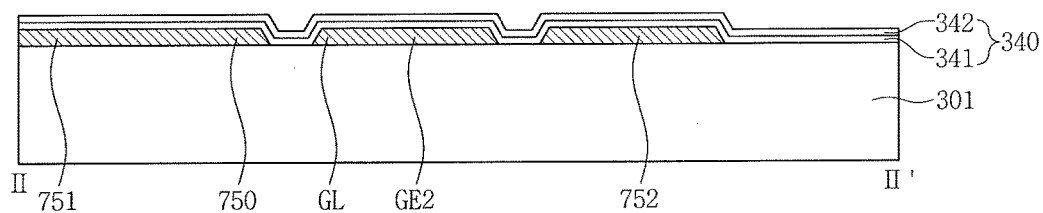
Figure 41A:
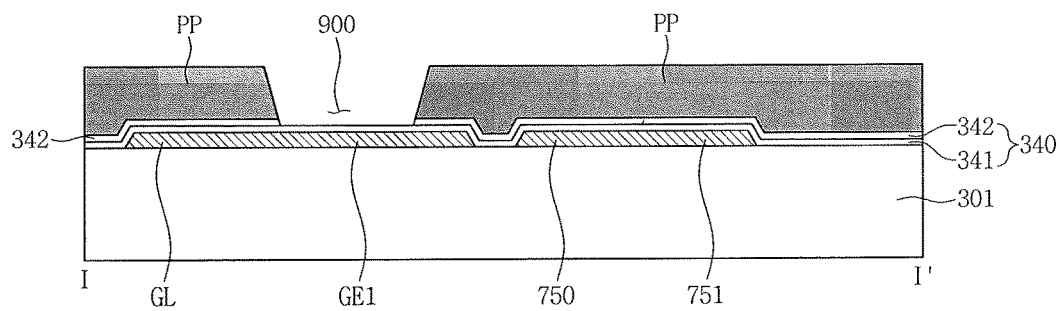
Figure 41B:
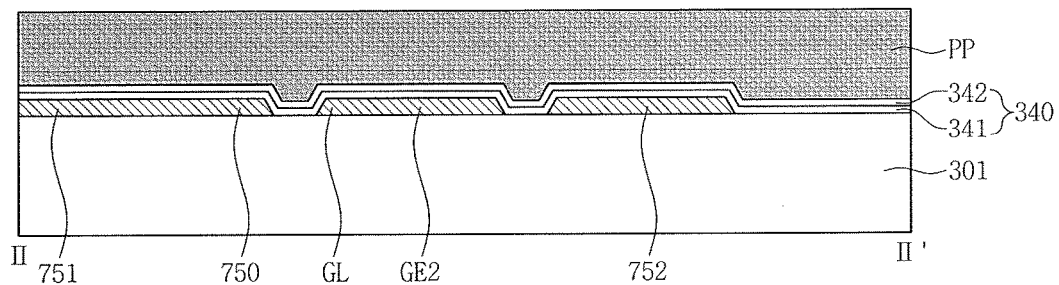
Figure 42A:
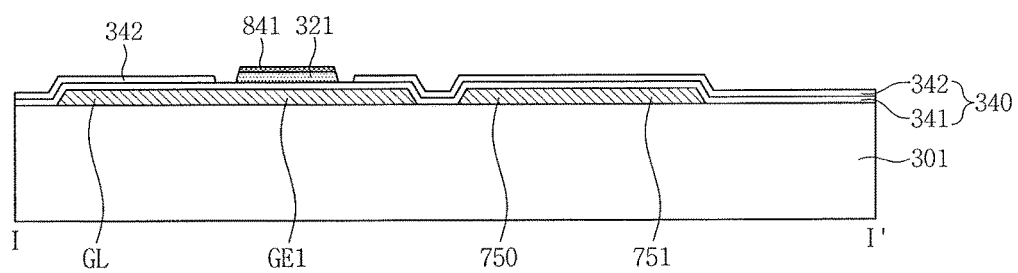

FIGS. 40A, 40B, 41A, 41B, 42A, and 42B illustrate cross-sectional views of an exemplary embodiment of a process of manufacturing the LCD device of FIGS. 38 and 39. Herein, FIGS. 40A, 41A, and 42A are cross-sectional views with respect to FIG. 38, and FIGS. 40B, 41B, and 42B are cross-sectional views with respect to FIG. 39.

First, as illustrated in FIGS. 6A and 6B, the gate line GL, the first gate electrode GE1, the storage line 750, the first storage electrode 751, the second gate electrode GE2, and the second storage electrode 752 are formed on the first substrate 301.

Subsequently, as illustrated in FIGS. 40A and 40B, the first insulating layer 341 and the second insulating layer 342 are sequentially deposited over an entire surface of the first substrate 301 including the gate line GL, the first gate electrode GE1, the storage line 750, the first storage electrode 751, the second gate electrode GE2, and the second storage electrode 752.

Subsequently, although not illustrated, a photoresist is coated over the entire surface of the first substrate 301 including the first insulating layer 341 and the second insulating layer 342.

Subsequently, the photoresist is exposed and developed, such that a photoresist pattern PP is formed over the second insulating layer 342 as illustrated in FIGS. 41A and 41B.

Subsequently, in a state where the photoresist pattern PP is used as a mask, a portion of the second insulating layer 342 is removed through an etching process, such that an aperture 900 is defined.

Subsequently, although not illustrated, the photoresist pattern PP is removed.

Subsequently, although not illustrated, a semiconductor material and an impurity semiconductor material are sequentially deposited over the entire surface of the first substrate 301 including the gate insulating layer 340.

Figure 42B:
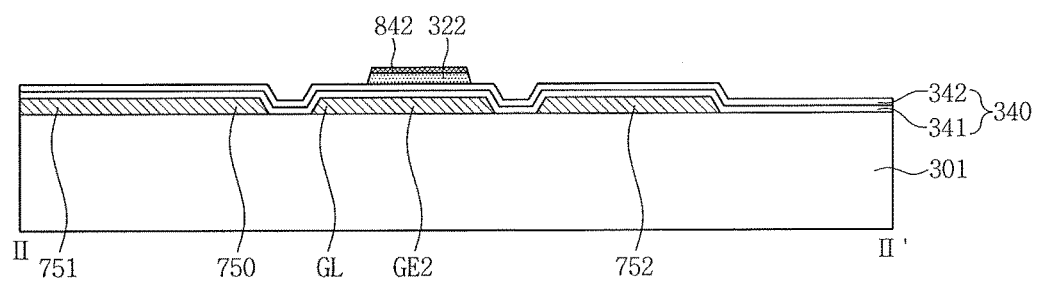

Subsequently, the semiconductor material and the impurity semiconductor material are patterned through a photolithography process and an etching process, such that the first semiconductor layer 321 overlapping the first gate electrode GE1 is formed over the first insulating layer 341, the second semiconductor layer 322 overlapping the second gate electrode GE2 is formed over the second insulating layer 342, the first impurity semiconductor pattern 841 is formed over the first semiconductor layer 321, and the second impurity semiconductor pattern 842 is formed over the second semiconductor layer 322, as illustrated in FIGS. 42A and 42B.

Subsequently, as illustrated in FIGS. 9A, 9B, 10A, 10B, 11A, 11B, 12A, 12B, 13A, 13B, 14A, 14B, 15A, and 15B, the first drain electrode DE1, the first source electrode SE1, the second drain electrode DE2, the second source electrode SE2, the first ohmic contact layer 321a, the second ohmic contact layer 321b, the third ohmic contact layer 322a, the fourth ohmic contact layer 322b, the passivation layer 320, the color filter 354, the capping layer 391, the first contact hole CH1, the second contact hole CH2, the first sub-pixel electrode PE1, and the second sub-pixel electrode PE2 are formed.

Figure 43:
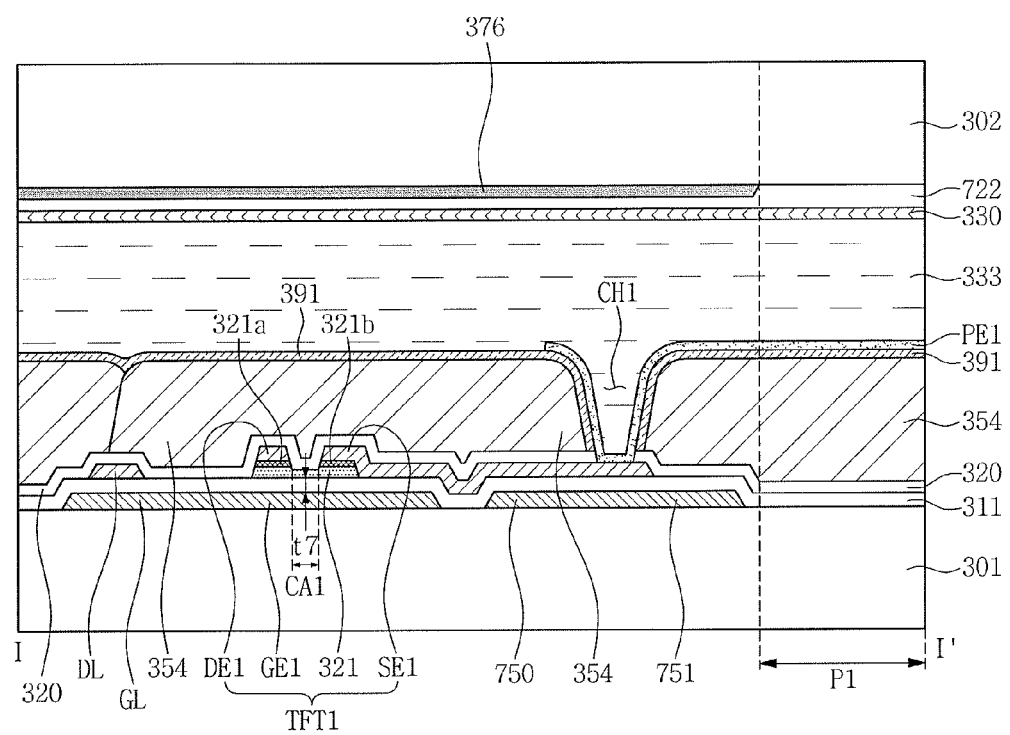
FIG. 43 illustrates a cross-sectional view of yet another alternative exemplary embodiment taken along line I-I' of FIG. 2.
Figure 44:
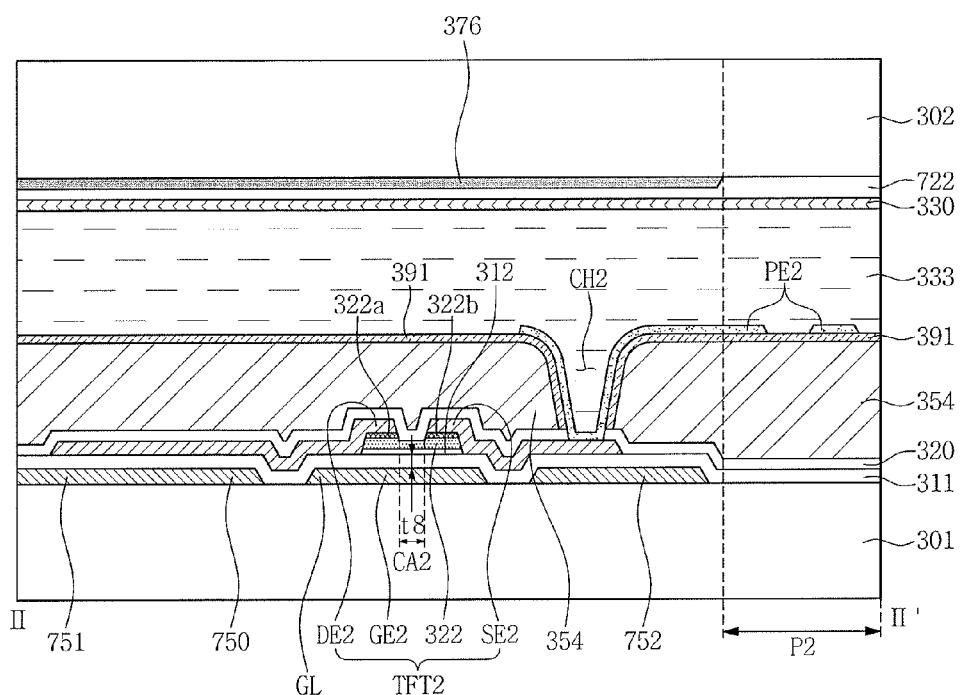
FIG. 44 illustrates a cross-sectional view of yet another alternative exemplary embodiment taken along line II-II' of FIG. 2.

FIG. 43 illustrates a cross-sectional view of yet another alternative exemplary embodiment taken along line I-I' of FIG. 2, and FIG. 44 illustrates a cross-sectional view of yet another alternative exemplary embodiment taken along line II-II' of FIG. 2.

As illustrated in FIGS. 2, 43, and 44, the LCD device includes a first substrate 301, a gate line GL, a first gate electrode GE1, a second gate electrode GE2, a first storage electrode 751, a storage line 750, a second storage electrode 752, a first gate insulating layer 311, a second gate insulating layer 312, a first semiconductor layer 321, a second semiconductor layer 322, a first ohmic contact layer 321a, a second ohmic contact layer 321b, a third ohmic contact layer 322a, a fourth ohmic contact layer 322b, a data line DL, a first drain electrode DE1, a first source electrode SE1, a second drain electrode DE2, a second source electrode SE2, a passivation layer 320, a capping layer 391, a color filter 354, a first sub-pixel electrode PE1, a second sub-pixel electrode PE2, a second substrate 302, a light blocking layer 376, an overcoat layer 722, a common electrode 330, and a liquid crystal layer 333.

The first substrate 301, the gate line GL, the first gate electrode GE1, the second gate electrode GE2, the first storage electrode 751, the storage line 750, the second storage electrode 752, the first semiconductor layer 321, the second semiconductor layer 322, the first ohmic contact layer 321a, the second ohmic contact layer 321b, the third ohmic contact layer 322a, the fourth ohmic contact layer 322b, the data line DL, the first drain electrode DE1, the first source electrode SE1, the second drain electrode DE2, the second source electrode SE2, the passivation layer 320, the capping layer 391, the color filter 354, the first sub-pixel electrode PE1, the second sub-pixel electrode PE2, the second substrate 302, the light blocking layer 376, the overcoat layer 722, the common electrode 330, and the liquid crystal layer 333 illustrated in FIGS. 43 and 44 are the same as the corresponding elements described hereinabove with reference to FIGS. 3 and 4, and thus descriptions pertaining thereto will make reference to FIGS. 3 and 4 and the related descriptions. However, the first and second semiconductor layers 321 and 322 illustrated in FIGS. 43 and 44 may or may not include impurity ions described hereinabove with reference to FIGS. 8A and 8B.

The second gate insulating layer 312, as illustrated in FIG. 44, is disposed between the first gate insulating layer 311 and the second semiconductor layer 322. For example, the second gate insulating layer 312 is disposed between the first gate insulating layer 311 and a portion of the second semiconductor layer 322 corresponding to a channel area of the second switching element TFT2. The second gate insulating layer 312 includes or is formed of a material having an etching ratio different from an etching ratio of the first gate insulating layer 311.

The first gate insulating layer 311 overlapping the first semiconductor layer 321 of the first switching element TFT1 has a smaller thickness than a thickness of an insulating layer (the first gate insulating layer 311 and the second gate insulating layer 312) overlapping the second semiconductor layer 322 of the second switching element TFT2. In an exemplary embodiment, a thickness t7 of a portion of the first gate insulating layer 311 corresponding to a channel area of the first switching element TFT1 is smaller than a thickness t8 of a portion of the insulating layer (the first gate insulating layer 311 and the second gate insulating layer 312) corresponding to the channel area of the second switching element TFT2 (t7<t8). For example, the thickness t7 is 1/z times the thickness t8. As used herein, "z" is a rational number greater than or equal to 2.

The thickness t7 may be defined as a thickness of the first gate insulating layer 311 between the first gate electrode GE1 and the first semiconductor layer 321 overlapping the first gate electrode GE1, and the thickness t8 may be defined as an overall thickness of the two insulating layers, that is, the first gate insulating layer 311 and the second gate insulating layer 312 between the second gate electrode GE2 and the second semiconductor layer 322 overlapping the second gate electrode GE2.

A portion of the second semiconductor layer 322 corresponding to the channel area of the second switching element TFT2 is disposed over the second gate insulating layer 312.

Due to the thickness difference of the insulating layer, the first switching element TFT1 may have a threshold voltage less than that of the second switching element TFT2. Accordingly, the first switching element TFT1 may have a higher current driving capability than that of the second switching element TFT2.

The first gate insulating layer 311 and the second gate insulating layer 312 may have different thicknesses from each other. In an exemplary embodiment, the first gate insulating layer 311 may have a thickness less than that of the second gate insulating layer 312. In an alternative exemplary embodiment, the second gate insulating layer 312 may have a thickness less than that of the first gate insulating layer 311.

The first gate insulating layer 311 and the second gate insulating layer 312 may include or be formed of a material the same as that included in the gate insulating layer 311 described hereinabove with respect to FIG. 3.

Figure 45A:
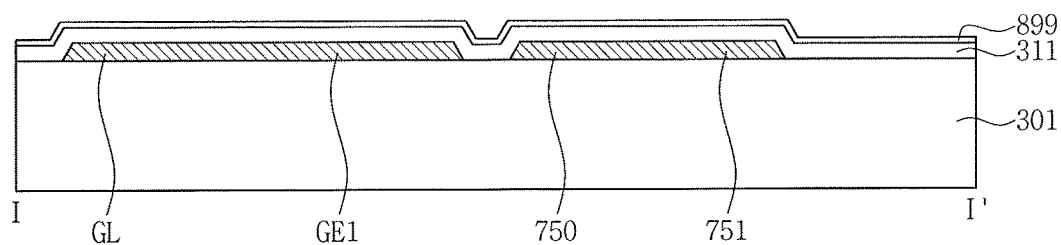
FIGS. 45A, 45B, 46, 47A, 47B, 48A, and 48B illustrate cross-sectional views of stages in an exemplary embodiment of a process of manufacturing the LCD device of FIGS. 43 and 44.
Figure 45B:
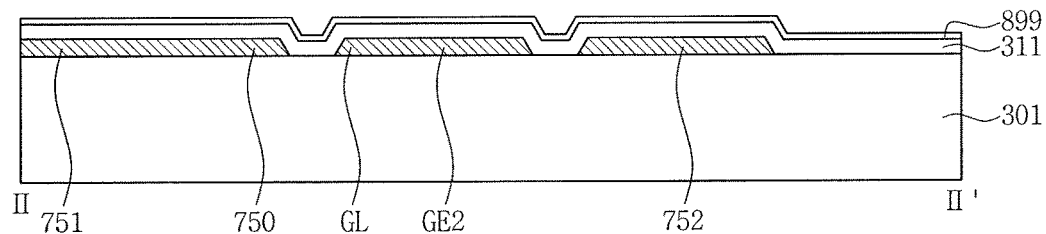
Figure 46:
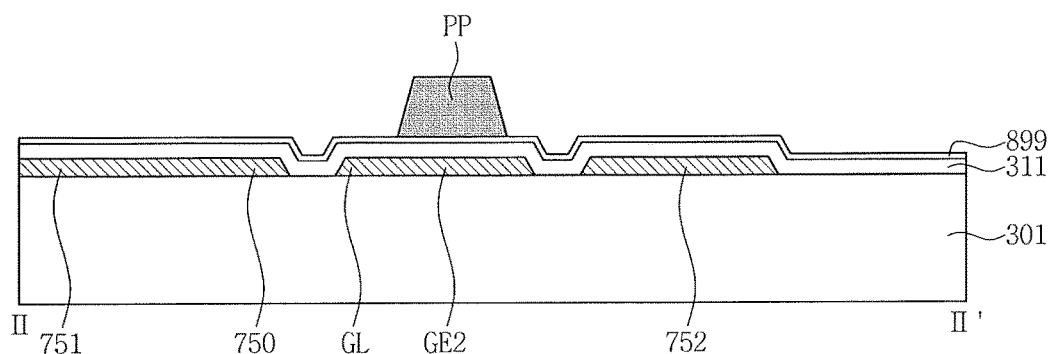
Figure 47A:
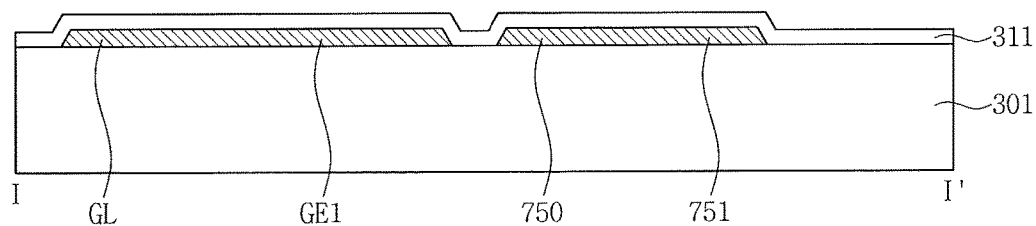
Figure 47B:
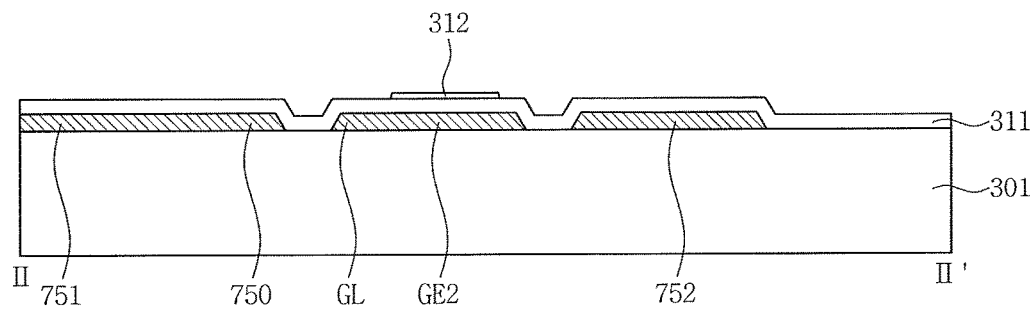
Figure 48A:
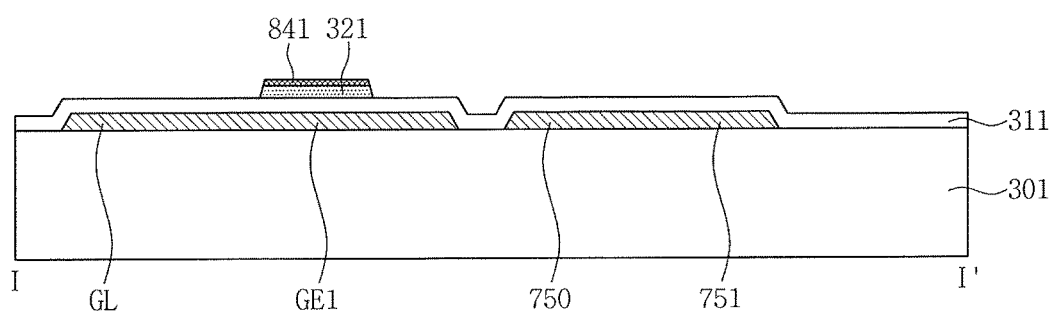

FIGS. 45A, 45B, 46, 47A, 47B, 48A, and 48B illustrate cross-sectional views of an exemplary embodiment of a process of manufacturing the LCD device of FIGS. 43 and 44. Herein, FIGS. 45A, 47A, and 48A are cross-sectional views with respect to FIG. 43, and FIGS. 45B, 46, 47B, and 48B are cross-sectional views with respect to FIG. 44.

First, as illustrated in FIGS. 6A and 6B, the gate line GL, the first gate electrode GE1, the storage line 750, the first storage electrode 751, the second gate electrode GE2, and the second storage electrode 752 are formed over the first substrate 301.

Subsequently, as illustrated in FIGS. 45A and 45B, the first gate insulating layer 311 and an insulating material 899 are sequentially deposited over an entire surface of the first substrate 301 including the gate line GL, the first gate electrode GE1, the storage line 750, the first storage electrode 751, the second gate electrode GE2, and the second storage electrode 752.

Subsequently, although not illustrated, a photoresist is coated over the entire surface of the first substrate 301 including the gate insulating layer 311 and the insulating material 899.

Subsequently, the photoresist is exposed and developed, and thus a photoresist pattern PP is formed on the insulating material 899 as illustrated in FIG. 46.

Subsequently, in a state where the photoresist pattern PP is used as a mask, the insulating material 899 is patterned through an etching process, such that the second gate insulating layer 312 is formed on the second gate electrode GE2 as illustrated in FIGS. 47A and 47B.

Subsequently, although not illustrated, the photoresist pattern PP is removed.

Subsequently, although not illustrated, a semiconductor material and an impurity semiconductor material are sequentially deposited over the entire surface of the first substrate 301 including the first gate insulating layer 311 and the second gate insulating layer 312.

Figure 48B:
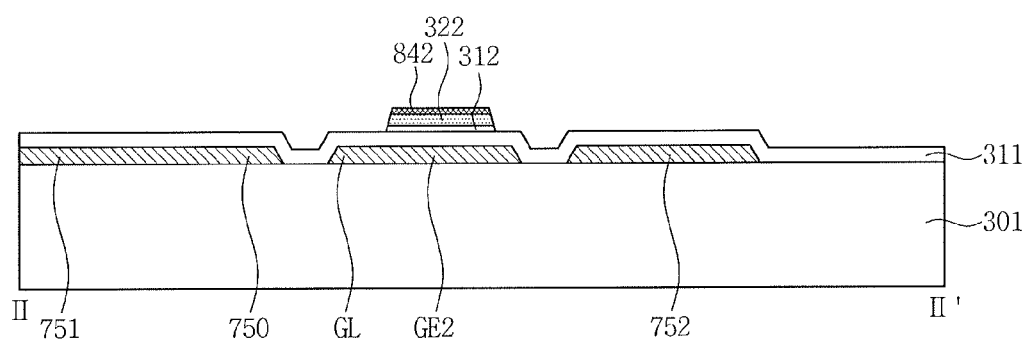

Subsequently, the semiconductor material and the impurity semiconductor material are patterned through a photolithography process and an etching process, such that the first semiconductor layer 321 overlapping the first gate electrode GE1 is formed over the first gate insulating layer 311, the second semiconductor layer 322 overlapping the second gate electrode GE2 is formed over the second gate insulating layer 312, a first impurity semiconductor pattern 841 is formed over the first semiconductor layer 321, and a second impurity semiconductor pattern 842 is formed over the second semiconductor layer 322 as illustrated in FIGS. 48A and 48B.

Subsequently, as illustrated in FIGS. 9A, 9B, 10A, 10B, 11A, 11B, 12A, 12B, 13A, 13B, 14A, 14B, 15A, and 15B, the first drain electrode DE1, the first source electrode SE1, the second drain electrode DE2, the second source electrode SE2, the first ohmic contact layer 321a, the second ohmic contact layer 321b, the third ohmic contact layer 322a, the fourth ohmic contact layer 322b, the passivation layer 320, the color filter 354, the capping layer 391, a first contact hole CH1, a second contact hole CH2, the first sub-pixel electrode PE1, and the second sub-pixel electrode PE2 are formed.

Figure 49:
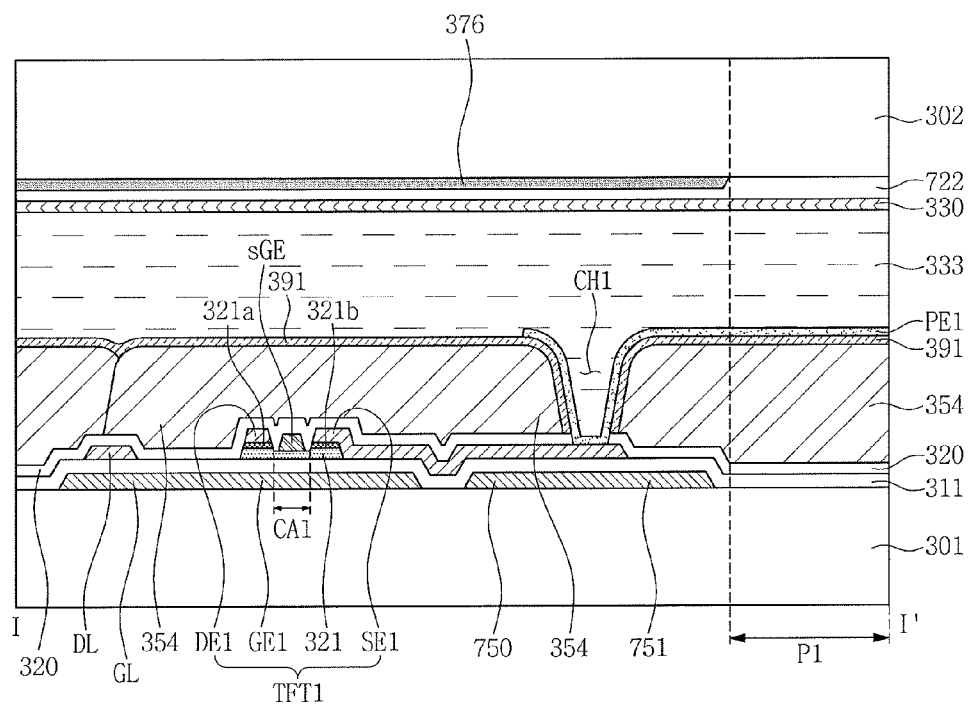
FIG. 49 illustrates a cross-sectional view of still yet another alternative exemplary embodiment taken along line I-I' of FIG. 2.
Figure 50:
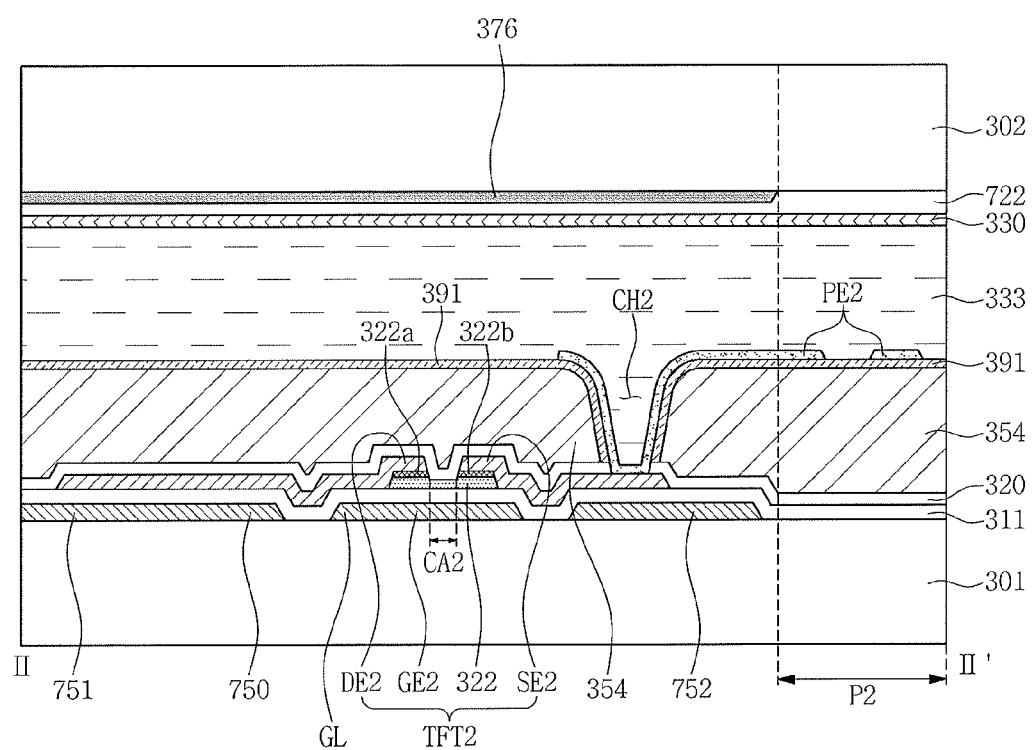
FIG. 50 illustrates a cross-sectional view of still yet another alternative exemplary embodiment taken along line II-II' of FIG. 2.

FIG. 49 illustrates a cross-sectional view of still yet another alternative exemplary embodiment taken along line I-I' of FIG. 2, and FIG. 50 illustrates a cross-sectional view of still yet another alternative exemplary embodiment taken along line II-II' of FIG. 2.

As illustrated in FIGS. 2, 49, and 50, the LCD device includes a first substrate 301, a gate line GL, a first gate electrode GE1, a second gate electrode GE2, a sub-gate electrode sGE, a first storage electrode 751, a storage line 750, a second storage electrode 752, a gate insulating layer 311, a first semiconductor layer 321, a second semiconductor layer 322, a first ohmic contact layer 321a, a second ohmic contact layer 321b, a third ohmic contact layer 322a, a fourth ohmic contact layer 322b, a data line DL, a first drain electrode DE1, a first source electrode SE1, a second drain electrode DE2, a second source electrode SE2, a passivation layer 320, a capping layer 391, a color filter 354, a first sub-pixel electrode PE1, a second sub-pixel electrode PE2, a second substrate 302, a light blocking layer 376, an overcoat layer 722, a common electrode 330, and a liquid crystal layer 333.

The first substrate 301, the gate line GL, the first gate electrode GE1, the second gate electrode GE2, the first storage electrode 751, the storage line 750, the second storage electrode 752, the gate insulating layer 311, the first semiconductor layer 321, the second semiconductor layer 322, the first ohmic contact layer 321a, the second ohmic contact layer 321b, the third ohmic contact layer 322a, the fourth ohmic contact layer 322b, the data line DL, the first drain electrode DE1, the first source electrode SE1, the second drain electrode DE2, the second source electrode SE2, the passivation layer 320, the capping layer 391, the color filter 354, the first sub-pixel electrode PE1, the second sub-pixel electrode PE2, the second substrate 302, the light blocking layer 376, the overcoat layer 722, the common electrode 330, and the liquid crystal layer 333 illustrated in FIGS. 49 and 50 are the same as the corresponding elements described hereinabove with reference to FIGS. 3 and 4, and thus descriptions pertaining thereto will make reference to FIGS. 3 and 4 and the related descriptions. However, the first and second semiconductor layers 321 and 322 illustrated in FIGS. 49 and 50 may or may not include impurity ions described hereinabove with reference to FIGS. 8A and 8B.

The first switching element TFT1 includes the first semiconductor layer 321, the first gate electrode GE1, the sub-gate electrode sGE, the first drain electrode DE1, and the first source electrode SE1.

The sub-gate electrode sGE is disposed over the first semiconductor layer 321. In an exemplary embodiment, the sub-gate electrode sGE is disposed over a portion of the first semiconductor layer 321 corresponding to a channel area of the first switching element TFT1.

The sub-gate electrode sGE has a work function less than that of the first semiconductor layer 321 of the first switching element TFT1. In such an exemplary embodiment, the sub-gate electrode sGE may have a work function greater than that of the second semiconductor layer 322 of the second switching element TFT2.

As the work function of the sub-gate electrode sGE decreases, an accumulation layer is more readily formed on a portion of the first semiconductor layer 321 corresponding to the channel area of the first switching element TFT1. The accumulation layer reduces a threshold voltage of the first switching element TFT1. On the other hand, as the work function of the sub-gate electrode sGE increases, a depletion layer is more readily formed on a portion of the first semiconductor layer 321 corresponding to the channel area of the first switching element TFT1. The depletion layer raises the threshold voltage of the first switching element TFT1.

In an exemplary embodiment, the first semiconductor layer 321 illustrated in FIG. 49 may include amorphous indium gallium zinc oxide (IGZO). In an alternative exemplary embodiment, the first semiconductor layer 321 illustrated in FIG. 49 may include amorphous indium gallium zinc oxide (IGZO) and an amorphous nitrogenated indium gallium zinc oxide (a-IGZO:N). In such an exemplary embodiment, the amorphous nitrogenated indium gallium zinc oxide (a-IGZO:N) may be disposed over the amorphous indium gallium zinc oxide (IGZO). In such an exemplary embodiment, the amorphous indium gallium zinc oxide (IGZO), among the amorphous nitrogenated indium gallium zinc oxide (a-IGZO:N), may be positioned at the channel portion of the first switching element TFT1.

A bias voltage may be applied to or may not be applied to the sub-gate electrode sGE externally. In other words, the sub-gate electrode sGE may be connected to an external power that supplies a bias voltage. However, in an alternative exemplary embodiment, the sub-gate electrode sGE may be in a floating state.

In an exemplary embodiment, the second switching element TFT2 does not include a sub-gate electrode sGE.

The first switching element TFT1 including the sub-gate electrode sGE having a smaller work function than that of the first semiconductor layer 321 may have a threshold voltage less than that of the second switching element TFT2. Accordingly, the first switching element TFT1 may have a higher current driving capability than that of the second switching element TFT2.

The sub-gate electrode sGE may be formed subsequent to the forming of the first, second, third, and fourth ohmic contact layers 321a, 321b, 322a, and 322b. In an exemplary embodiment, the sub-gate electrode sGE may be manufactured between the processes described hereinabove with reference to FIGS. 10A and 10B and the processes described hereinabove with reference to FIGS. 11A and 11B. In an exemplary embodiment, a gate metal layer is formed over an entire surface of the first substrate 301 including the first drain electrode DE1, the first source electrode SE1, the second drain electrode DE2, and the second source electrode SE2. Subsequently, the gate metal layer is patterned through a photolithography process and an etching process, such that the sub-gate electrode sGE is formed over the first semiconductor layer 321 corresponding to the channel area of the first switching element TFT1.

The gate metal layer may include or be formed of a material included in the gate line GL.

In an implementation, an alternative exemplary embodiment of an LCD device may include a first switching element TFT1 and a second switching element TFT2 having different W/L ratios from each other. In an implementation, the first switching element TFT1 may have a greater W/L ratio than that of the second switching element TFT2. For example, the W/L ratio of the first switching element TFT1 may be at least two times the W/L ratio of the second switching element TFT2. Due to the W/L-ratio difference therebetween, the first switching element TFT1 may have a lower threshold voltage than that of the second switching element TF2. Accordingly, the first switching element TFT1 may have a higher current driving capability than that of the second switching element TFT2.

The aforementioned W/L ratio refers to a ratio W/L of a width W of a channel area of a corresponding switching element to a length L of the channel area. For example, the W/L ratio of the first switching element TFT1 refers to a ratio of a width of the channel area of the first switching element TFT1 to a length L of the channel area thereof, and the W/L ratio of the second switching element TFT2 refers to a ratio of a width of a channel area of the second switching element TFT2 to a length L of the channel area thereof.

Figure 51:
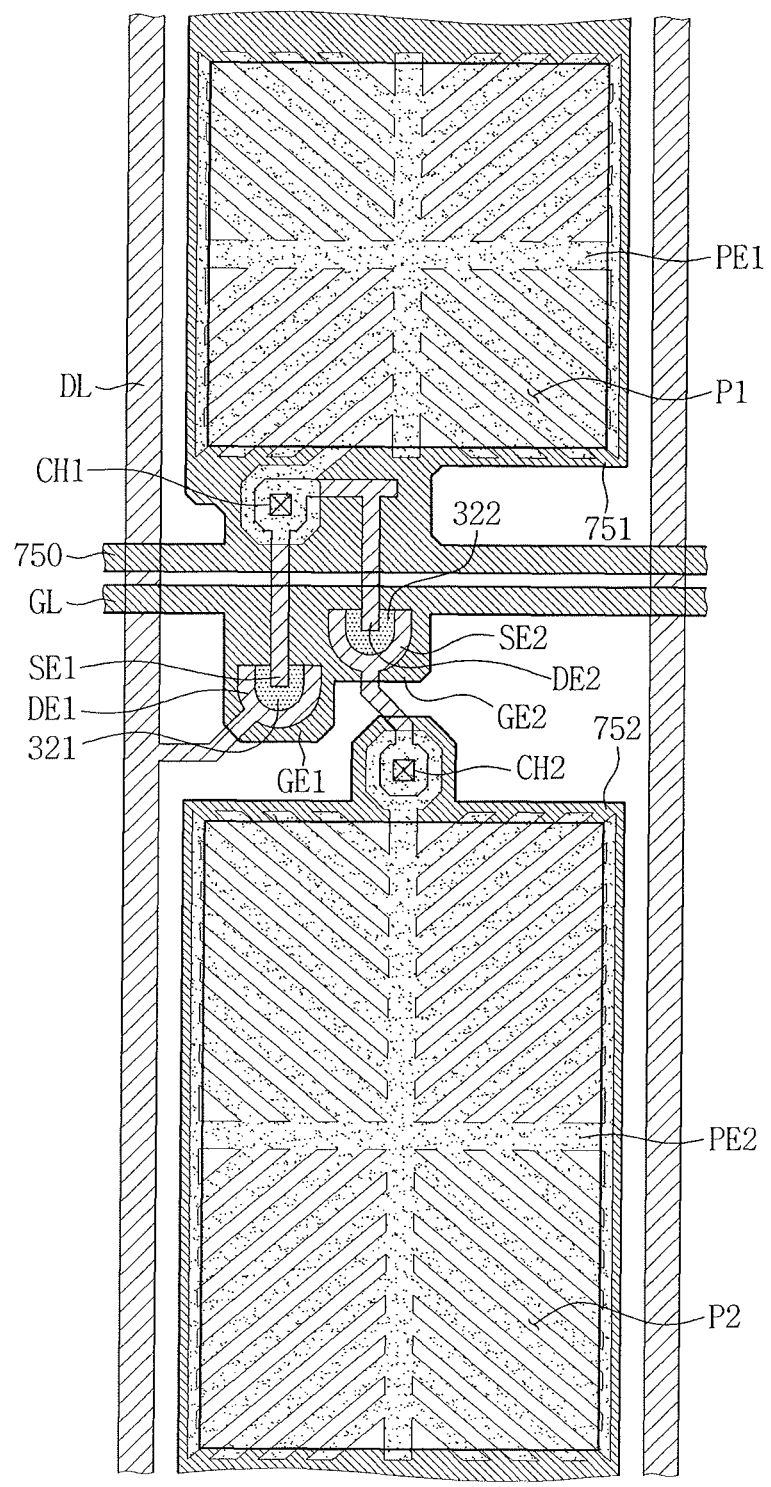
FIG. 51 illustrates a plan view of an alternative exemplary embodiment of an LCD device including a pixel configuration corresponding to the pixel circuit of FIG. 1.

FIG. 51 illustrates a plan view of an alternative exemplary embodiment of an LCD device including a pixel configuration corresponding to the pixel circuit of FIG. 1.

As illustrated in FIG. 51, a second source electrode SE2 may have a U-shape. In such an exemplary embodiment, a protruding portion of the second source electrode SE2 faces toward the second sub-pixel electrode PE2.

Descriptions pertaining to other elements illustrated in FIG. 51 will make reference to descriptions pertaining to elements described hereinabove with reference to FIGS. 3 and 4, elements described hereinabove with reference to FIGS. 18 and 19, elements described hereinabove with reference to FIGS. 26 and 27, elements described hereinabove with reference to FIGS. 38 and 39, elements described hereinabove with reference to FIGS. 43 and 44, or elements described hereinabove with reference to FIGS. 49 and 50.

Figure 52:
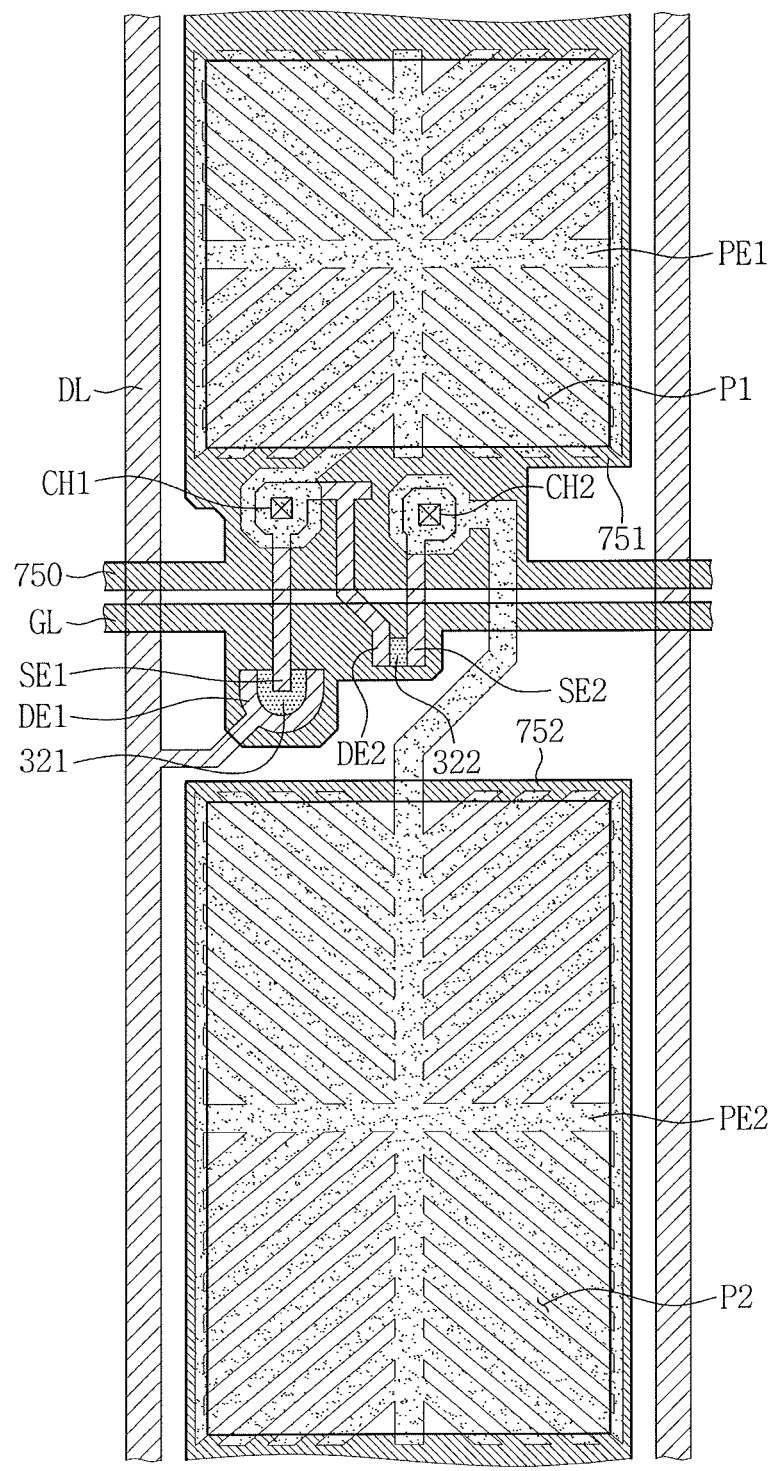
FIG. 52 illustrates a plan view of another alternative exemplary embodiment of an LCD device including a pixel configuration corresponding to the pixel circuit of FIG. 1.

FIG. 52 illustrates a plan view of another alternative exemplary embodiment of an LCD device including a pixel configuration corresponding to the pixel circuit of FIG. 1.

As illustrated in FIG. 52, a connecting portion between a first switching element TFT1 and a first sub-pixel electrode PE1 is disposed between a gate line GL and a first sub-pixel electrode PE1. In other words, a first contact hole CH1 is defined between the gate line GL and the first sub-pixel electrode PE1. In addition, a connecting portion between a second switching element TFT2 and a second sub-pixel electrode PE2 is disposed between the gate line GL and the first sub-pixel electrode PE1. In other words, a second contact hole CH2 is defined between the gate line GL and the first sub-pixel electrode PE1.

The second contact hole CH2 may or may not overlap a first storage electrode 751.

The descriptions pertaining to other elements illustrated in FIG. 52 will make reference to descriptions pertaining to elements described hereinabove with reference to FIGS. 3 and 4, elements described hereinabove with reference to FIGS. 18 and 19, elements described hereinabove with reference to FIGS. 26 and 27, elements described hereinabove with reference to FIGS. 38 and 39, elements described hereinabove with reference to FIGS. 43 and 44, or elements described hereinabove with reference to FIGS. 49 and 50.

The first switching element TFT1 includes a first gate electrode GE1, a first electrode connected to a data line DL, and a second electrode connected to the first sub-pixel electrode PE1. Based on a voltage applied to the data line DL, the first electrode of the first switching element TFT1 may function as a source electrode, or the second electrode of the first switching element TFT1 may function as a source electrode. For example, in a case where the voltage applied to the data line DL is a positive voltage higher than a common voltage Vcom, a voltage applied to the first electrode of the first switching element TFT1 is higher than a voltage applied to the second electrode of the first switching element TFT1, and in such an exemplary embodiment, the first electrode of the first switching element TFT1 is a drain electrode, and the second electrode of the first switching element TFT1 is a source electrode. On the other hand, in a case where a voltage applied to the data line DL is a negative voltage greater than the common voltage Vcom, a voltage applied to the first electrode of the first switching element TFT1 is less than a voltage applied to the second electrode of the first switching element TFT1, and in such an exemplary embodiment, the first electrode of the first switching element TFT1 is a source electrode, and the second electrode of the first switching element TFT1 is a drain electrode.

Likewise, the second switching element TFT2 includes a second gate electrode GE2, a first electrode connected to the first sub-pixel electrode PE1, and a second electrode connected to the second sub-pixel electrode PE2. Accordingly, based on a voltage applied to the first sub-pixel electrode PEE the first electrode of the second switching element TFT2 may function as a source electrode, or the second electrode of the second switching element TFT2 may function as a source electrode. Descriptions pertaining thereto will make reference to descriptions pertaining to the first switching element TFT1 described hereinabove.

In all exemplary embodiments described hereinabove, although not illustrated, a semiconductor layer and an ohmic contact layer are further disposed between a gate insulating layer 311 and the data line DL, a semiconductor layer and an ohmic contact layer are further disposed between a first drain electrode DE1 and the gate insulating layer 311, a semiconductor layer and an ohmic contact layer are further disposed between a first source electrode SE1 and the gate insulating layer 311, a semiconductor layer and an ohmic contact layer are further disposed between a second drain electrode DE2 and the gate insulating layer 311, and a semiconductor layer and an ohmic contact layer are further disposed between a second source electrode SE2 and the gate insulating layer 311. In such an exemplary embodiment, the aforementioned first, second, third, and fourth semiconductor layers 321, 322, 323, and 324 and a corresponding one of the semiconductor layers may be unitary, and the first to eighth ohmic contact layers 321a to 324b and a corresponding one of the ohmic contact layers may be unitary.

Figure 53:
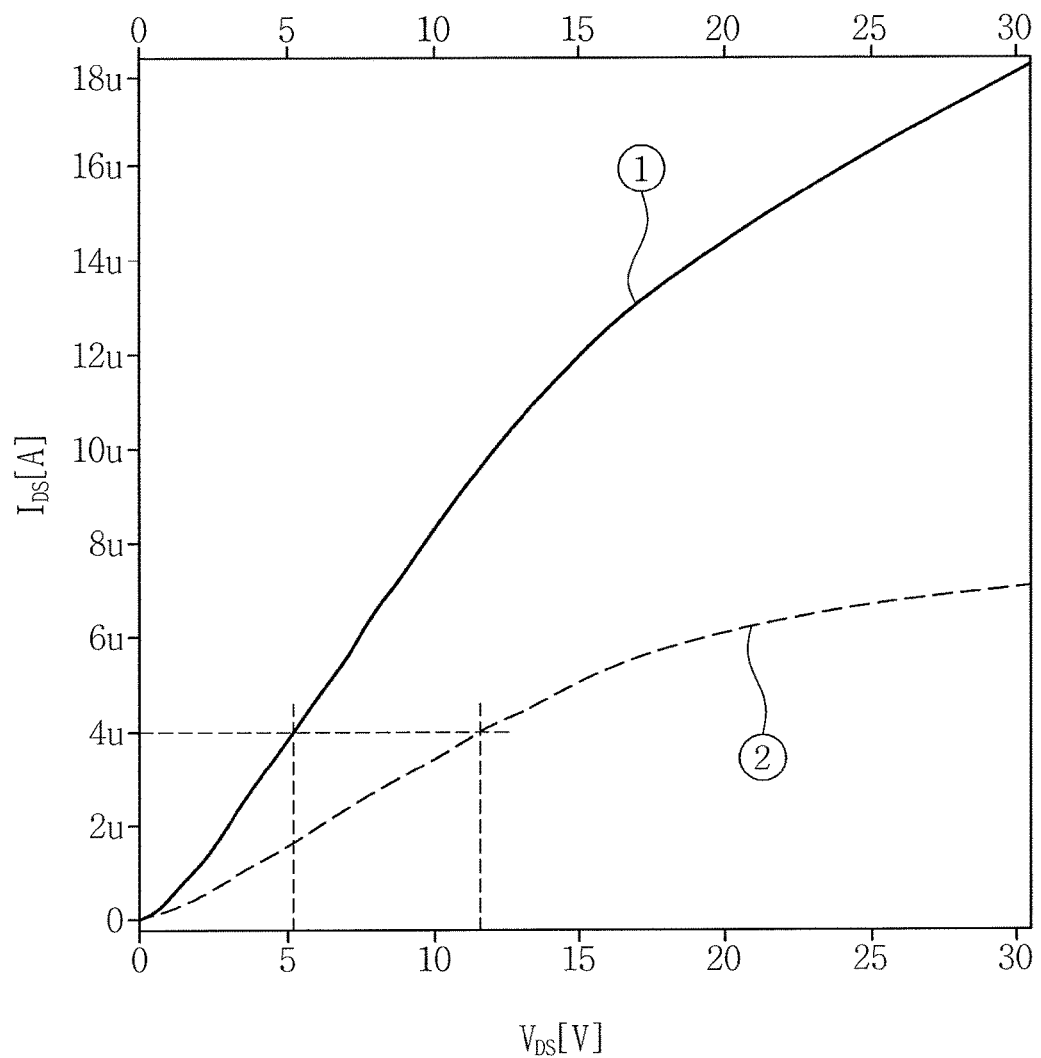
FIG. 53 illustrates a graph showing a difference between current driving capabilities of a first switching element and a second switching element of FIG. 1.

FIG. 53 illustrates a graph showing a difference between current driving capabilities of the first switching element and the second switching element of FIG. 1.

FIGS. 53, 54, 55, 56, 57, 58, 59A, 59B, 60A, 60B, and Mathematical Formulae 1 to 11 illustrate an example in which a negative data voltage is applied to the data line DL. That is, the first electrode (i.e., an electrode connected to the data line DL) of the first switching element TFT1 is a drain electrode, and the second electrode (i.e., an electrode connected to the first sub-pixel electrode PE1) of the first switching element TFT1 is a source electrode. Likewise, the first electrode (i.e., an electrode connected to the first sub-pixel electrode PE1) of the second switching element TFT2 is a drain electrode, and the second electrode (i.e., an electrode connected to the second sub-pixel electrode PE2) of the second switching element TFT2 is a source electrode.

In FIG. 53, an x-axis represents a drain-source voltage $V_{DS}$ of a corresponding switching element, and a y-axis represents a drain-source current $I_{DS}$ of the corresponding switching element. A first characteristic curve ① represented by a solid line represents a drain-source current $I_{DS}$ of the first switching element TFT1 based on the drain-source voltage $V_{DS}$ thereof, and a second characteristic curve ② represented by a dotted line represents a drain-source current $I_{DS}$ of the second switching element TFT2 based on the drain-source voltage $V_{DS}$ thereof.

With reference to FIG. 53, it is verified that the drain-source current $I_{DS}$ of the first switching element TFT1 is higher than the drain-source current $I_{DS}$ of the second switching element TFT2 based on the drain-source voltage $V_{DS}$ of the same level. In other words, a current driving capability of the first switching element TFT1 is higher than that of the second switching element TFT2. Accordingly, even though the drain-source voltage ($V_{data}-V_{High}$) of the first switching element TFT1 is lower than the drain-source voltage ($V_{High}-V_{Low}$) of the second switching element TFT2, the first switching element TFT1 may generate the drain-source current $I_{DS}$ having a level the same as that of the drain-source current $I_{DS}$ of the second switching element TFT2. As used herein, the drain-source voltage ($V_{data}-V_{High}$) of the first switching element TFT1 refers to a voltage difference between the drain electrode and the source electrode of the first switching element TFT1, and may be defined as a difference between the data voltage $V_{data}$ and the first sub-pixel voltage $V_{High}$. In addition, the drain-source voltage ($V_{High}-V_{Low}$) of the second switching element TFT2 refers to a voltage difference between the drain electrode and the source electrode of the second switching element TFT2, and may be defined as a difference between the first sub-pixel voltage $V_{High}$ and the second sub-pixel voltage $W_{Low}$.

In a case where the first switching element TFT1 operates in a linear region, the drain-source current $I_{DS(High)}$ of the first switching element TFT1 may be defined as the following Mathematical Formula 1.

$$I_{DS(High)}=\beta_{High}[(V_{gate}-V_{Pixel(High)}-V_{t(High)}-\Delta V_{Asym}-\eta_{High}(V_{data}-V_{Pixel(High)}))(V_{data}-V_{Pixel(High)})-(V_{data}-V_{Pixel(High)})^2/2]$$ [Mathematical Formula 1]

In Mathematical Formula 1, "$\beta_{High}$" represents a beta constant of the first switching element TFT1, "$V_{gate}$" represents a gate high voltage applied to the gate electrode of the first switching element TFT1, "$V_{t(High)}$" represents a threshold voltage of the first switching element TFT1, "$\eta_{High}$" represents a rational number greater than or equal to 0 and less than or equal to 1, "$V_{data}$" represents a data voltage of the data line, and "$V_{pixel(High)}$" represents a first sub-pixel voltage.

In a case where the second switching element TFT2 operates in a linear region, the drain-source current $I_{DS(Low)}$ of the second switching element TFT2 may be defined as the following Mathematical Formula 2.

$$I_{DS(Low)}=\beta_{Low}[(V_{gate}-V_{Pixel(Low)}-V_{t(Low)}-\eta_{Low}(V_{Pixel(High)}-V_{Pixel(Low)}))(V_{Pixel(High)}-V_{Pixel(Low)})-(V_{data}-V_{Pixel(Low)})^2/2]$$ [Mathematical Formula 2]

In Mathematical Formula 2, "$\beta_{Low}$" represents a beta constant of the second switching element TFT2, "$V_{t(Low)}$" represents a threshold voltage of the second switching element TFT2, "$\eta_{Low}$" represents a rational number greater than or equal to 0 and less than or equal to 1, and "$V_{pixel(Low)}$" represents a second sub-pixel voltage. Herein, "$\eta_{High}$" and "$\eta_{Low}$" may have the same value, but in an alternative exemplary embodiment, "$\eta_{High}$" and "$\eta_{Low}$" may have different values from each other.

In Mathematical Formulae 1 and 2, in a case where "$\eta_{High}$" and "$\eta_{Low}$" are fitting parameters, "$\beta_{High}$" and "$\beta_{Low}$" may be defined as the following Mathematical Formulae 3 and 4, respectively.

$$\beta_{High}=(\mu_{eff(High)}C_{Gate(High)})(W_{High}/L_{High})$$ [Mathematical Formula 3]

In Mathematical Formula 3, "$\mu_{eff(High)}$" represents an effective mobility of a carrier of the first switching element TFT1, "$C_{Gate(High)}$" represents a capacitance of the gate insulating layer overlapping the semiconductor layer of the first switching element TFT1, "$W_{High}$" represents a width of the channel area of the first switching element TFT1, and "$L_{High}$" represents a length of the channel area of the first switching element TFT1.

$$\beta_{Low}=(\mu_{eff(Low)}C_{Gate(Low)})(W_{Low}/L_{Low})$$ [Mathematical Formula 4]

In Mathematical Formula 4, "$\mu_{eff(Low)}$" represents an effective mobility of a carrier of the second switching element TFT2, "$C_{Gate(Low)}$" represents a capacitance of the gate insulating layer overlapping the semiconductor layer of the second switching element TFT2, "$W_{Low}$" represents a width of the channel area of the second switching element TFT2, and "$L_{Low}$" represents a length of the channel area of the second switching element TFT2.

In a case where the second switching element TFT2 operates in a saturation region, the drain-source current $I_{DS(Low)}$ of the second switching element TFT2 may be defined as the following Mathematical Formula 5.

$$I_{DS(Low)} = \beta_{Low}[(V_{gate} - V_{Pixel(Low)} - V_{t(Low)} - \eta_{Low}(V_{Pixel(High)} - V_{Pixel(Low)}))^2/2] \quad \text{[Mathematical Formula 5]}$$

In Mathematical Formula 5, it is assumed that the drain-source current of the first switching element TFT1 and the drain-source current of the second switching element TFT2 have the same level as each other. Accordingly, based on a kick-back voltage of the first switching element TFT1 and physical and/or mathematical assumptions, the first sub-pixel voltage may be defined as the following Mathematical Formula 6.

[Mathematical Formula 6]

$$V_{Pixel(High)} \cong \frac{(V_{data} - V_{t(High)} - \Delta V_{Asym})\left(1 + \sqrt{\frac{\beta_{Low}}{\beta_{High}}} - \sqrt{\frac{\beta_{Low}}{\beta_{High}}} + \sqrt{\frac{\beta_{Low}}{\beta_{High}}}\right)}{1 + \sqrt{\frac{\beta_{Low}}{\beta_{High}}}} - V_{KB(High)}$$

In Mathematical Formula 6, "$V_{KB(High)}$" represents a kick-back voltage of the first switching element TFT1, which may be defined as the following Mathematical Formula 7.

$$V_{KB(High)} = \frac{C_{gs(High)} + C_{gd(Low)}}{C_{gs(High)} + C_{gd(Low)} + C_{lc(High)} + C_{st}} \Delta V_{gs} \quad \text{[Mathematical Formula 7]}$$

In Mathematical Formula 7, "$C_{gs(High)}$" represents a capacitance of a parasitic capacitor formed between the gate electrode and the source electrode of the first switching element TFT1, "$C_{gd(Low)}$" represents a capacitance of a parasitic capacitor formed between the gate electrode and the drain electrode of the second switching element TFT2, "$C_{lc(High)}$" represents a capacitance of the first liquid crystal capacitor, "$C_{st}$" represents a capacitance of the first storage capacitor, and "$\Delta V_{gs}$" represents a voltage difference between the gate high voltage and the gate low voltage.

Figure 54:
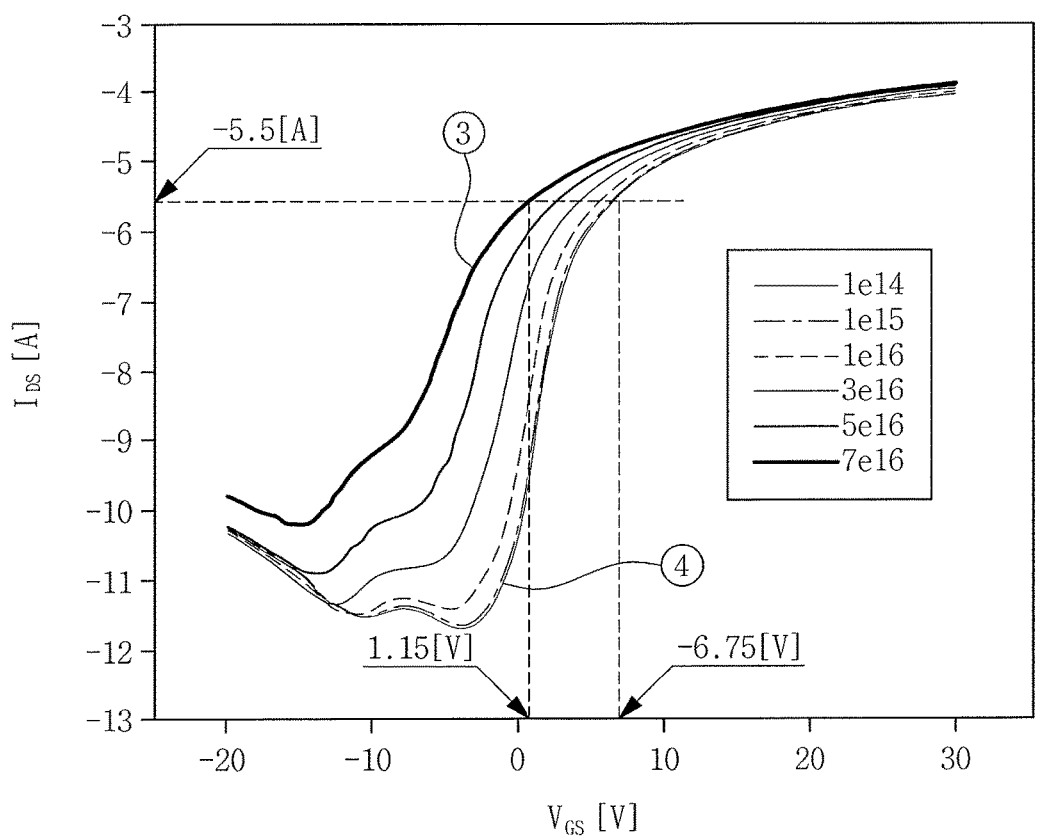
FIG. 54 illustrates a graph showing characteristics of a gate-source voltage and a drain-source current of a switching element based on an impurity ion concentration of a semiconductor layer.

FIG. 54 illustrates a graph showing characteristics of a gate-source voltage and a drain-source current of a switching element based on an impurity ion concentration of a semiconductor layer.

In FIG. 54, an x-axis represents a gate-source voltage $V_{GS}$ of a switching element, and a y-axis represents a drain-source current $I_{DS}$ of the switching element.

As illustrated in FIG. 54, as an impurity ion concentration of a semiconductor layer increases, a higher drain-source current $I_{DS}$ is generated even though a gate-source voltage VGS having a relatively low voltage level is applied. For example, as illustrated in FIG. 54, based on a characteristic curve ③ of the first switching element TFT1 including a semiconductor layer having a highest impurity ion concentration, a drain-source current $I_{DS}$ of about 5.5 [A] is generated based on a gate-source voltage $V_{GS}$ of about 1.15 [V]. On the other hand, based on a characteristic curve ④ of the second switching element TFT2 including a semiconductor layer having a lowest impurity ion concentration, a drain-source current $I_{DS}$ of about −5.5 [A] is generated based on a gate-source voltage $V_{GS}$ of about 6.75 [V].

Herein, the semiconductor layer corresponding to the characteristic curve ③ may be the first semiconductor layer 321 described hereinabove with reference to FIG. 3, and the semiconductor layer corresponding to the characteristic curve ④ may be the second semiconductor layer 322 described hereinabove with reference to FIG. 4.

Figure 55:
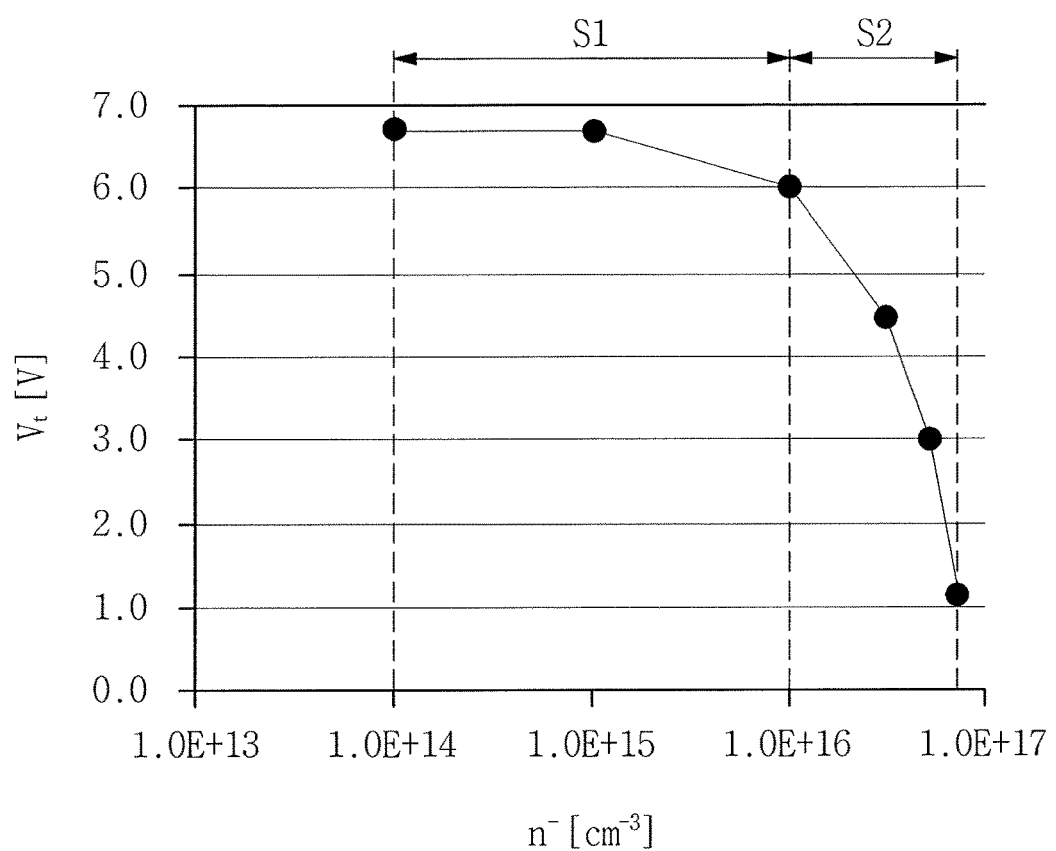
FIG. 55 illustrates a graph showing characteristics of a threshold voltage of a switching element based on an impurity ion concentration of a semiconductor layer.

FIG. 55 illustrates a graph showing characteristics of a threshold voltage of a switching element based on an impurity ion concentration of a semiconductor layer.

In FIG. 55, an x-axis represents an impurity ion concentration of a semiconductor layer, and a y-axis represents a threshold voltage $V_t$ of a switching element.

With reference to FIG. 55, it is verified that in a case where the impurity ion concentration of a semiconductor layer increases to reach a predetermined value (e.g., 1.0E+16), the threshold voltage $V_t$ of a switching element sharply decreases. Accordingly, an impurity ion concentration of the first semiconductor layer 321 included in the first switching element TFT1 may be set in a first region S1, and an impurity ion concentration of the second semiconductor layer 322 included in the second switching element TFT2 may be set in a second region S2.

In an exemplary embodiment, the semiconductor layer illustrated in FIGS. 54 and 55 includes amorphous silicon including hydrogen (a-Si:H).

Figure 56:
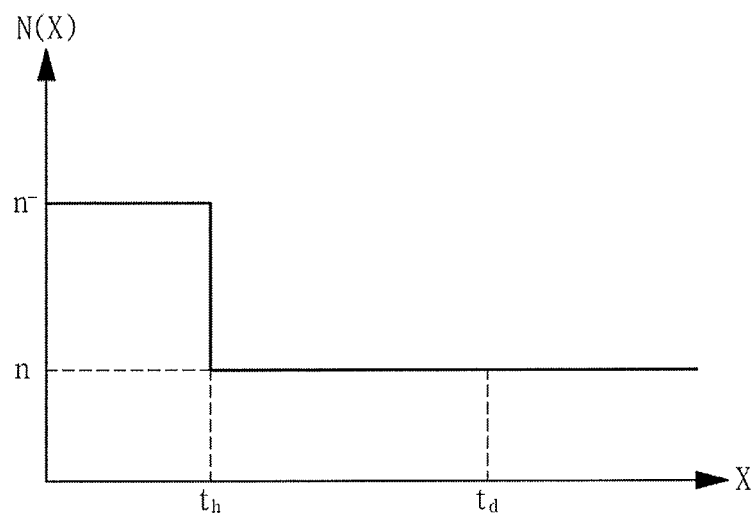
FIG. 56 illustrates a graph showing an impurity ion concentration based on a vertical distance of a semiconductor layer in a channel area.

FIG. 56 illustrates a graph showing an impurity ion concentration based on a vertical distance of a semiconductor layer from a channel area.

In FIG. 56, an x-axis represents a vertical distance "x" from an interface between a semiconductor layer and a gate insulating layer corresponding to a channel area to a predetermined point of the semiconductor layer, and a y-axis represents a concentration of impurity ions "N(X)" (or "electron density") of the semiconductor layer based on the vertical distance. Herein, the vertical distance may be represented by a normal vector extending toward an upper surface of the semiconductor layer from the aforementioned interface.

With reference to FIG. 56, it is verified that as a distance from the interface increases by a predetermined distance $t_h$, an impurity ion concentration of the semiconductor layer distanced from the interface by the predetermined distance $t_h$, sharply decreases.

In FIG. 56, "$t_d$" represents a width of a depletion region, "n" represents an impurity ion concentration of an intrinsic semiconductor, and "n−" represents an impurity ion concentration higher than the impurity ion concentration of the intrinsic semiconductor layer.

The first semiconductor layer 321 and the second semiconductor layer 322 illustrated in FIG. 3 have a transient impurity ion concentration as illustrated in FIG. 56.

An interfacial voltage $\Psi_s$ (i.e., an interfacial voltage between a semiconductor layer and a gate insulating layer) of a switching element including a semiconductor layer having such a transient impurity ion concentration may be defined as the following Mathematical Formula 8.

$$\psi_s = \frac{q}{\varepsilon_{AL}} \int_0^{t_d} \int_x^{t_d} N(x') dx' dx \cong \quad \text{[Mathematical Formula 8]}$$

-continued $$\frac{qn^-}{2\varepsilon_{AL}}t_h^2 + \frac{qn}{2\varepsilon_{AL}}(t_d^2 - t_h^2)$$

In Mathematical Formula 8, "$\varepsilon_{AL}$" represents a dielectric constant of the semiconductor layer, "q" represents an amount of electronic charges, and "n" and "n–" represents an impurity ion concentration (doping concentration) of the semiconductor layer, and "x" represents a vertical distance.

When the interfacial voltage is defined as described above, the threshold voltage $V_t$ of a switching element may be defined as the following Mathematical Formula 9.

[Mathematical Formula 9]

$$V_t \cong V_{FB} + \psi_s - \frac{1}{C_{ox}}\sqrt{2q\varepsilon_{AL}n\left(\psi_s + \frac{q(n^- - n)t_d^2}{2\varepsilon_{AL}}\right)} - \frac{q(n^- - n)t_d}{C_{ox}}$$

In Mathematical Formula 9, "$V_{FB}$" represents a flat band voltage, and "$C_{ox}$" represents a capacitance of a gate insulating layer.

In Mathematical Formulae 8 and 9, "$t_d$" may be defined as the following Mathematical Formula 10.

[Mathematical Formula 10]

$$t_d \cong \sqrt{\frac{2\varepsilon_{AL}}{qn}\left(\psi_s + \frac{q(n^- - n)t_h^2}{2\varepsilon_{AL}}\right)}$$

In such an exemplary embodiment, a threshold voltage of a nominal switching element may be defined as the following Mathematical Formula 11. As used herein, the nominal switching element refers to an ideal switching element that includes a semiconductor layer having a constant impurity ion concentration regardless of the vertical distance, rather than the transient impurity ion concentration described hereinabove with reference to FIG. 56. For example, the semiconductor layer of the nominal switching element may have a constant impurity ion concentration of "n–," regardless of its vertical distance.

[Mathematical Formula 11]

$$V_t \cong V_{FB} + \psi_s + \frac{\sqrt{4q\varepsilon_{AL}n\psi_s}}{C_{ox}}$$

Figure 57:
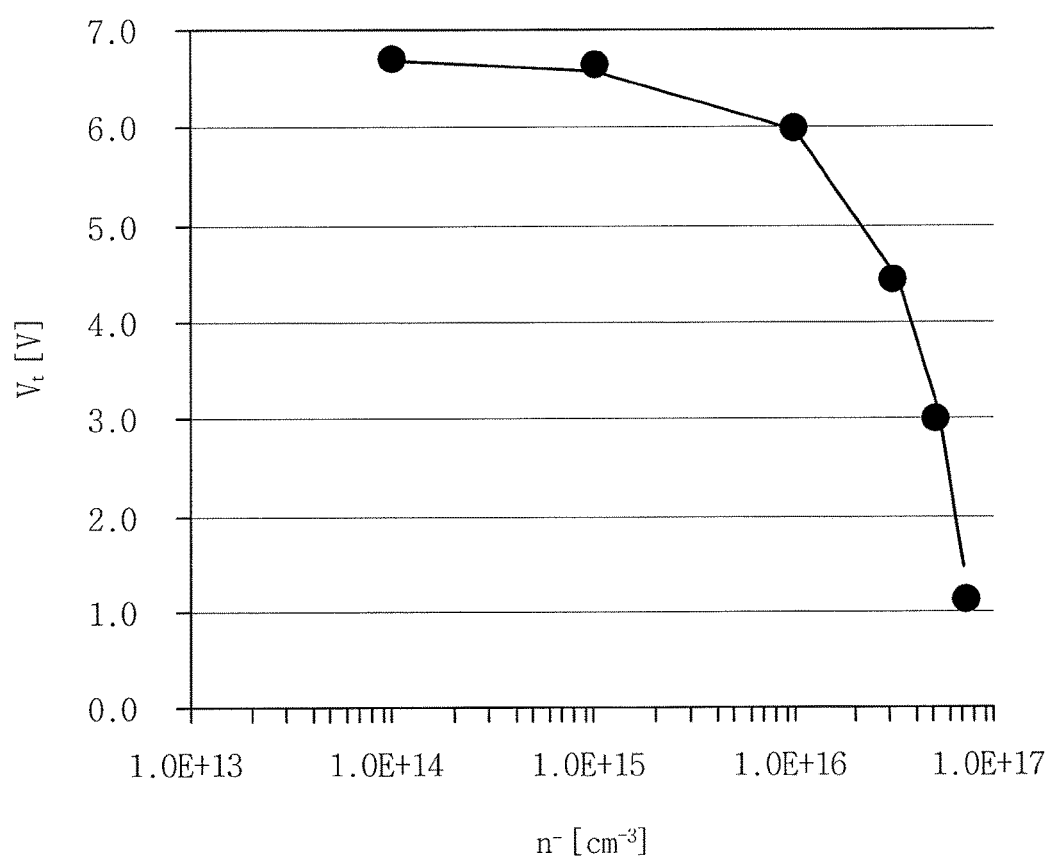
FIG. 57 illustrates a graph showing a threshold voltage of a nominal switching element based on an impurity ion concentration of a semiconductor layer.

FIG. 57 illustrates a graph showing a threshold voltage of a nominal switching element based on an impurity ion concentration of a semiconductor layer, and a characteristic curve illustrated in FIG. 57 is based on Mathematical Formula 11.

In FIG. 57, an x-axis represents an impurity ion concentration of a semiconductor layer, and a y-axis represents a threshold voltage $V_t$ of a nominal switching element.

Figure 58:
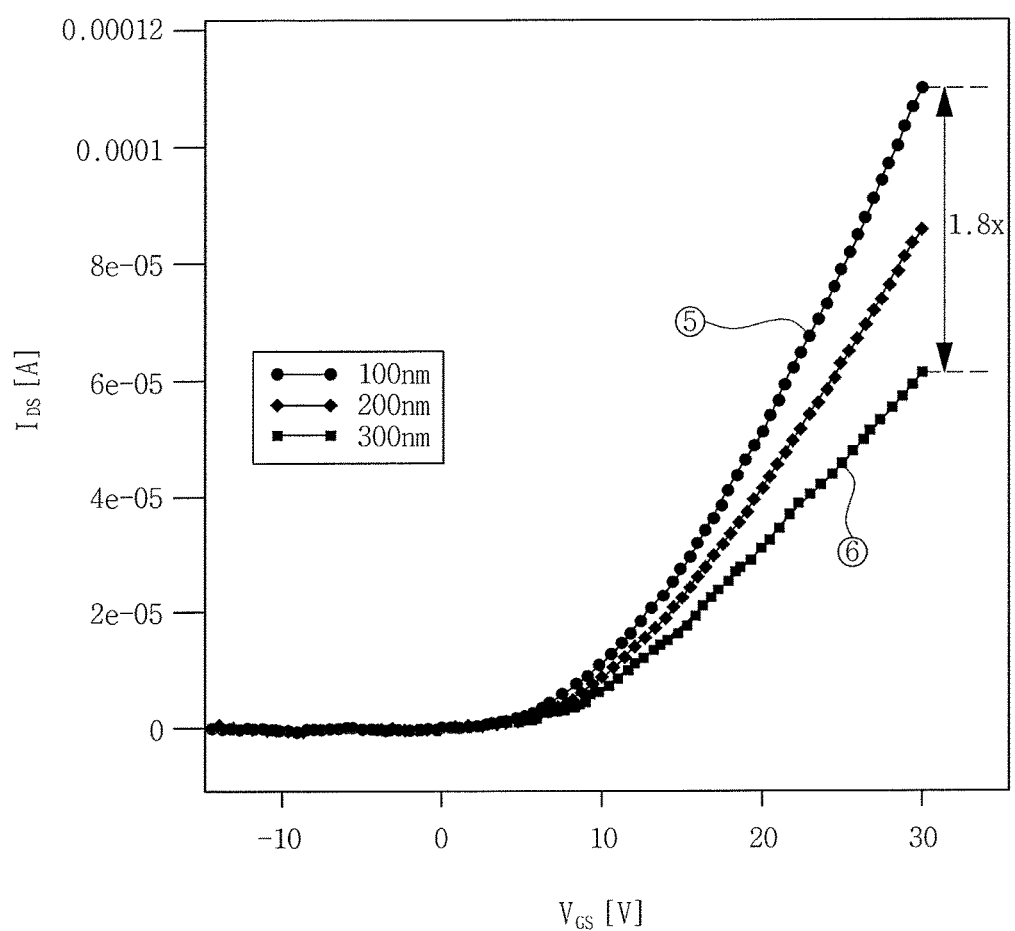
FIG. 58 illustrates a graph showing characteristics of a gate-source voltage and a drain-source current of a switching element based on a thickness of a semiconductor layer.

FIG. 58 illustrates a graph showing characteristics of a gate-source voltage and a drain-source current of a switching element based on a thickness of a semiconductor layer.

In FIG. 58, an x-axis represents a gate-source voltage $V_{GS}$ of a switching element, a y-axis represents a drain-source current $I_{DS}$ of the switching element, and values in a box represent thickness of semiconductor layers.

Figure 59A:
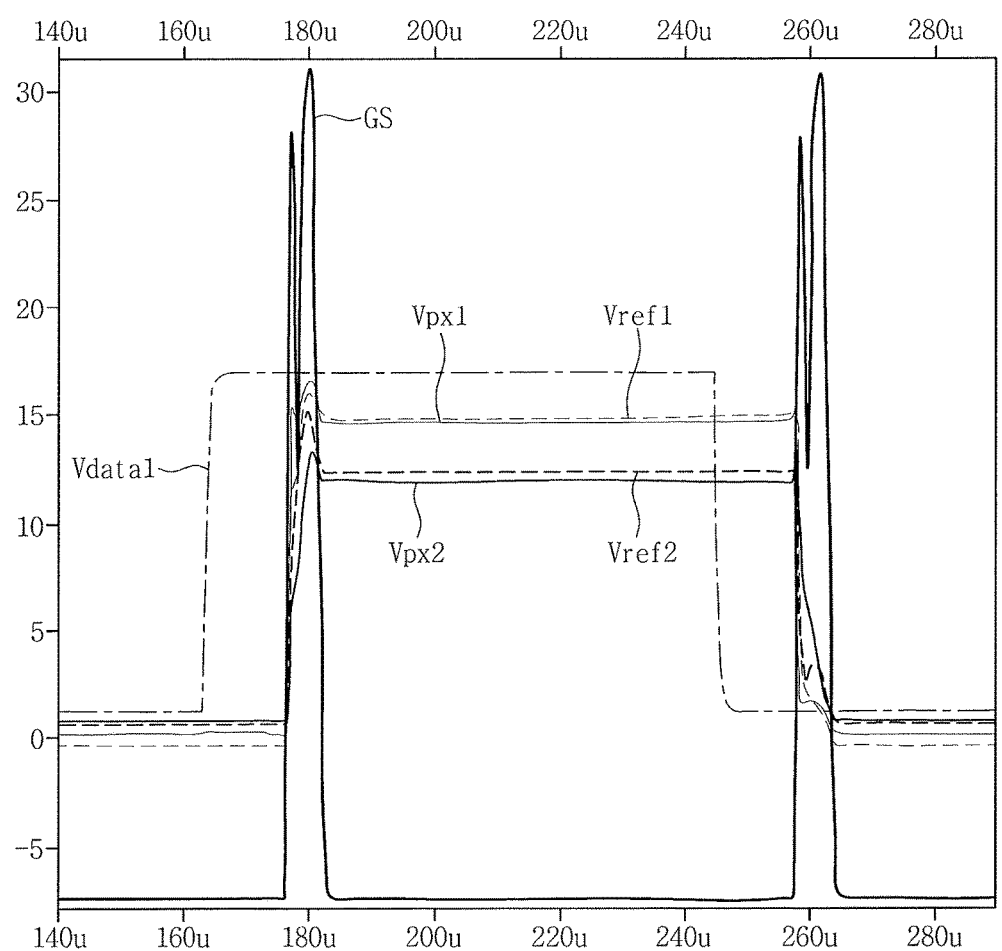
FIGS. 59A and 59B illustrate graphs showing an effect of an exemplary embodiment of an LCD device.
Figure 59B:
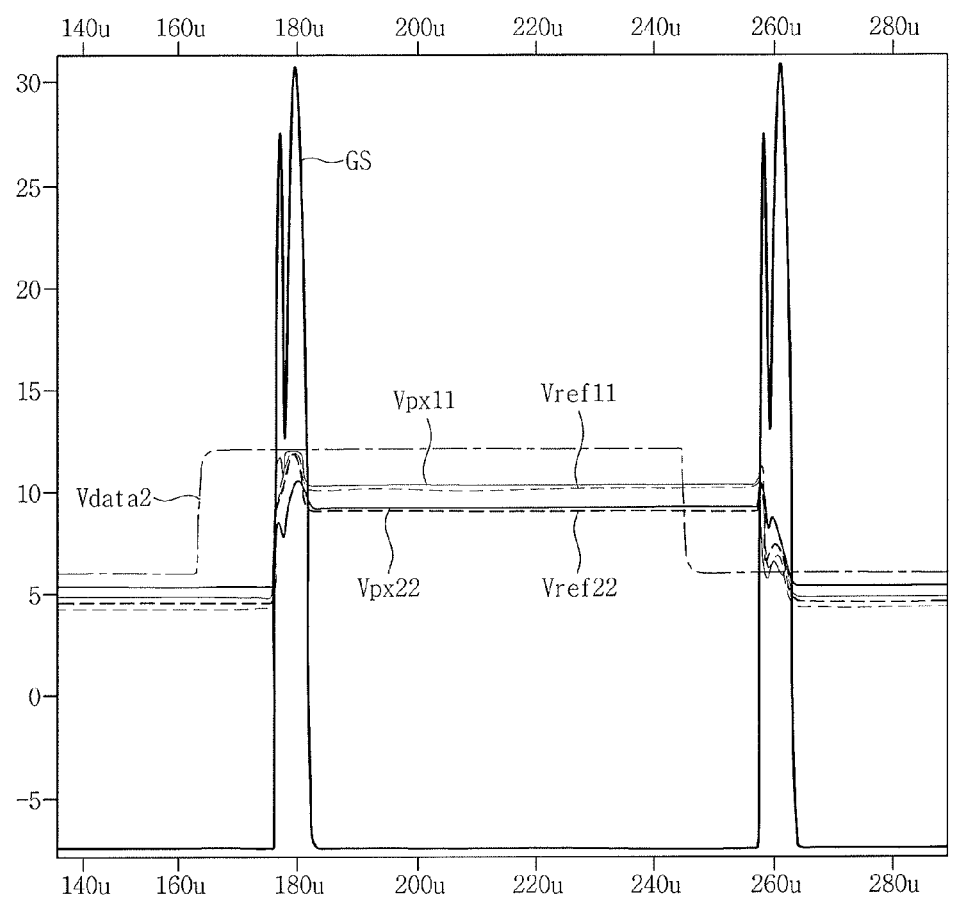

FIGS. 59A and 59B illustrate graphs showing an effect of an exemplary embodiment of an LCD device.

As illustrated in FIG. 59A, when the gate signal GS maintains the gate high voltage, the first switching element TFT1 and the second switching element TFT2 are turned on, and in such an exemplary embodiment, a first sub-pixel voltage Vpx1 and a second sub-pixel voltage Vpx2 are generated based on a first data voltage Vdata1 (a data voltage having 64 gray levels) applied to the pixel from the data line DL.

A first reference voltage Vref1 represents a voltage to be applied to the first sub-pixel electrode PE1 based on the aforementioned first data voltage Vdata1, and a second reference voltage Vref2 represents a voltage to be applied to the second sub-pixel electrode PE2 based on the aforementioned first data voltage Vdata1.

As illustrated in FIG. 59A, the first sub-pixel voltage Vpx1 has a voltage level substantially the same as that of the first reference voltage Vref1, and the second sub-pixel voltage Vpx2 has a voltage level substantially the same as that of the second reference voltage Vref2. Accordingly, the first switching element TFT1 and the second switching element TFT2 of an exemplary embodiment of an LCD device may properly divide a data voltage having a high gray level to apply the divided data voltage to the first sub-pixel electrode PE1 and the second sub-pixel electrode PE2.

As illustrated in FIG. 59B, when the gate signal GS maintains the gate high voltage, the first switching element TFT1 and the second switching element TFT2 are turned on, and in such an exemplary embodiment, a first sub-pixel voltage Vpx11 and a second sub-pixel voltage Vpx22 are generated based on a second data voltage Vdata2 (a data voltage having 8 gray levels) applied to the pixel from the data line DL.

A first reference voltage Vref1 1 represents a voltage to be applied to the first sub-pixel electrode PE1 based on the second data voltage Vdata2, and a second reference voltage Vref22 represents a voltage to be applied to the second sub-pixel electrode PE2 based on the second data voltage Vdata2.

As illustrated in FIG. 59B, the first sub-pixel voltage Vpx11 has a voltage level substantially the same as that of the first reference voltage Vref11, and the second sub-pixel voltage Vpx22 has a voltage level substantially the same as that of the second reference voltage Vref22. As such, the first switching element TFT1 and the second switching element TFT2 of an exemplary embodiment of an LCD device may properly divide a data voltage having a low gray level to provide the divided voltage to the first sub-pixel electrode PE1 and the second sub-pixel electrode PE2.

Figure 60A:
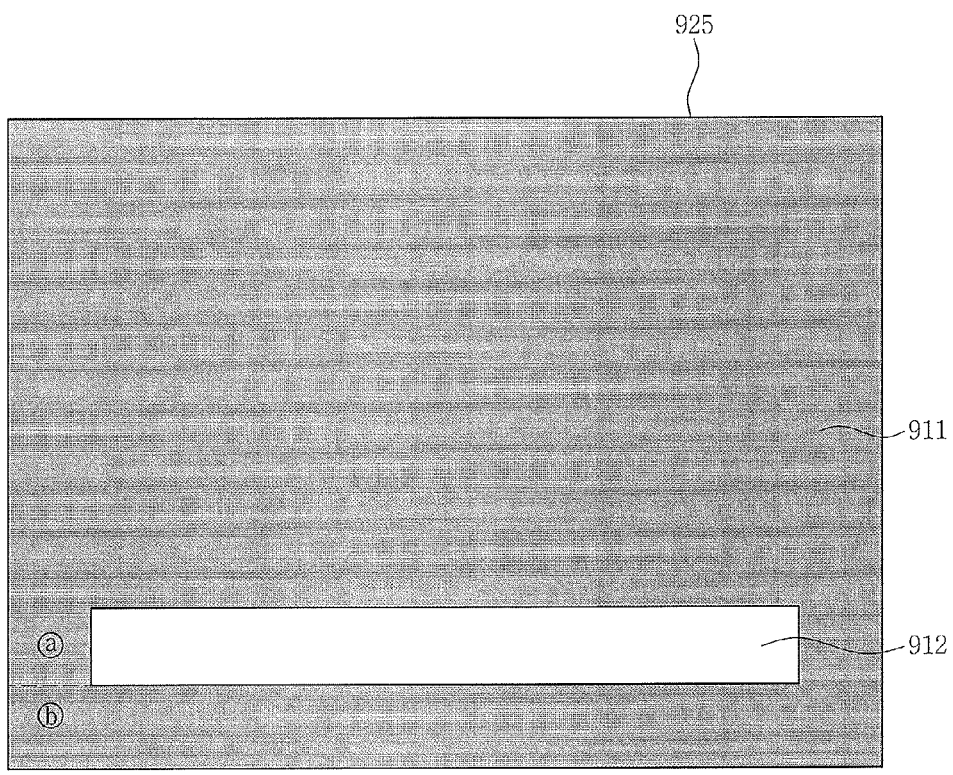
FIGS. 60A and 60B illustrate another effect of an exemplary embodiment of an LCD device.
Figure 60B:
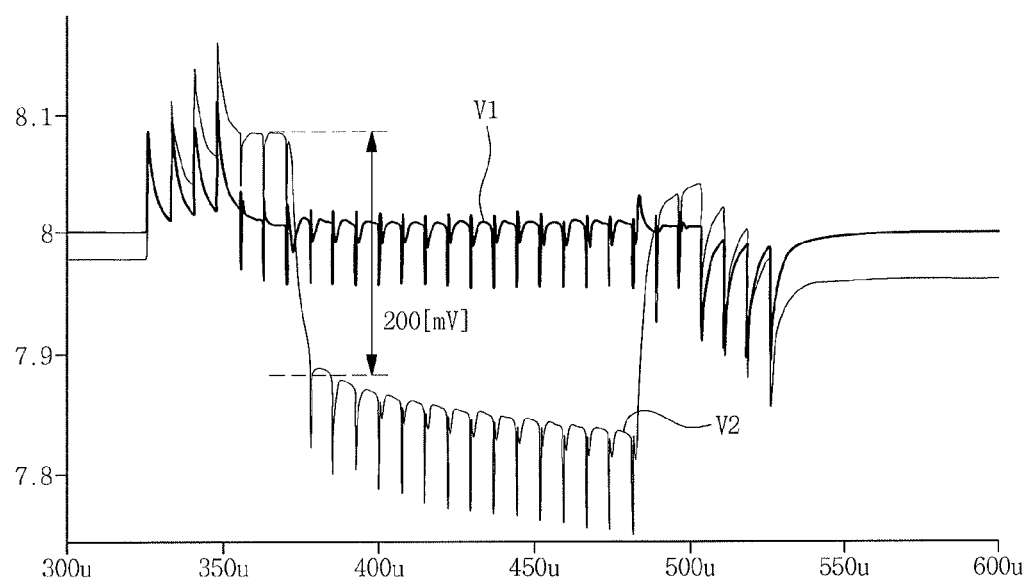

FIGS. 60A and 60B illustrate another effect of an exemplary embodiment of an LCD device.

As illustrated in FIG. 60A, an image 911 having an intermediate gray level and an image 912 having a highest gray level may be displayed together on a display screen 925 of an exemplary embodiment of an LCD device. The image 911 having an intermediate gray level refers to an image having an intermediate brightness, and the image 912 having a highest gray level refers to an image having a highest brightness, for example, a white gray level.

In FIG. 60B, "V1" represents a storage voltage (i.e., a first storage voltage or a second storage voltage) of an exemplary embodiment of an LCD device, and "V2" represents a storage voltage of a conventional LCD device.

A storage electrode of the conventional LCD device is directly connected to the data line DL. Accordingly, a storage voltage varies significantly based on a polarity of a data voltage applied to the pixel. For example, as illustrated in FIG. 60B, a voltage drop (IR drop) of about 200 [mV] may occur in the storage voltage. Accordingly, in a case where the image 911 having an intermediate gray level and the image 912 having a highest gray level are displayed together as illustrated in FIG. 60A, pixels in an area ⓐ positioned directly next to an area on which the image 912 having a highest gray level is displayed display an image having a gray level close to a white gray level, rather than an intermediate gray level. That is, pixels in the area ⓐ display an incorrect image. Accordingly, a brightness of an image displayed in the area ⓐ and a brightness of an image displayed in an area ⓑ may differ from each other, such that horizontal crosstalk may occur.

On the other hand, in an exemplary embodiment, even though the first switching element TFT1 and the second switching element TFT2 are turned on, the data line DL and the storage electrode (i.e., the first storage electrode and the second storage electrode) are not directly connected to each other. That is, a first storage capacitor Cst1 is disposed between the data line DL and the first storage electrode 751, and a second storage capacitor Cst2 is disposed between the data line DL and the second storage electrode 752. Accordingly, even though a polarity of the data voltage applied to the pixel varies, variation of the storage voltage (i.e., the first storage voltage and the second storage voltage) may be significantly reduced. Accordingly, an exemplary embodiment of an LCD device may suppress the occurrence of horizontal crosstalk.

Figure 61:
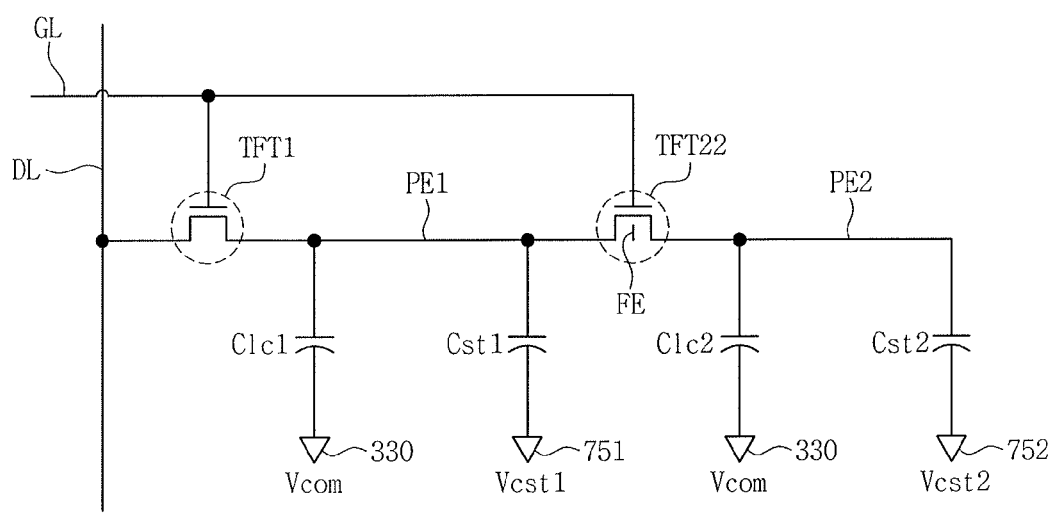
FIG. 61 illustrates an equivalent circuit diagram of a pixel provided in another exemplary embodiment of an LCD device.

FIG. 61 illustrates an equivalent circuit diagram of a pixel provided in another exemplary embodiment of an LCD device.

The pixel, as illustrated in FIG. 61, includes a first switching element TFT1, a second switching element TFT22, a first sub-pixel electrode PE1, a second sub-pixel electrode PE2, a first liquid crystal capacitor Clc1, a second liquid crystal capacitor Clc2, a first storage capacitor Cst1, and a second storage capacitor Cst2.

The first switching element TFT1, the first sub-pixel electrode PEE the second sub-pixel electrode PE2, the first liquid crystal capacitor Cst1, the second liquid crystal capacitor Cst2, the first storage capacitor Cst1, and the second storage capacitor Cst2 illustrated in FIG. 61 are the same as the corresponding elements of FIG. 1, and thus descriptions pertaining to elements of FIG. 61 will make reference to FIG. 1 and the related descriptions.

The second switching element TFT22 of FIG. 61 is connected to a gate line GL, the first sub-pixel electrode PE1, and the second sub-pixel electrode PE2. The second switching element TFT22 is controlled by a gate signal applied from the gate line GL, and is connected between the first sub-pixel electrode PE1 and the second sub-pixel electrode PE2. The second switching element TFT22 is turned on by a gate high voltage of the gate signal, and applies, when turned on, a data voltage applied from the first sub-pixel electrode PE1 to the second sub-pixel electrode PE2. The second switching element TFT22 is turned off by a gate low voltage of the gate signal.

The second switching element TFT22 of FIG. 61 is a switching element including at least one floating electrode. Accordingly, the second switching element TFT22 may have a lower current driving capability than that of the first switching element TFT1. When other conditions are the same, the current driving capability of the second switching element TFT22 including the floating electrode FE is less than that of the first switching element TFT1.

The pixel circuit of FIG. 61 may be achieved by a pixel configuration to be described hereinbelow. Hereinafter, a pixel configuration corresponding to a pixel circuit illustrated in FIG. 62 will be described.

Figure 62:
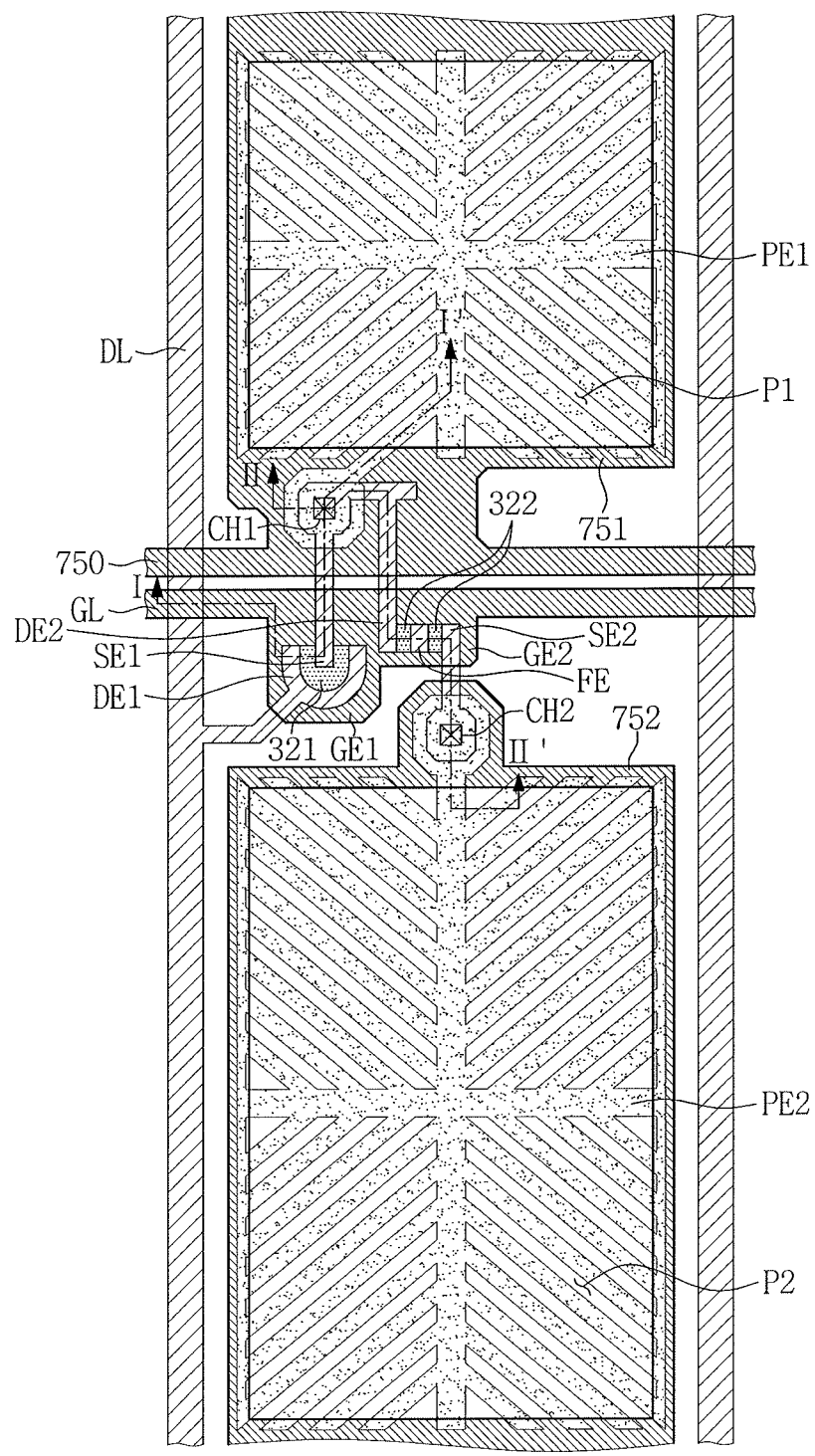
FIG. 62 illustrates a plan view of an exemplary embodiment of an LCD device including a pixel configuration corresponding to the pixel circuit of FIG. 61.
Figure 63:
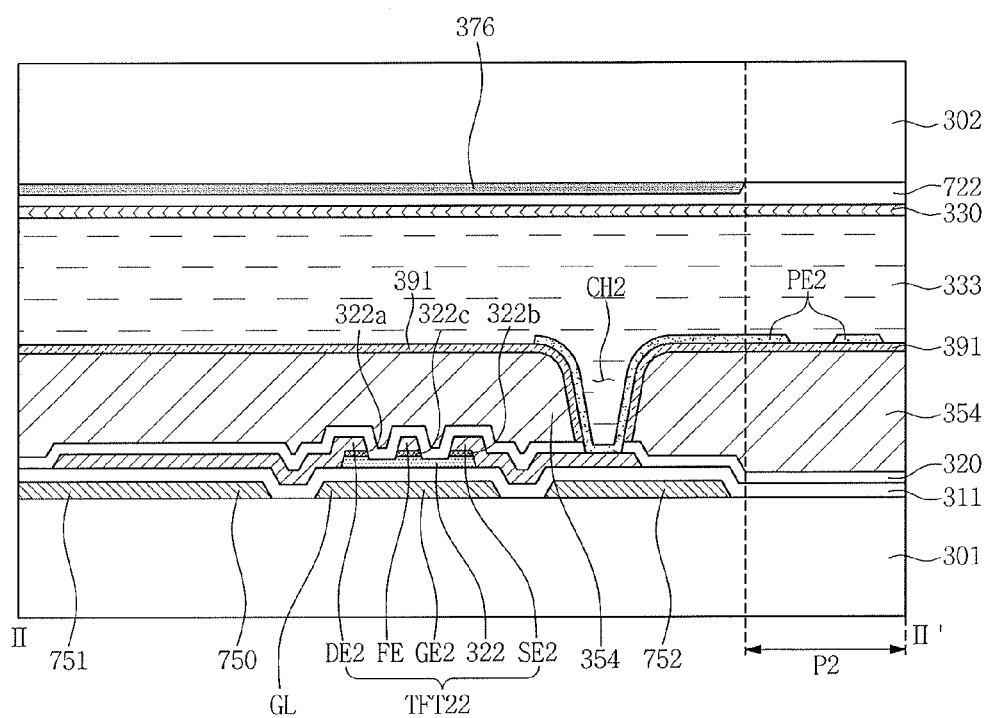
FIG. 63 illustrates a cross-sectional view taken along line II-II' of FIG. 62.

FIG. 62 illustrates a plan view of an exemplary embodiment of an LCD device including a pixel configuration corresponding to the pixel circuit of FIG. 61, and FIG. 63 illustrates a cross-sectional view taken along line II-II' of FIG. 62.

A cross-sectional view taken along line I-I' of FIG. 62 is the same as that of FIG. 3.

As illustrated in FIGS. 62 and 63, the second switching element TFT22 includes a second gate electrode GE2, a second drain electrode DE2, a second source electrode SE2, a floating electrode FE, and a second semiconductor layer 322.

The second gate electrode GE2 of the second switching element TFT22 is connected to the gate line GL, the second drain electrode DE2 of the second switching element TFT22 is connected to the first sub-pixel electrode PE1, and the second source electrode SE2 of the second switching element TFT22 is connected to the second sub-pixel electrode PE2.

As illustrated in FIG. 62, the floating electrode FE of the second switching element TFT22 is disposed between the second drain electrode DE2 of the second switching element TFT22 and the second source electrode SE2 of the second switching element TFT22. For example, the floating electrode FE is disposed over the second semiconductor layer 322 between the second drain electrode DE2 and the second source electrode SE2.

As illustrated in FIG. 63, the floating electrode FE is disposed over a fifth ohmic contact layer 322c. The floating electrode FE may include the same material and have the same structure (a multilayer structure) as those of the aforementioned data line DL. The floating electrode FE and the data line DL may be simultaneously manufactured in the same process. In such an exemplary embodiment, the fifth ohmic contact layer 322c may include the same material and have the same structure as those of the aforementioned third ohmic contact layer 322a. As such, the second switching element TFT2 includes the floating electrode FE, and thus a length L of a channel of a second switching element TFT2 is longer than a length L of a channel of a first switching element TFT1. Accordingly, in a case where widths W of the channels of the first switching element TFT1 and the second switching element TFT2 are the same as each other, the first switching element TFT1 may have a higher W/L ratio than that of the second switching element TFT2. Accordingly, the first switching element TFT1 may have a higher current driving capability than that of the second switching element TFT2.

In FIG. 62, a plurality of floating electrodes, separated from each other, may be disposed between the second drain electrode DE2 and the second source electrode SE2. In such an exemplary embodiment, the plurality of floating electrodes may be aligned in a line between the second drain electrode DE2 and the second source electrode SE2. In an exemplary embodiment, in a case where two floating electrodes are aligned in a line between the second drain electrode DE2 and the second source electrode SE2, one of the two floating electrodes (hereinafter, "first floating electrode") is disposed relatively adjacent to the second drain electrode DE2, and the other of the two floating electrodes (hereinafter, "second floating electrode") is disposed relatively adjacent to the second source electrode SE2. In other words, in a case where the floating electrode FE illustrated in FIG. 62 is the first floating electrode, the second floating electrode is disposed between the first floating electrode FE and the second source electrode SE2.

The plurality of floating electrodes may have different areas from one another. In such an exemplary embodiment, the plurality of floating electrodes may have a larger area, as disposed more adjacent to one of the second drain electrode DE2 and the second source electrode SE2. For example, the first floating electrode disposed relatively adjacent to the second drain electrode DE2 may have a larger area than that of the second floating electrode.

Figure 64:
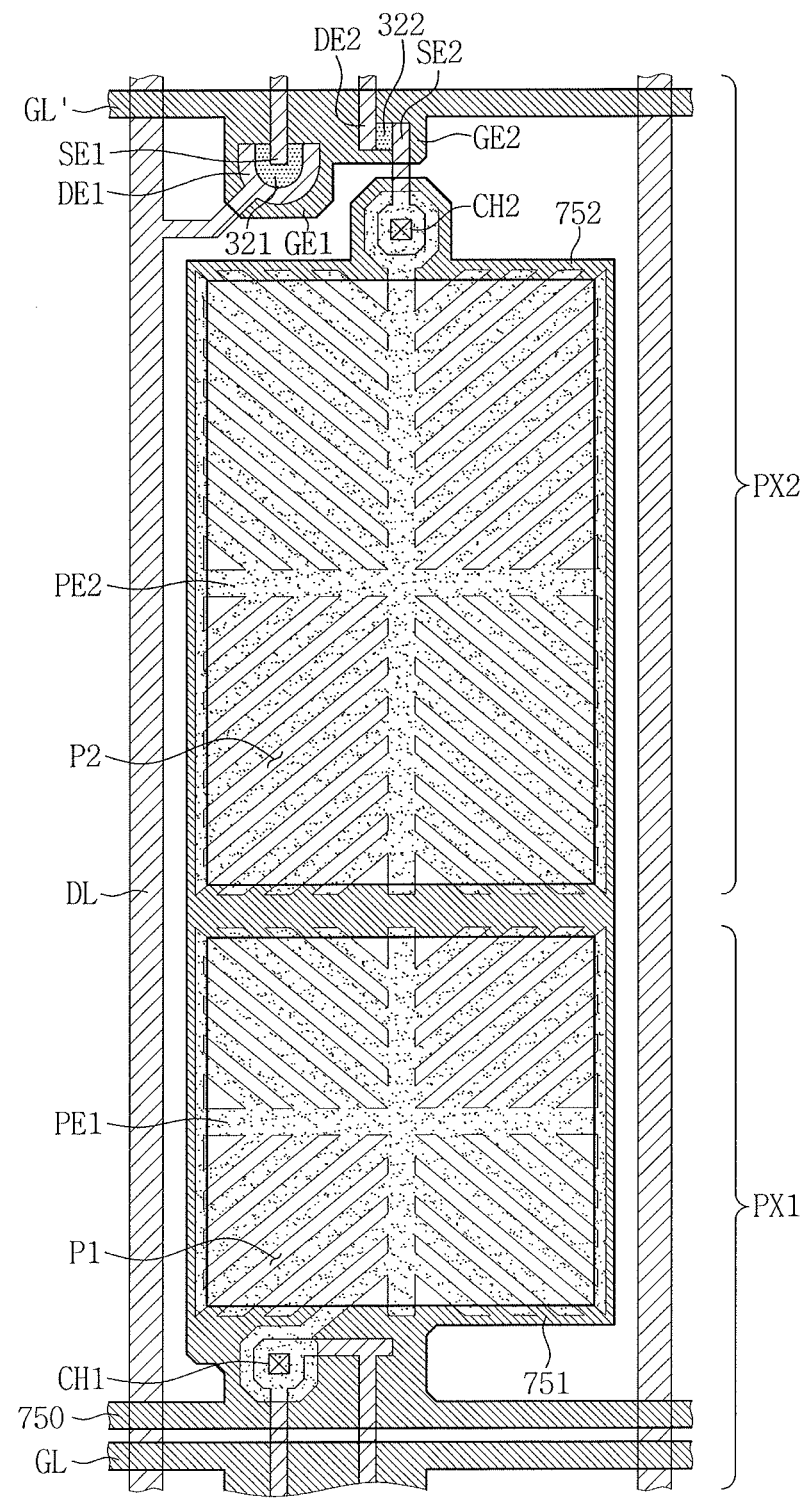
FIG. 64 illustrates a plan view of two adjacent pixels having the structure of FIG. 2.

FIG. 64 illustrates a plan view of two adjacent pixels having the structure of FIG. 2. In FIG. 64, a portion of a first pixel and a portion of a second pixel are illustrated. Each of the first pixel and the second pixel has the same structure as that of the pixel illustrated in FIG. 2.

As illustrated in FIG. 64, a first storage electrode 751 disposed in the first pixel PX1 may be connected to a second storage electrode 752 of the second pixel PX2. In an exemplary embodiment, the first storage electrode 751 of the first pixel PX1 and the second storage electrode 752 of the second pixel PX2 disposed adjacently to each other between adjacent gate lines GL and GL' may be connected to each other. In such an exemplary embodiment, the first storage electrode 751 of the first pixel PX1 and the second storage electrode 752 of the second pixel PX2 may be unitary.

Although not illustrated, in the LCD device including the pixel having the structures illustrated in FIGS. 51, 52, and 62, the first storage electrode 751 of the first pixel and the second storage electrode 752 of the second pixel may have the structure illustrated in FIG. 64.

By way of summation and review, in an attempt to improve visibility, each pixel of an LCD may include two individual sub-pixel electrodes. In such a case, it may be necessary to apply data signals having different voltage levels to the two sub-pixel electrodes, respectively. To this end, a data signal may be applied to one of the two sub-pixel electrodes without modulation, and a data signal may be divided to be applied to the other of the two sub-pixel electrodes. In order to divide the voltage, a pixel may include a voltage-dividing transistor.

The voltage-dividing transistor may occupy a portion of a pixel area, such that an aperture ratio of the pixel may decrease. In addition, in a case where the voltage-dividing transistor is turned on, a data line and a storage electrode may be electrically connected to each other, such that a storage voltage of the storage electrode may vary based on a data signal.

The embodiments may provide an LCD device having an improved aperture ratio and which is stabilized in terms of a storage voltage.

In accordance with one or more of the aforementioned embodiments, an LCD device provides the following effects.

First, a data voltage may be divided by the first switching element and the second switching element that are connected in series. Accordingly, the first sub-pixel electrode and the second sub-pixel electrode may have different pixel voltages, such that visibility of a pixel may be improved.

Second, one pixel may generate two different sub-pixel voltages using two switching elements. Accordingly, an aperture ratio of the pixel may increase.

Third, the data line and the storage electrode may not be directly connected. In such a case, variation of a first storage voltage and a second storage voltage may be significantly reduced. Accordingly, occurrence of undesirable horizontal crosstalk may be significantly reduced.

Fourth, a level of a leakage current may vary based on the second switching element having a relatively high threshold voltage. Accordingly, the leakage current may be significantly reduced when the first switching element and the second switching element are turned off. As a result, an undesirable so-called "discoloration phenomenon" may be significantly reduced, such that image quality may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A liquid crystal display device, comprising:
   a first substrate and a second substrate spaced apart from each other;
   a liquid crystal layer between the first substrate and the second substrate;
   a gate line, a data line, a first sub-pixel electrode, and a second sub-pixel electrode on the first substrate;
   a first switching element connected to the gate line, the data line, and the first sub-pixel electrode; and
   a second switching element connected to the gate line, the first sub-pixel electrode, and the second sub-pixel electrode,
   wherein the first switching element has a threshold voltage that is lower than a threshold voltage of the second switching element, and
   wherein the first switching element includes a semiconductor layer having a thickness that is 1/y times a thickness of a semiconductor layer of the second switching element, y being a rational number greater than or equal to 3.

2. The liquid crystal display device as claimed in claim 1, wherein the first switching element has a threshold voltage that is 1/x times a threshold voltage of the second switching element, x being a rational number greater than or equal to 2.

3. The liquid crystal display device as claimed in claim 1, wherein:
   the thickness of the semiconductor layer of the first switching element corresponds to a thickness of a channel area of the semiconductor layer of the first switching element, and
   the thickness of the semiconductor layer of the second switching element corresponds to a thickness of a channel area of the semiconductor layer of the second switching element.

4. The liquid crystal display device as claimed in claim 3, further comprising an etching-inhibiting layer on the semiconductor layer of the second switching element, the etching-inhibiting layer overlying the channel area of the second switching element.

5. The liquid crystal display device as claimed in claim 1, wherein the first switching element includes:
   a gate electrode connected to the gate line;
   a drain electrode connected to one of the data line and the first sub-pixel electrode; and
   a source electrode connected to another of the data line and the first sub-pixel electrode.

6. The liquid crystal display device as claimed in claim 1, wherein the second switching element includes:
a gate electrode connected to the gate line;
a drain electrode connected to one of the first sub-pixel electrode and the second sub-pixel electrode; and
a source electrode connected to another of the first sub-pixel electrode and the second sub-pixel electrode.

7. The liquid crystal display device as claimed in claim 1, wherein one of a drain electrode and a source electrode of the first switching element is unitary with one of a drain electrode and a source electrode of the second switching element.

8. The liquid crystal display device as claimed in claim 1, wherein
the first switching element includes a drain electrode and a source electrode, and
one of the drain electrode and the source electrode of the first switching element has a U-shape.

9. The liquid crystal display device as claimed in claim 8, wherein a protruding portion of the drain electrode or the source electrode has a U-shape included in the first switching element, the U-shape having a closed end facing the second sub-pixel electrode.

10. The liquid crystal display device as claimed in claim 8, wherein another of the drain electrode and the source electrode of the first switching element has an I-shape.

11. The liquid crystal display device as claimed in claim 1, wherein:
the second switching element includes a drain electrode and a source electrode, and
the drain electrode and the source electrode of the second switching element has an I-shape.

12. The liquid crystal display device as claimed in claim 1, wherein a connecting portion between the first switching element and the first sub-pixel electrode is between the gate line and the first sub-pixel electrode.

13. The liquid crystal display device as claimed in claim 12, wherein a connecting portion between the second switching element and the second sub-pixel electrode is between the gate line and the second sub-pixel electrode.

14. The liquid crystal display device as claimed in claim 1, wherein the semiconductor layer of the first switching element includes impurity ions at a higher concentration than an impurity ion concentration of a semiconductor layer of the second switching element.

15. The liquid crystal display device as claimed in claim 14, wherein the semiconductor layer of the first switching element includes impurity ions at a concentration that is five times or greater the impurity ion concentration of the semiconductor layer of the second switching element.

16. The liquid crystal display device as claimed in claim 14, wherein an amount of impurity ions injected to the second switching element is 0.

17. The liquid crystal display device as claimed in claim 1, wherein the first switching element has a W/L ratio that is greater than a W/L ratio of the second switching element.

18. The liquid crystal display device as claimed in claim 17, wherein the W/L ratio of the first switching element is at least two times the W/L ratio of the second switching element.

19. The liquid crystal display device as claimed in claim 1, wherein an insulating layer overlying a channel area of the first switching element has a thickness that is less than a thickness of an insulating layer overlying a channel area of the second switching element.

20. The liquid crystal display device as claimed in claim 19, wherein the thickness of the insulating layer overlying the channel area of the first switching element is 1/z times the thickness of the insulating layer overlying the channel area of the second switching element, z being a rational number greater than or equal to 2.

21. The liquid crystal display device as claimed in claim 20, wherein the insulating layer includes:
a first insulating layer overlapping the channel area of the first switching element and the channel area of the second switching element; and
a second insulating layer between the channel area of the second switching element and the first insulating layer.

22. The liquid crystal display device as claimed in claim 20, wherein the second insulating layer has a hole defined corresponding to the channel area of the first switching element.

23. The liquid crystal display device as claimed in claim 1, wherein the first switching element includes a sub-gate electrode.

24. The liquid crystal display device as claimed in claim 23, wherein the sub-gate electrode has a work function that is less than a work function of the semiconductor layer of the first switching element.

25. The liquid crystal display device as claimed in claim 23, wherein a bias voltage is externally applied to or is not applied to the sub-gate electrode.

26. The liquid crystal display device as claimed in claim 1, wherein:
the second switching element includes a drain electrode and a source electrode, and
one of the drain electrode and the source electrode of the second switching element has a U-shape.

27. The liquid crystal display device as claimed in claim 26, wherein a protruding portion of the drain electrode or the source electrode has a U-shape included in the second switching element, the U-shape having a closed end facing the second sub-pixel electrode.

28. The liquid crystal display device as claimed in claim 26, wherein another of the drain electrode and the source electrode of the second switching element has an I-shape.

29. The liquid crystal display device as claimed in claim 1, wherein a connecting portion between the first switching element and the first sub-pixel electrode and a connecting portion between the second switching element and the second sub-pixel electrode are between the gate line and the first sub-pixel electrode.

30. The liquid crystal display device as claimed in claim 1, wherein the second switching element includes:
a gate electrode connected to the gate line;
a drain electrode connected to one of the first sub-pixel electrode and the second sub-pixel electrode;
a source electrode connected to another of the first sub-pixel electrode and the second sub-pixel electrode; and
at least one floating electrode between the source electrode and the drain electrode.

* * * * *